United States Patent
Ito et al.

(10) Patent No.: US 11,849,200 B2
(45) Date of Patent: Dec. 19, 2023

(54) LIGHT-RECEIVING DEVICE, IMAGING DEVICE, AND DISTANCE MEASUREMENT DEVICE FOR EXPANDED RANGE OF PHOTON DETECTION EFFICIENCY

(71) Applicant: SONY SEMICONDUCTOR SOLUTIONS CORPORATION, Kanagawa (JP)

(72) Inventors: Kyosuke Ito, Kanagawa (JP); Yusuke Otake, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 108 days.

(21) Appl. No.: 17/594,108

(22) PCT Filed: Mar. 19, 2020

(86) PCT No.: PCT/JP2020/012220
§ 371 (c)(1),
(2) Date: Oct. 1, 2021

(87) PCT Pub. No.: WO2020/209028
PCT Pub. Date: Oct. 15, 2020

(65) Prior Publication Data
US 2022/0182523 A1 Jun. 9, 2022

(30) Foreign Application Priority Data
Apr. 12, 2019 (JP) ................. 2019-076106

(51) Int. Cl.
*H04N 23/52* (2023.01)
*G01S 7/481* (2006.01)
*H04N 23/65* (2023.01)

(52) U.S. Cl.
CPC ........... *H04N 23/52* (2023.01); *G01S 7/4816* (2013.01); *H04N 23/65* (2023.01)

(58) Field of Classification Search
CPC ........ H04N 23/52; H04N 23/65; H04N 25/63; H04N 25/70; H04N 25/75; H04N 25/76;
(Continued)

(56) References Cited

U.S. PATENT DOCUMENTS 6,271,880 B1   8/2001  Kameshima et al.
2009/0134333 A1*  5/2009  Ishibashi .................. H03F 3/08
                                              250/352

(Continued)

FOREIGN PATENT DOCUMENTS

CA    2704033 A    4/2009
CN    110447221 A    11/2019
(Continued)

OTHER PUBLICATIONS

International Search Report and Written Opinion of PCT Application No. PCT/JP2020/012220, dated Jun. 23, 2020, 09 pages of ISRWO.

*Primary Examiner* — Gevell V Selby
(74) *Attorney, Agent, or Firm* — CHIP LAW GROUP

(57) ABSTRACT

A light-receiving device according to an embodiment of the present disclosure includes a pixel array including light-receiving elements provided in respective pixels. The light-receiving elements each include a high electric field region and a photoelectric conversion region. A plurality of the light-receiving elements provided in the respective pixels includes a plurality of types of elements that have temperature regions having high photon detection efficiency (PDE). The temperature regions are different from each other and partially overlap each other.

16 Claims, 36 Drawing Sheets

(58) Field of Classification Search
CPC ..... H04N 25/77; G01S 7/4816; G01S 7/4863; G01S 7/497; G01C 3/06; H01L 27/146; H01L 31/10; H01L 31/107
See application file for complete search history.

(56) References Cited

U.S. PATENT DOCUMENTS

| | | | |
|---|---|---|---|
| 2010/0328508 A1 | 12/2010 | Vignolle et al. | |
| 2018/0266881 A1* | 9/2018 | Fujiwara | H01L 27/1443 |
| 2019/0041194 A1* | 2/2019 | Okuyama | G02B 5/3083 |
| 2019/0051767 A1* | 2/2019 | Yamamoto | H01L 31/02027 |
| 2019/0187256 A1* | 6/2019 | Wang | G01S 7/4863 |
| 2020/0014865 A1 | 1/2020 | Mizuno | |

FOREIGN PATENT DOCUMENTS

| | | |
|---|---|---|
| EP | 0792066 A2 | 8/1997 |
| EP | 2235933 A1 | 10/2010 |
| FR | 2923121 A1 | 5/2009 |
| HK | 1002479 A | 8/1998 |
| JP | 9-266552 A | 10/1997 |
| JP | 2013-016638 A | 1/2013 |
| JP | 2018-157032 A | 10/2018 |
| JP | 2018-166242 A | 10/2018 |
| JP | 2019-021826 A | 2/2019 |
| KR | 10-2019-0133663 A | 12/2019 |
| WO | 2009/053494 A1 | 4/2009 |
| WO | 2017/074530 A1 | 5/2017 |
| WO | 2018/180528 A1 | 10/2018 |

\* cited by examiner

[FIG. 1]
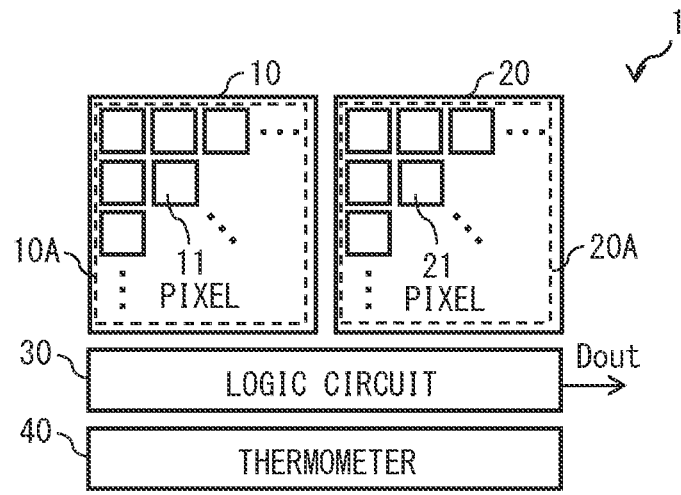
[FIG. 2]
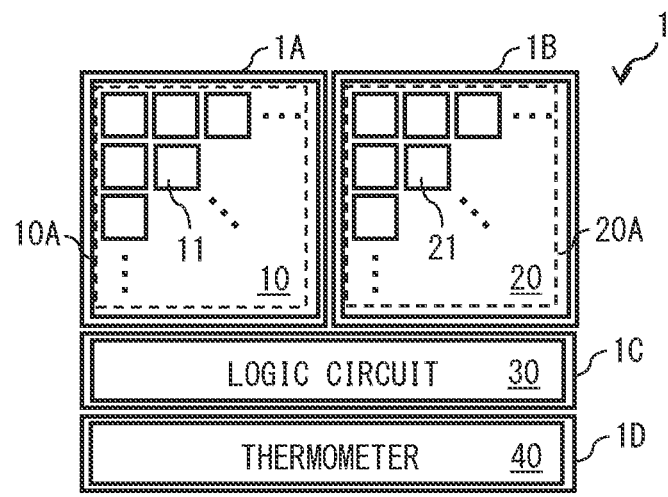

[FIG. 3]
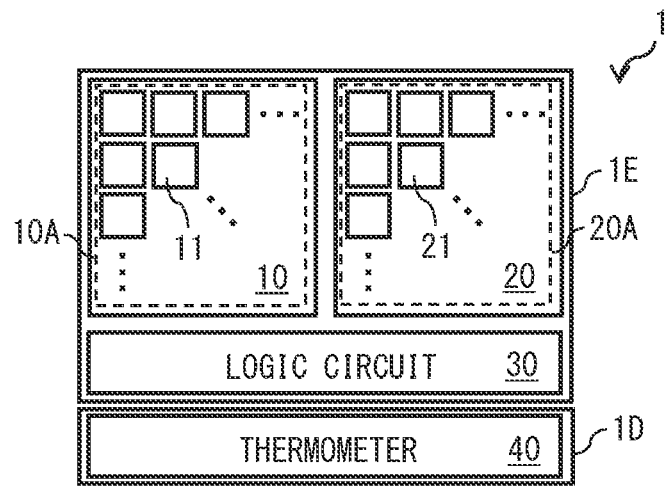
[FIG. 4]
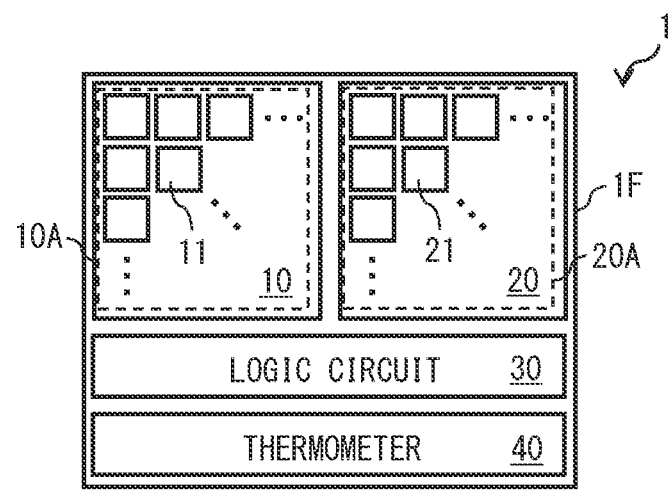

[FIG. 5]
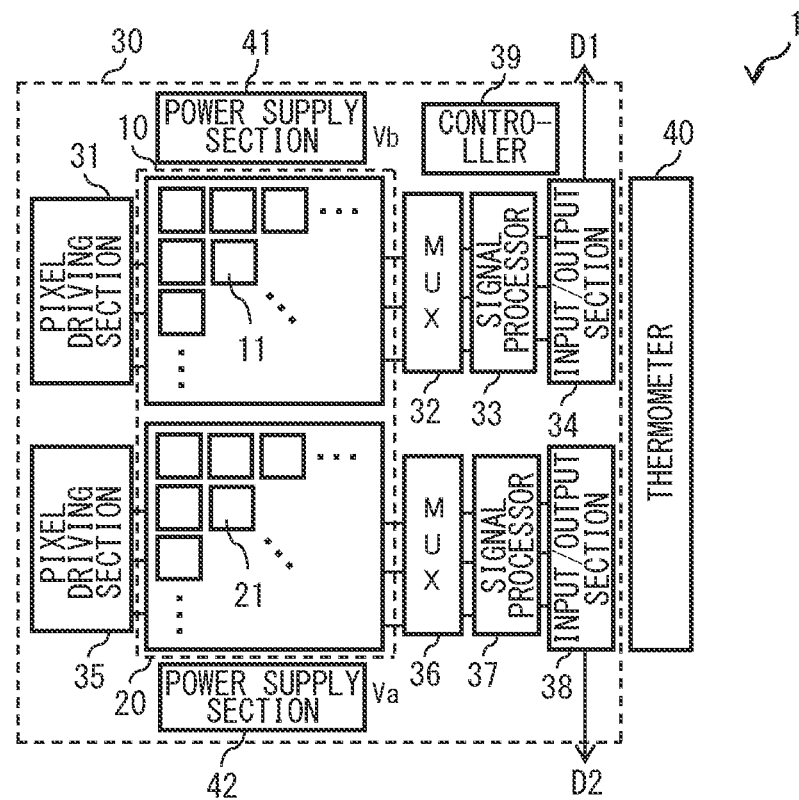
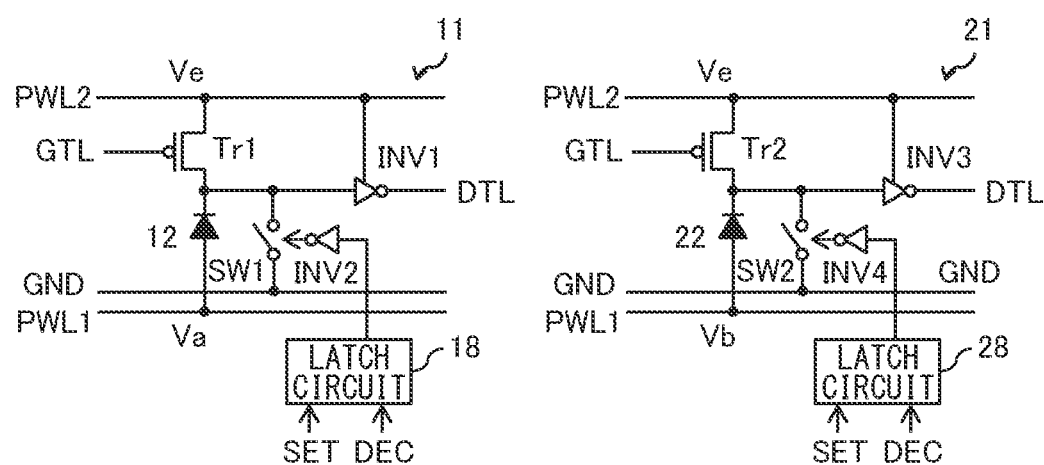
[FIG. 6A]  [FIG. 6B]

[FIG. 7]
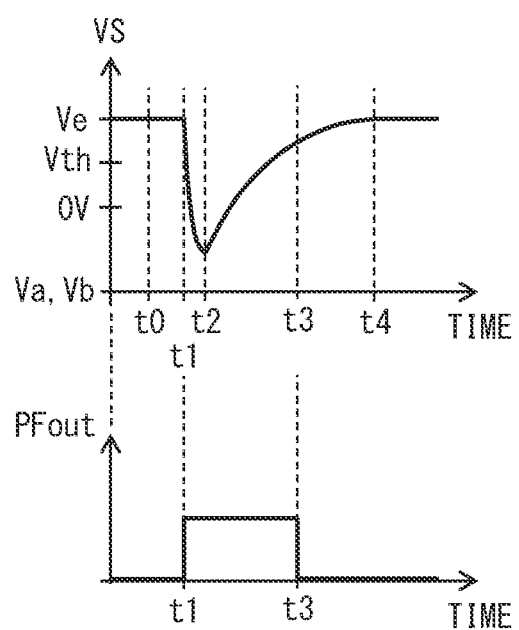

[FIG. 8]
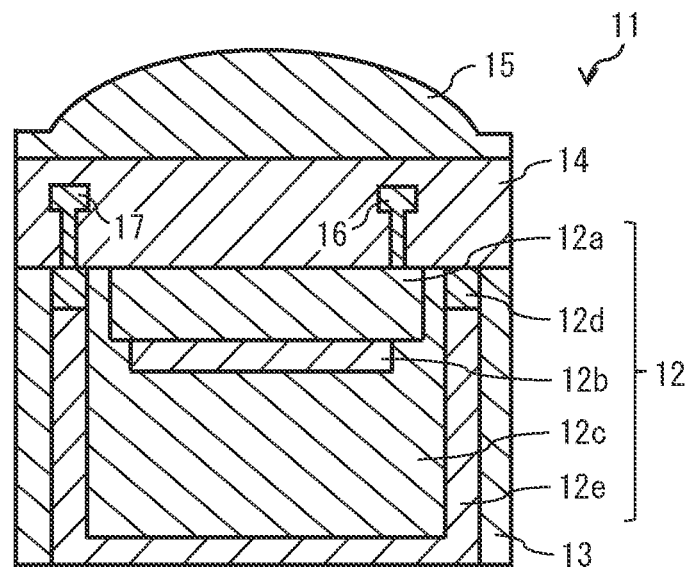
[FIG. 9]
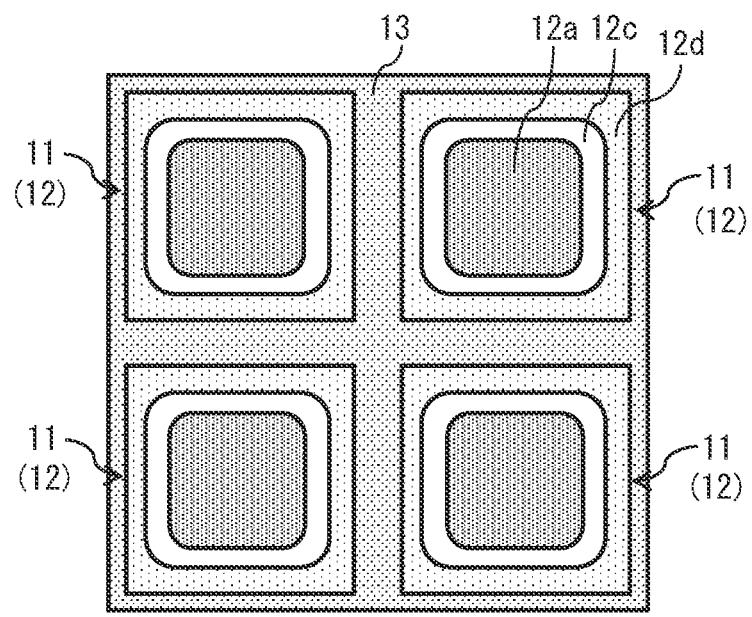

[FIG. 10]
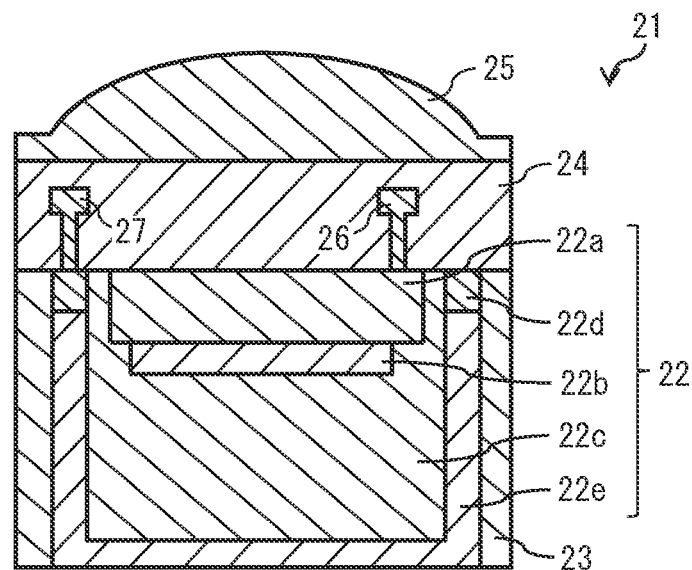
[FIG. 11]
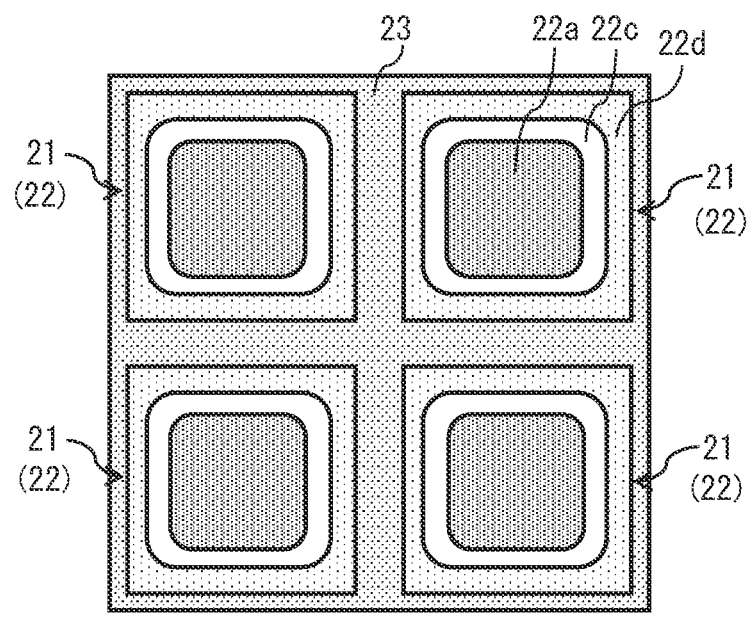

[FIG. 12]
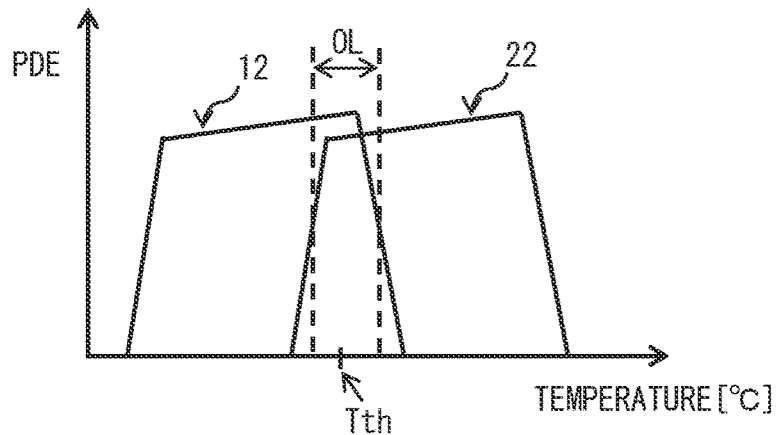
[FIG. 13]
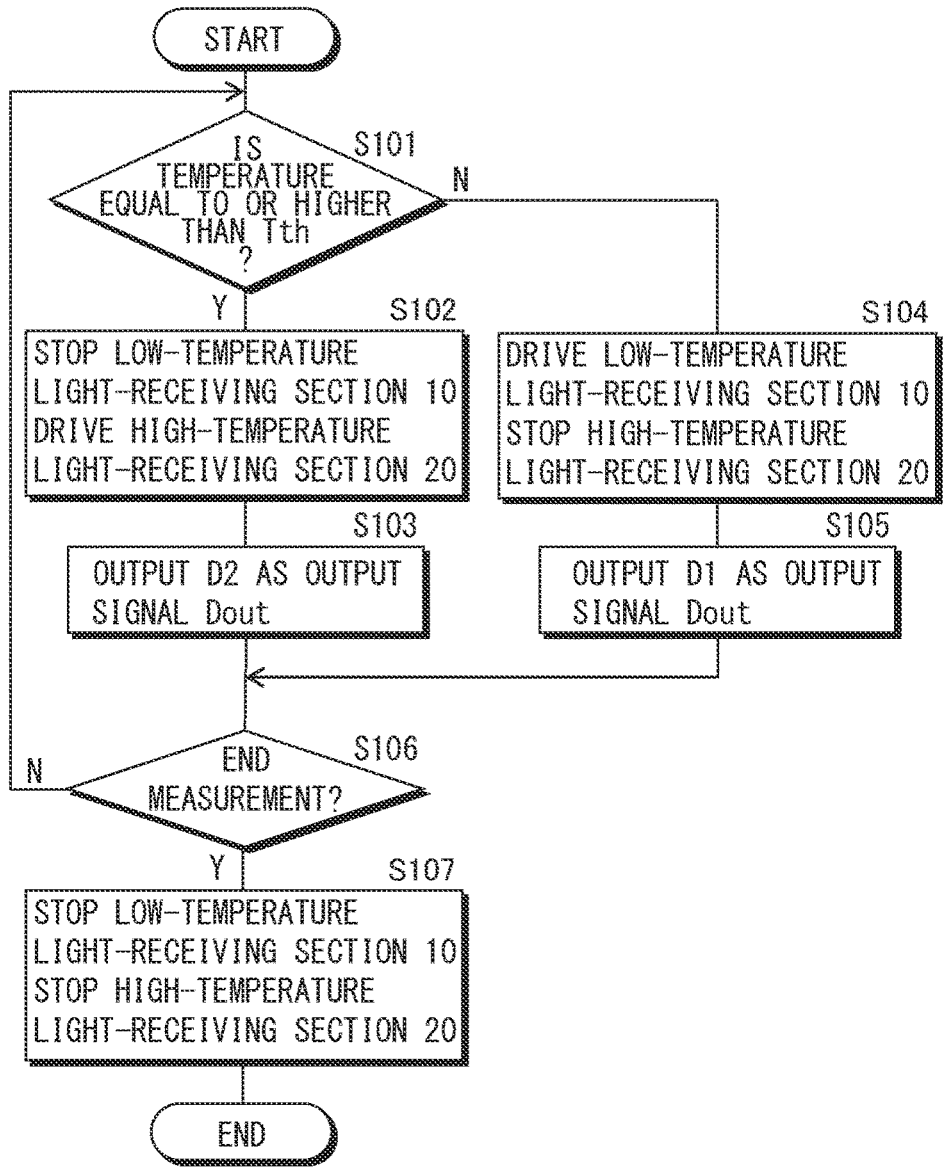

[FIG. 14]
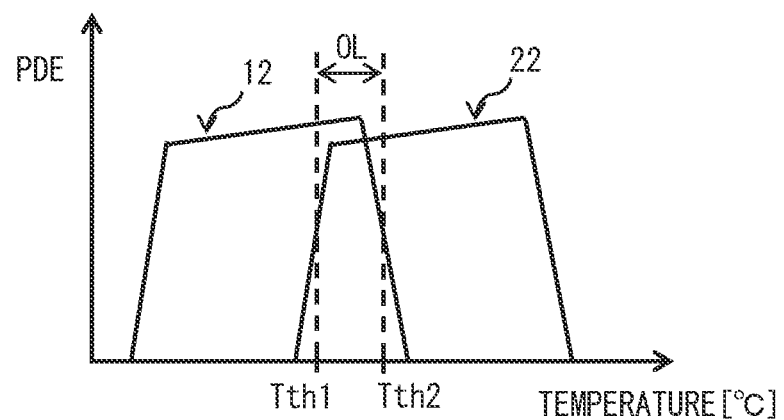

[FIG. 15]
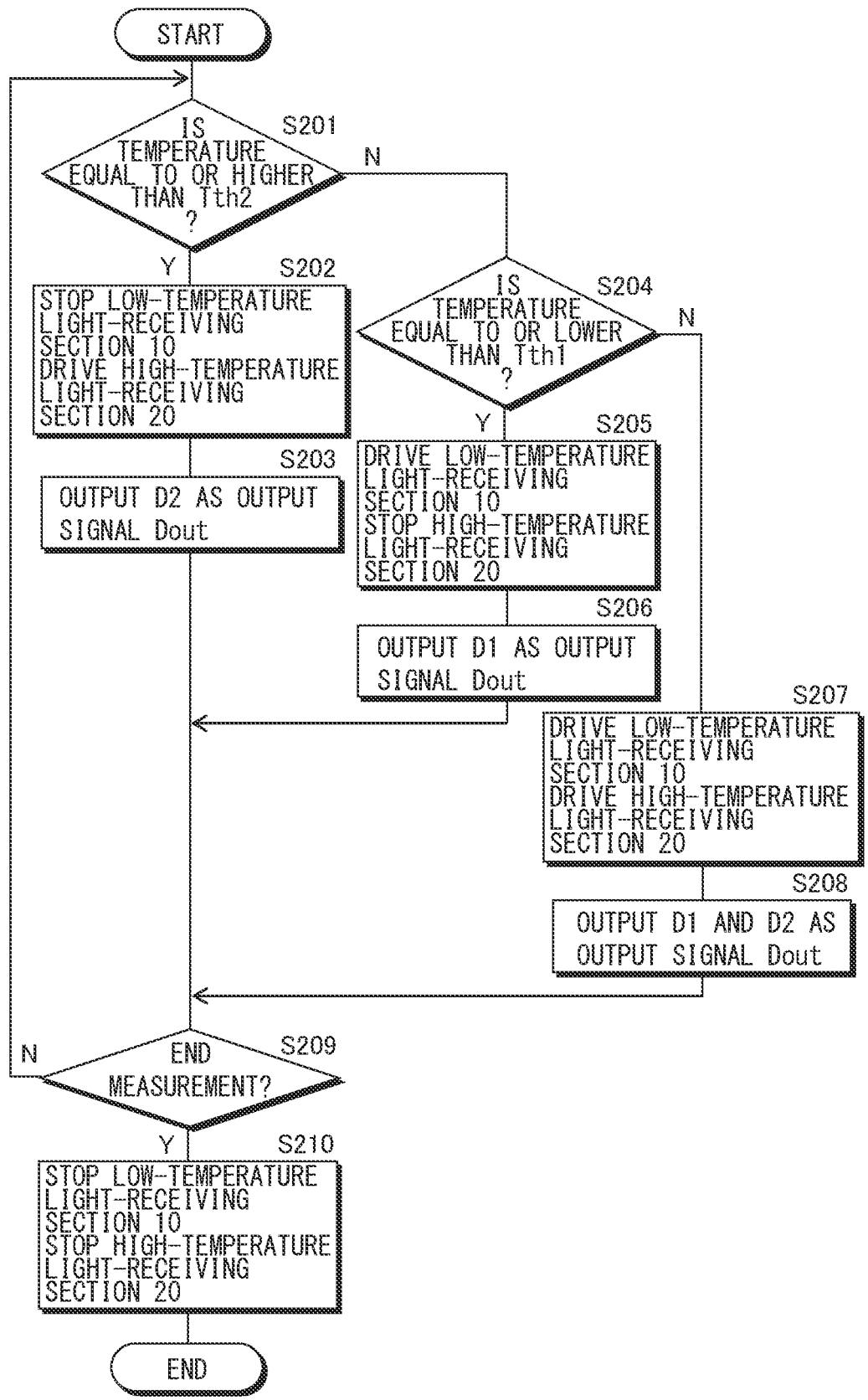

[FIG. 16]
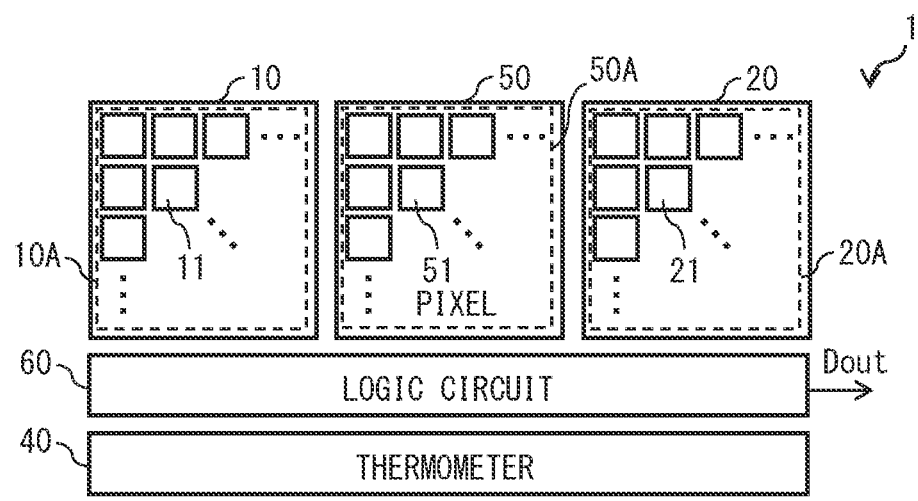
[FIG. 17]
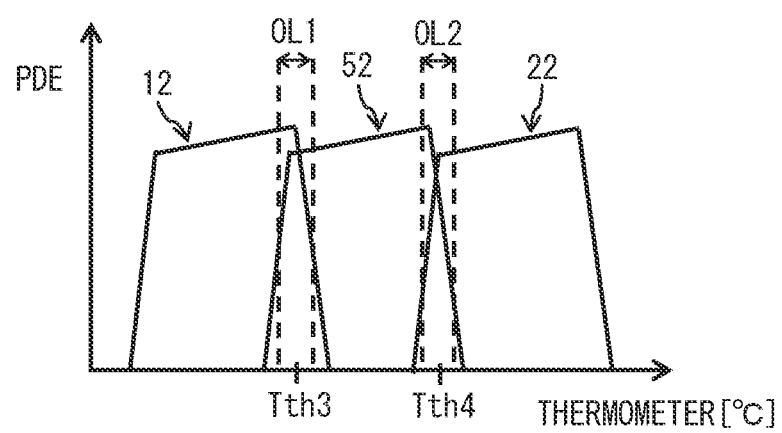

[FIG. 18]
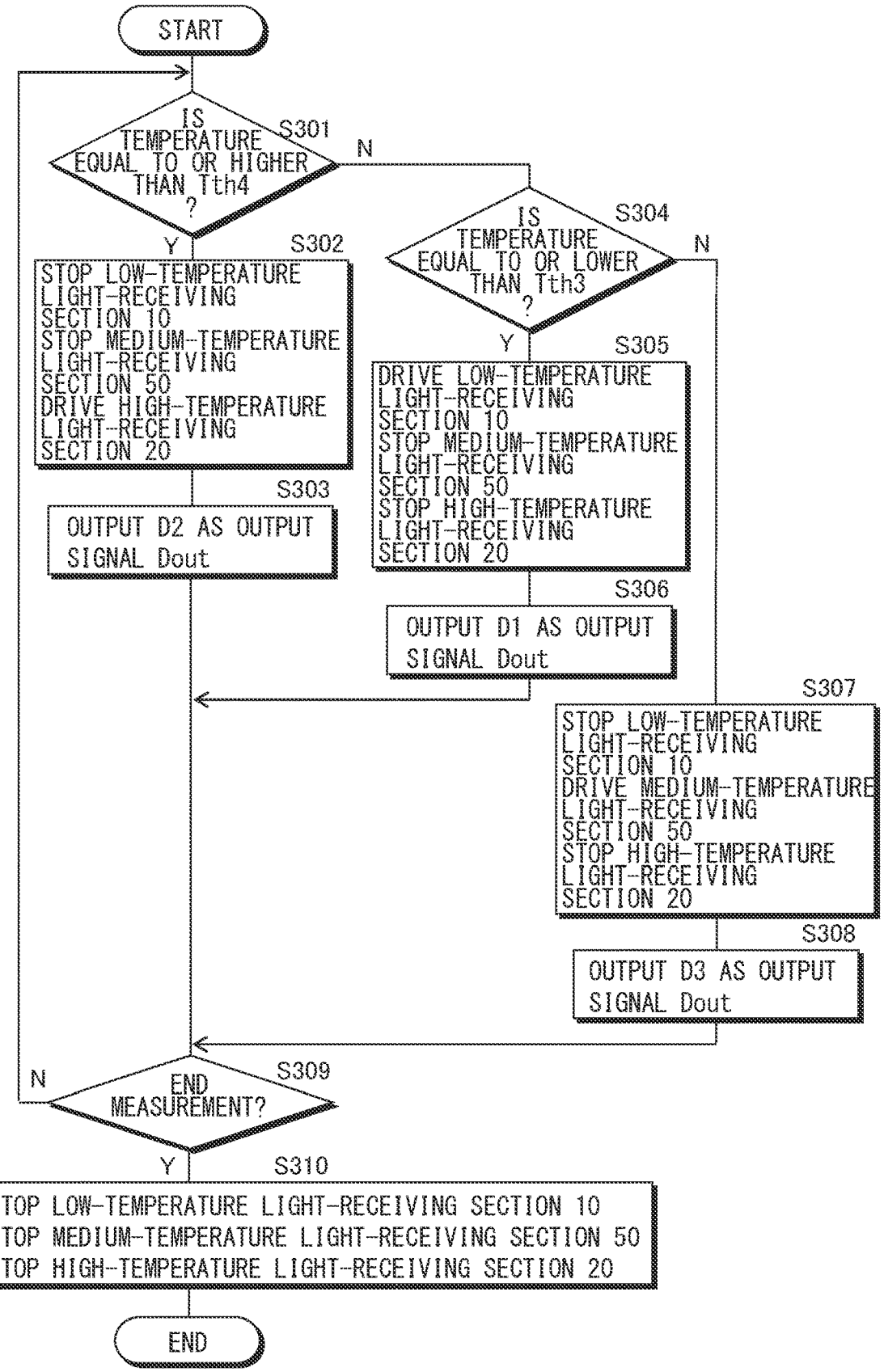

[FIG. 19]
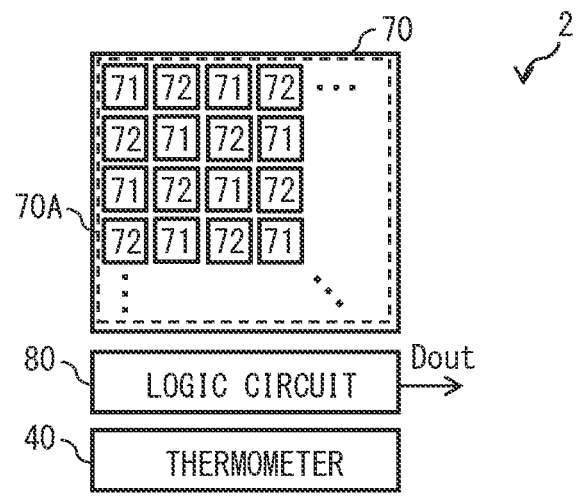
[FIG. 20]
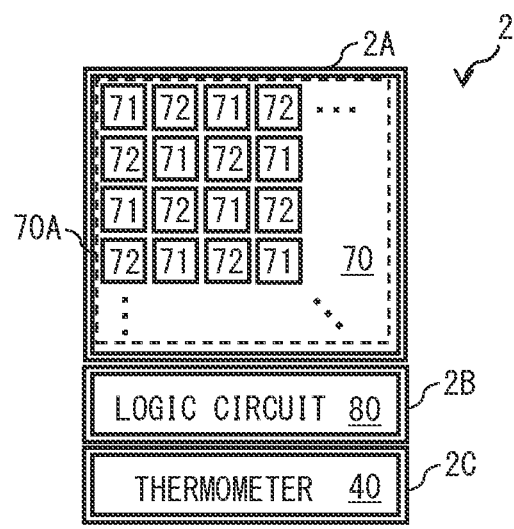

[FIG. 21]
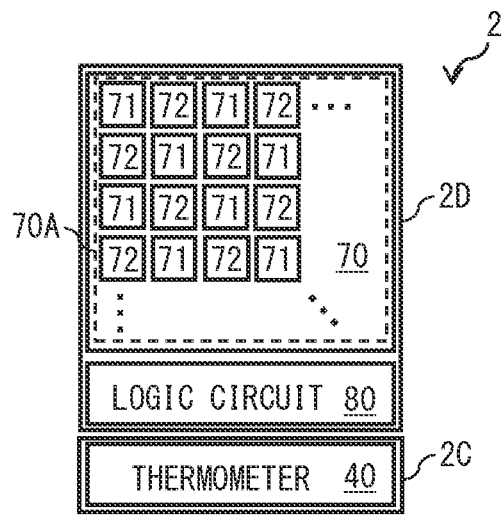
[FIG. 22]
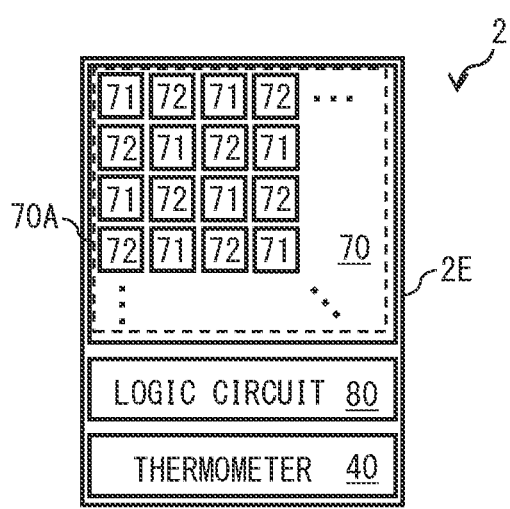

[FIG. 23]
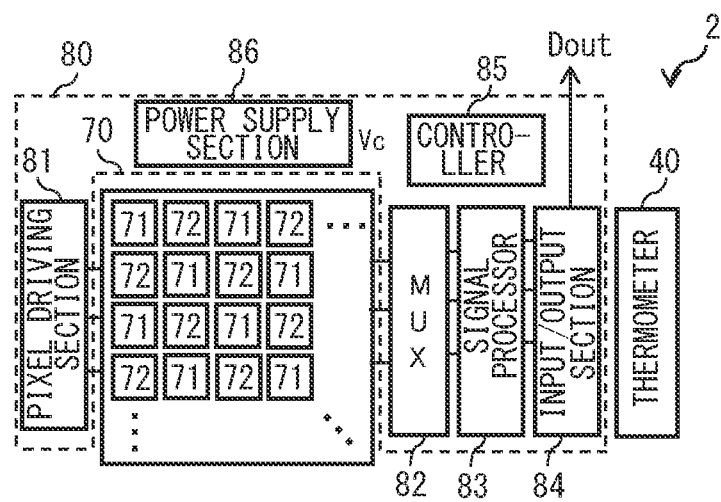
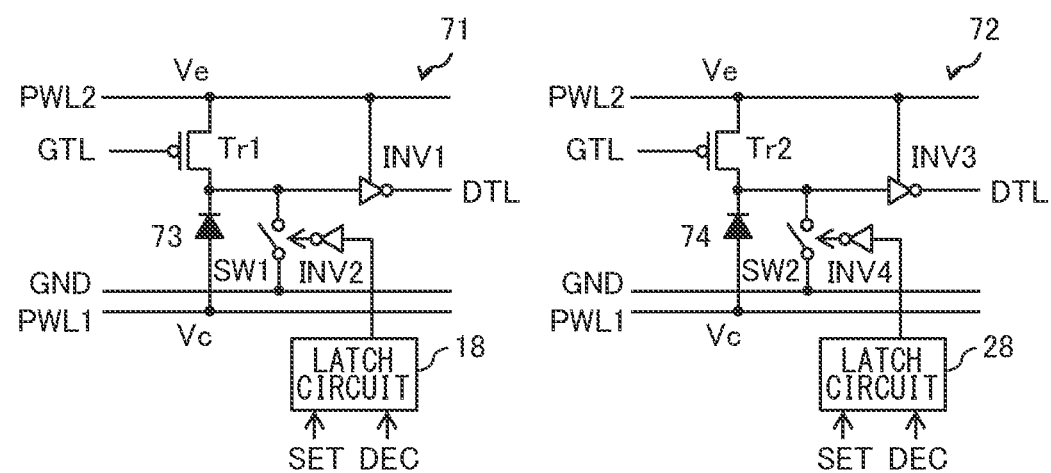
[FIG. 24A]   [FIG. 24B]

[FIG. 25]
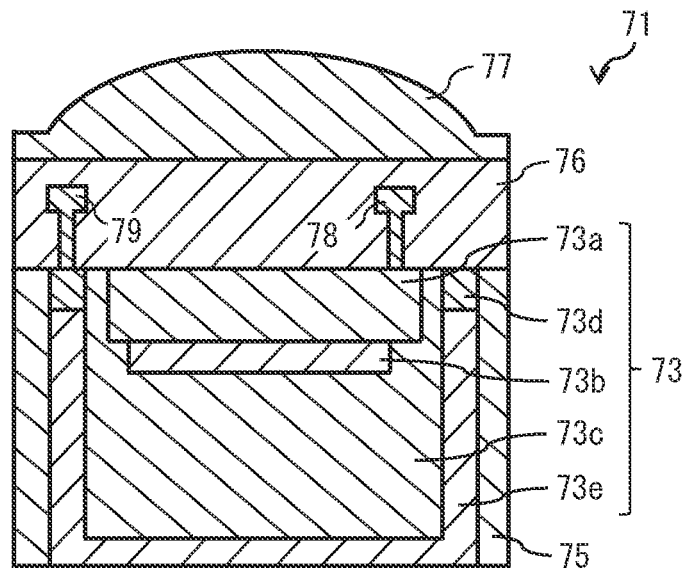
[FIG. 26]
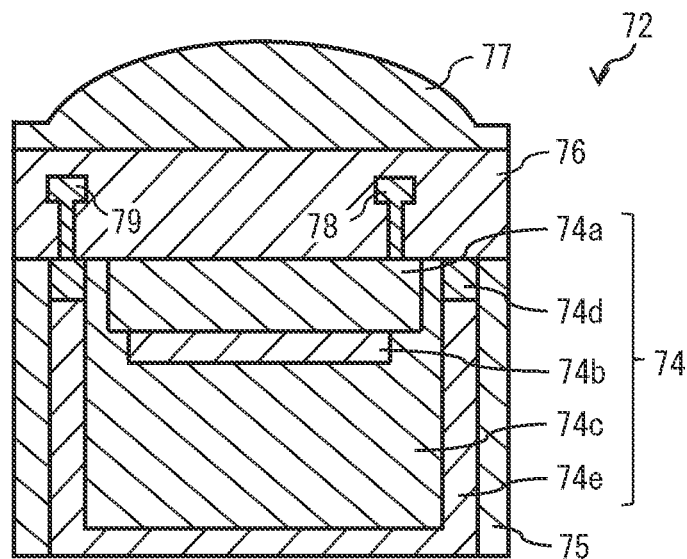

[FIG. 27]
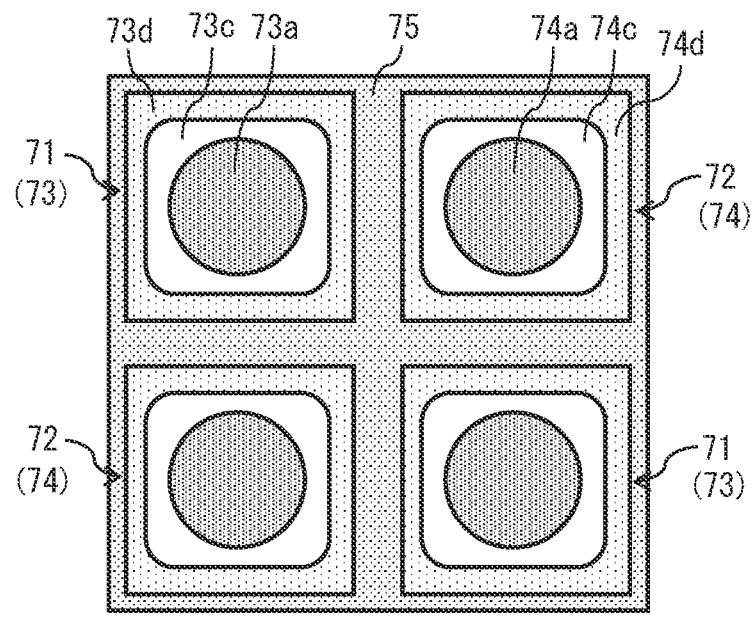
[FIG. 28]
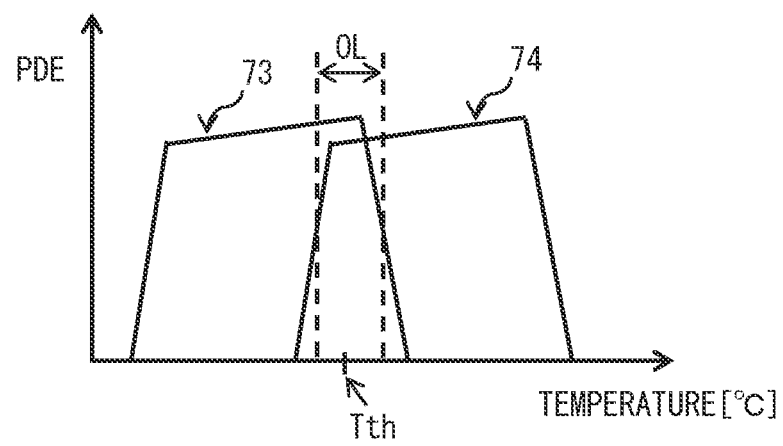

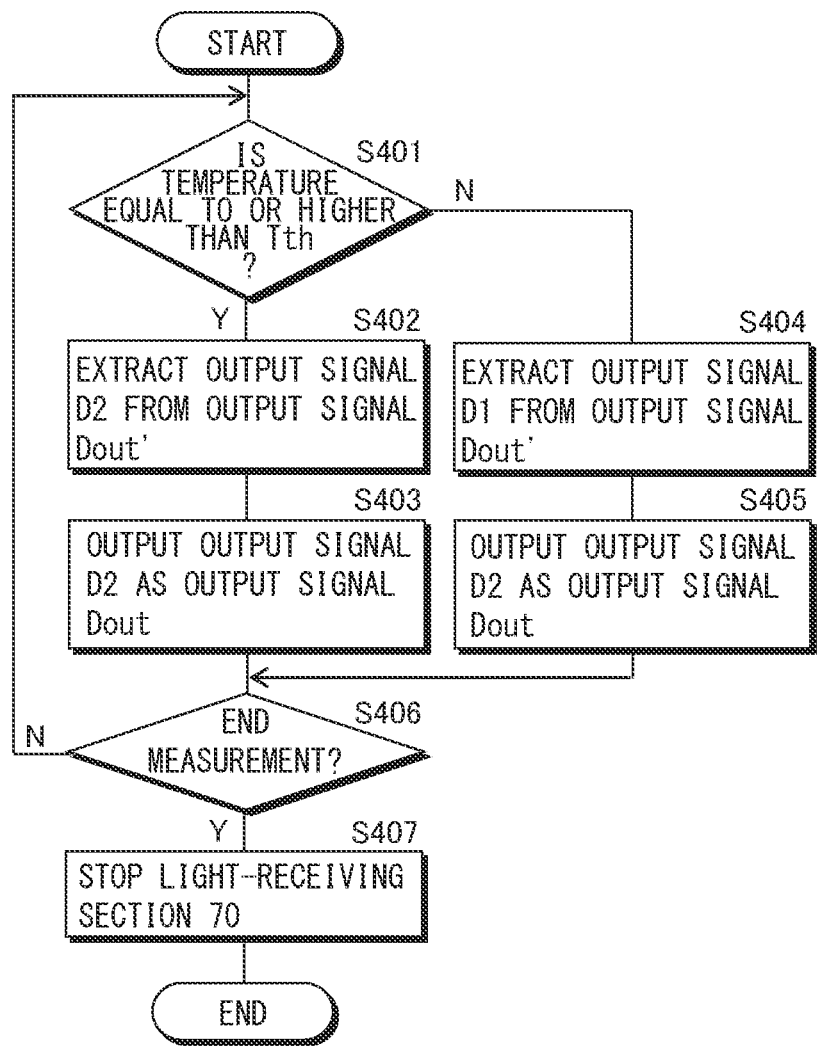
[FIG. 29]

[FIG. 30]
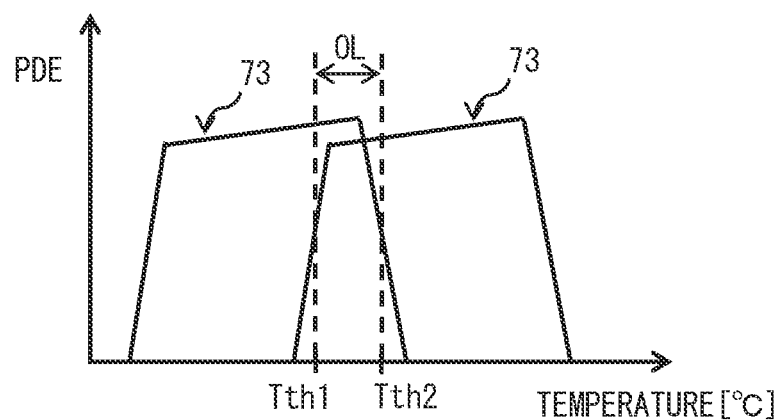

[FIG. 31]
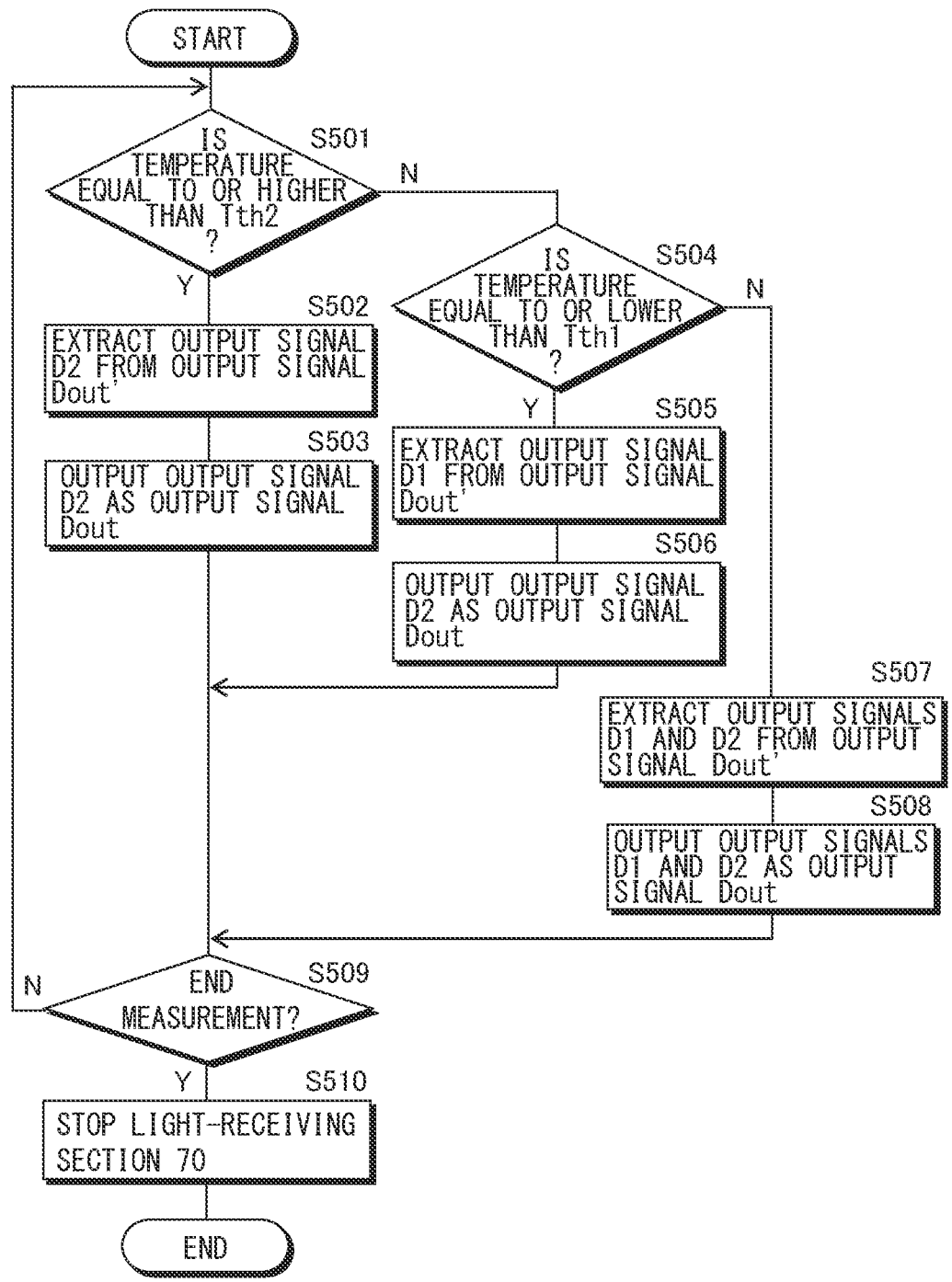

[FIG. 32]
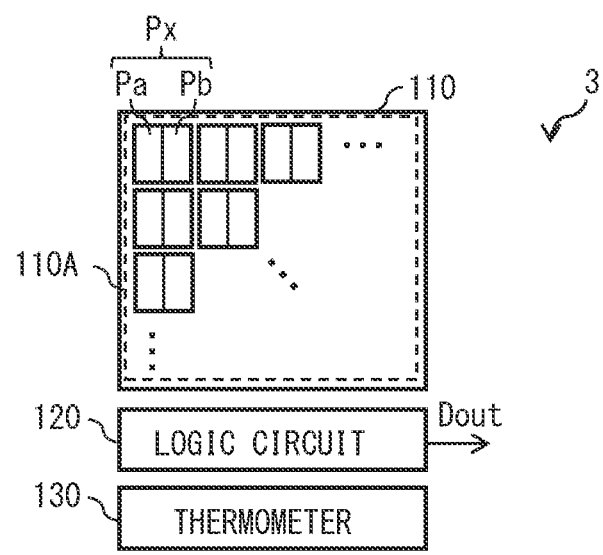
[FIG. 33]
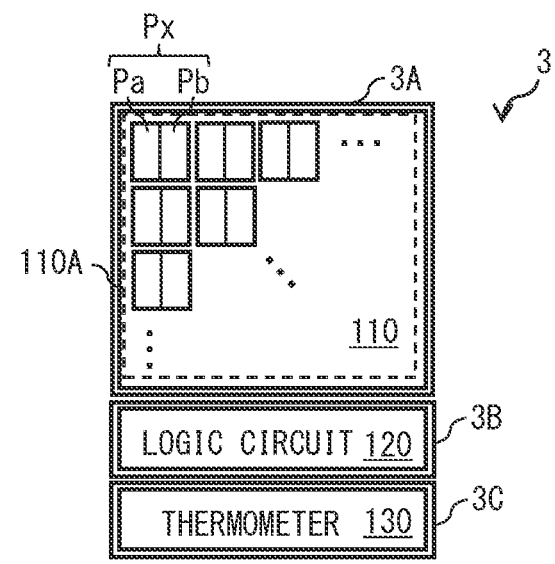

[FIG. 34]
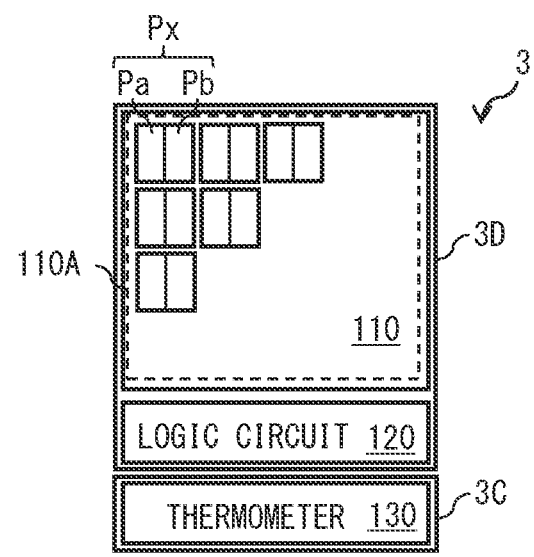
[FIG. 35]
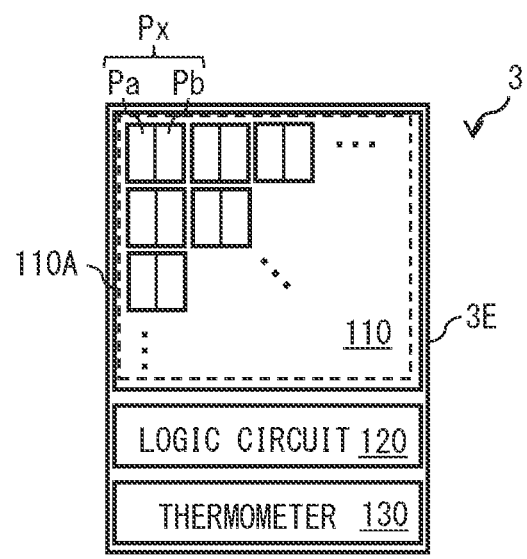

[FIG. 36]
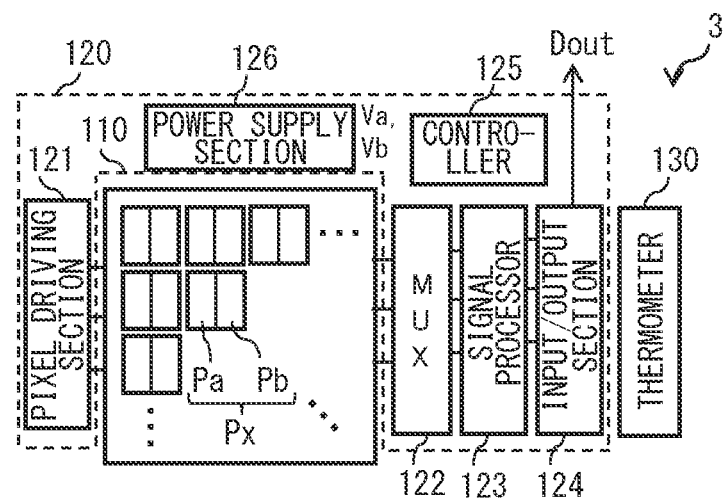
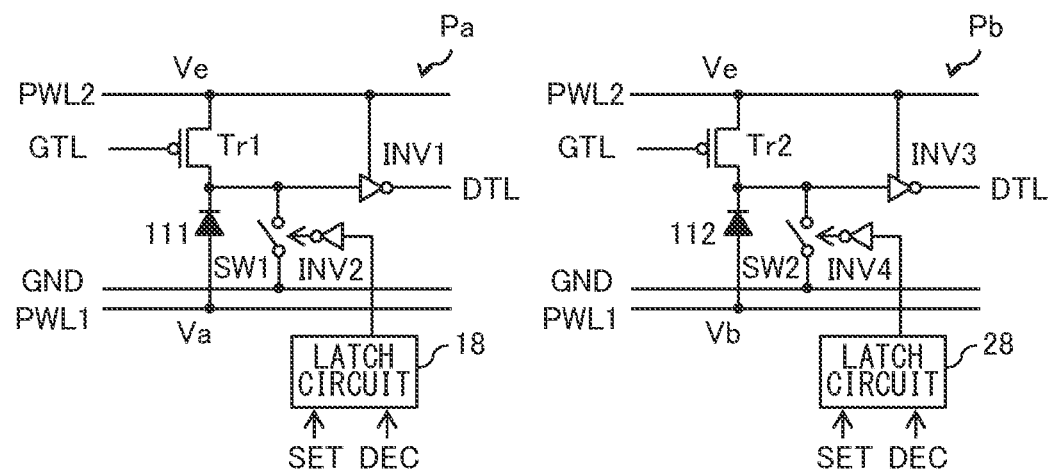
[FIG. 37A]     [FIG. 37B]

[FIG. 38]
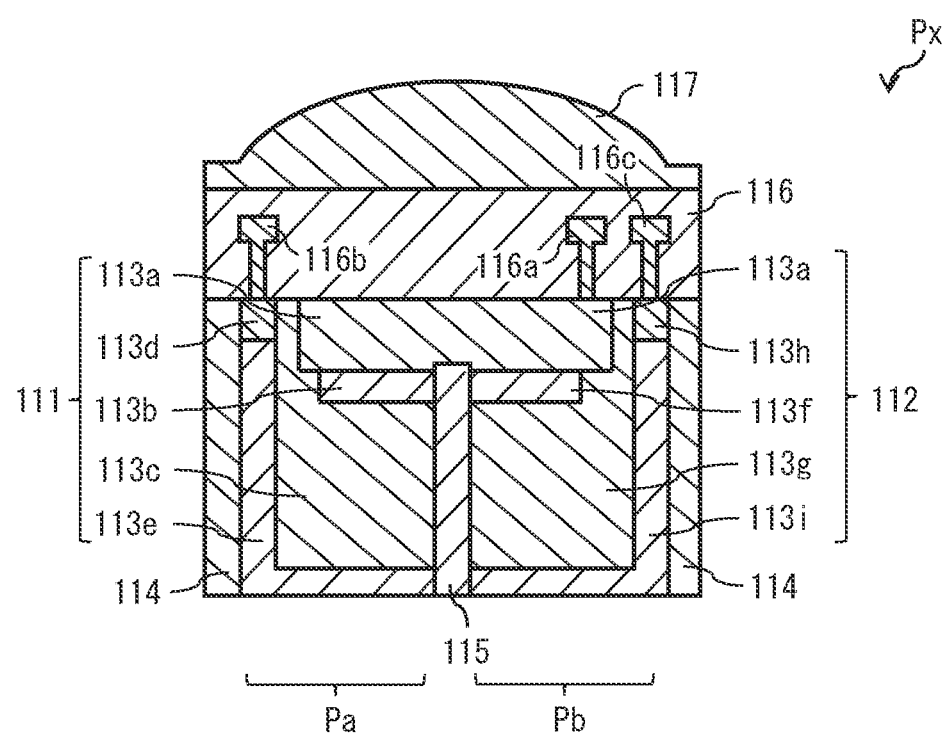

[FIG. 39]
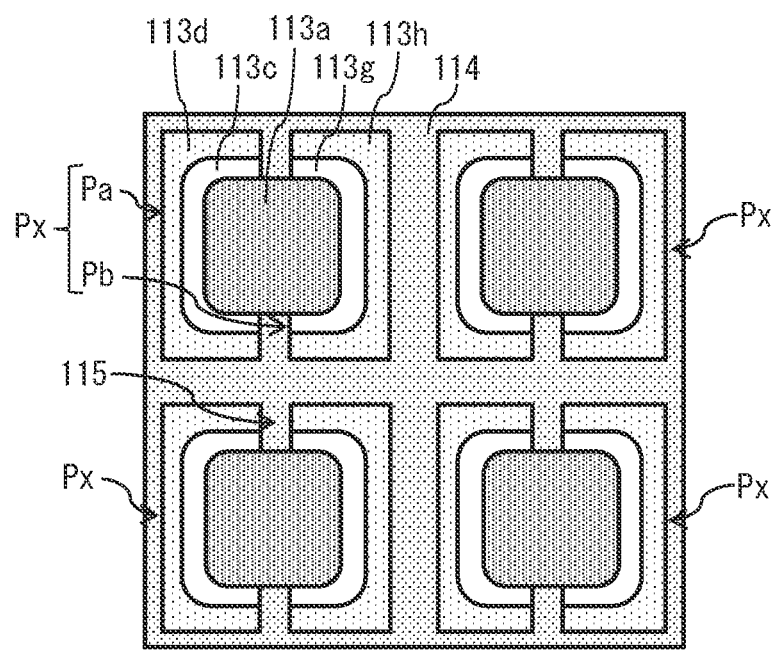
[FIG. 40]
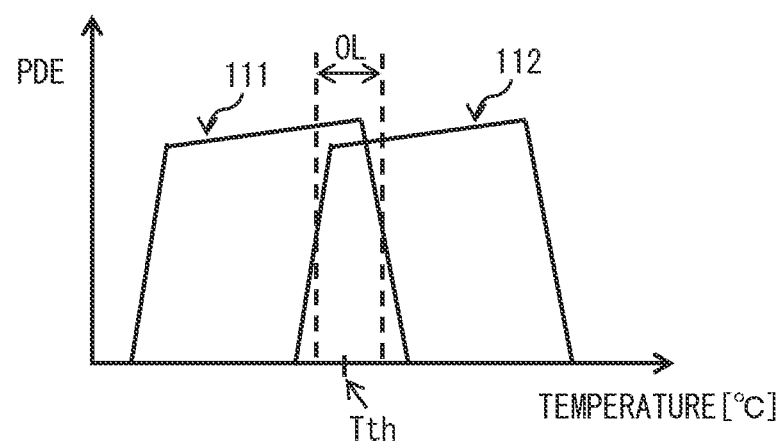

[FIG. 41]
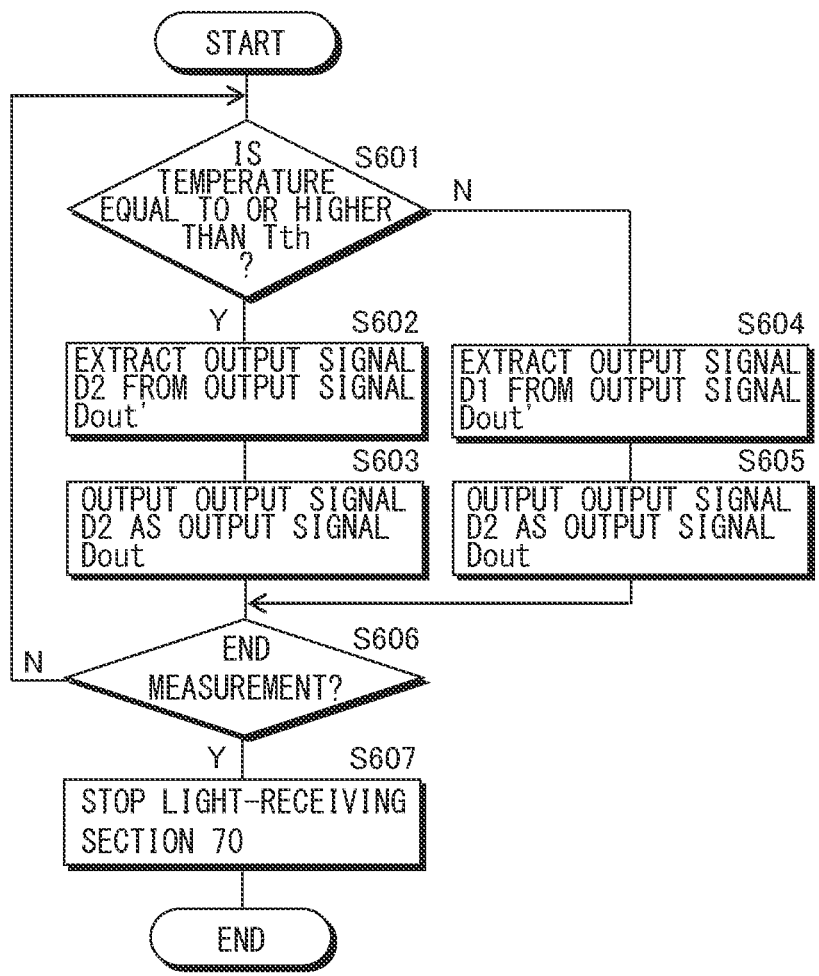

[FIG. 42]
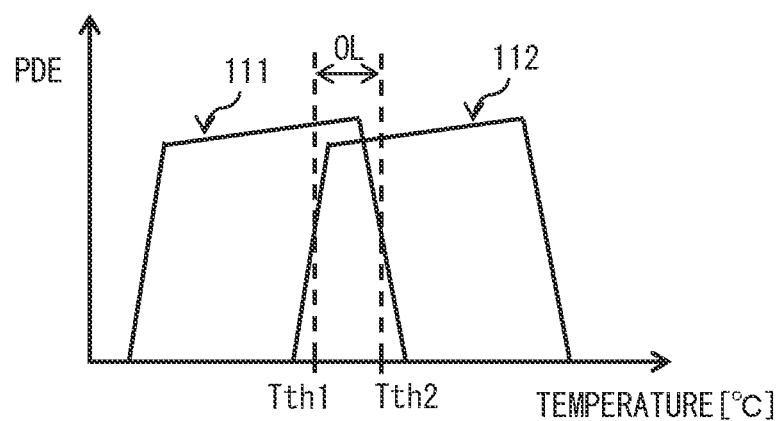

[FIG. 43]
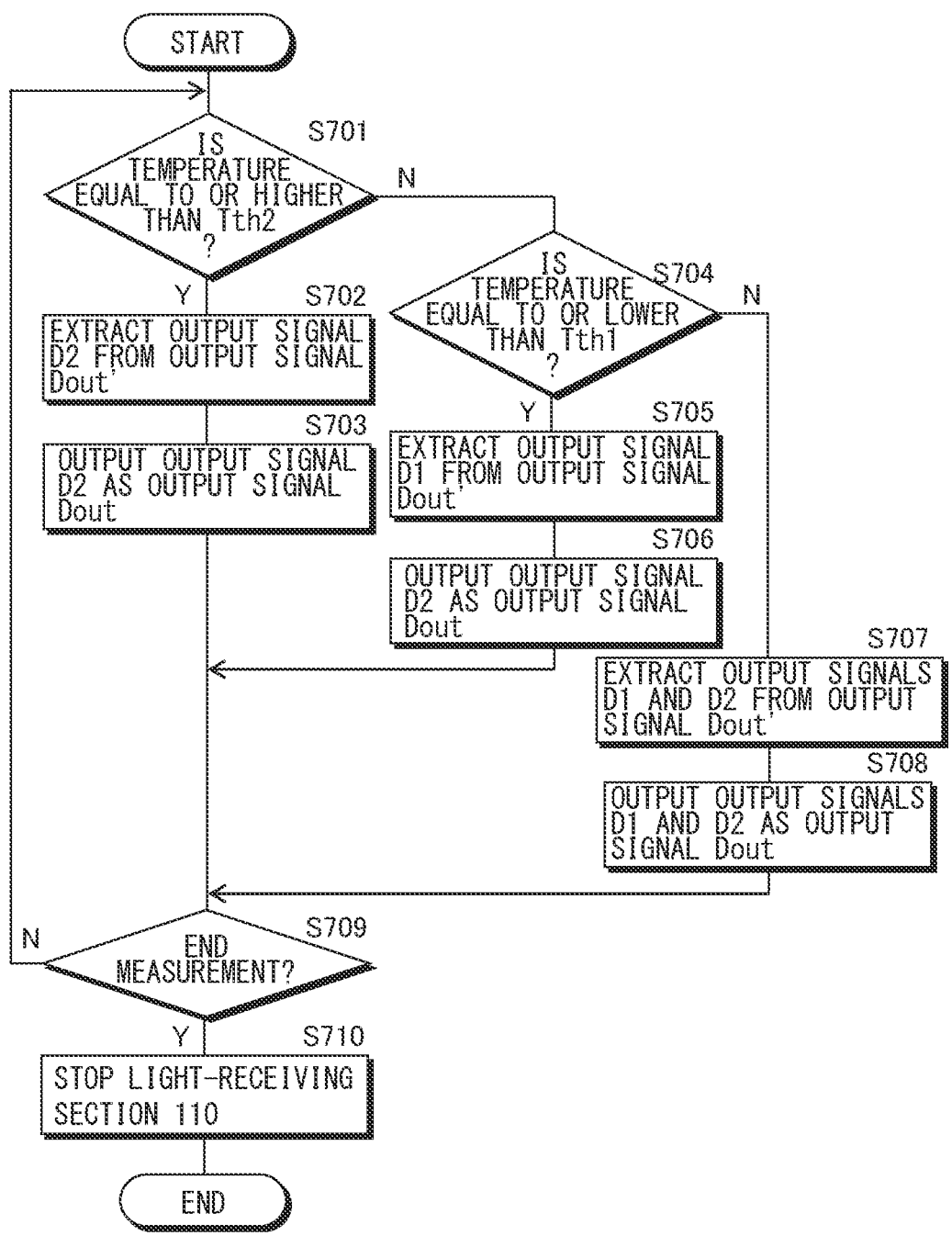

[FIG. 44]
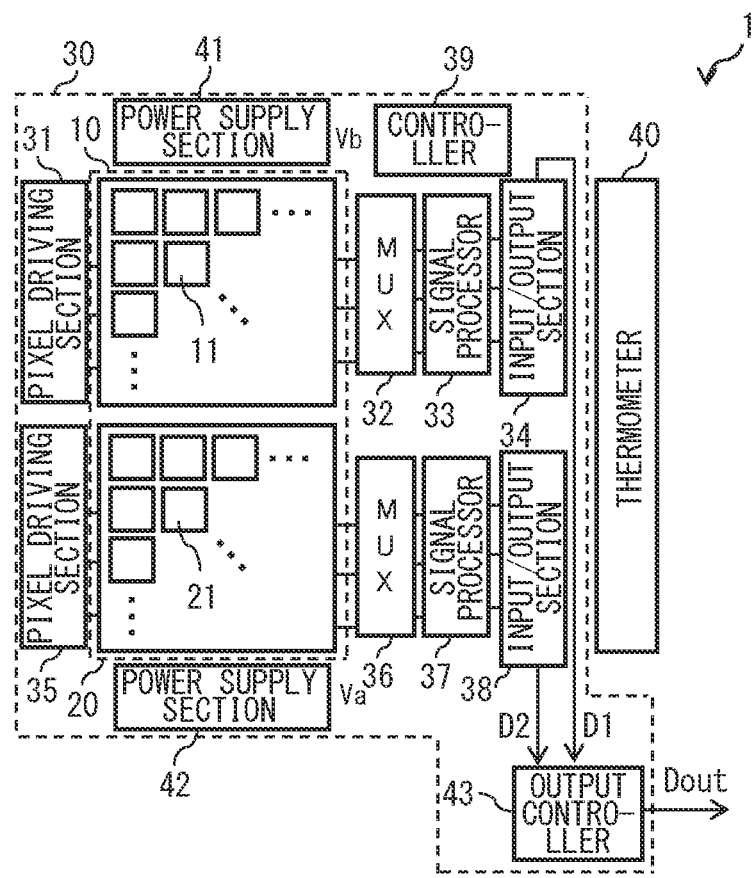

[FIG. 45]
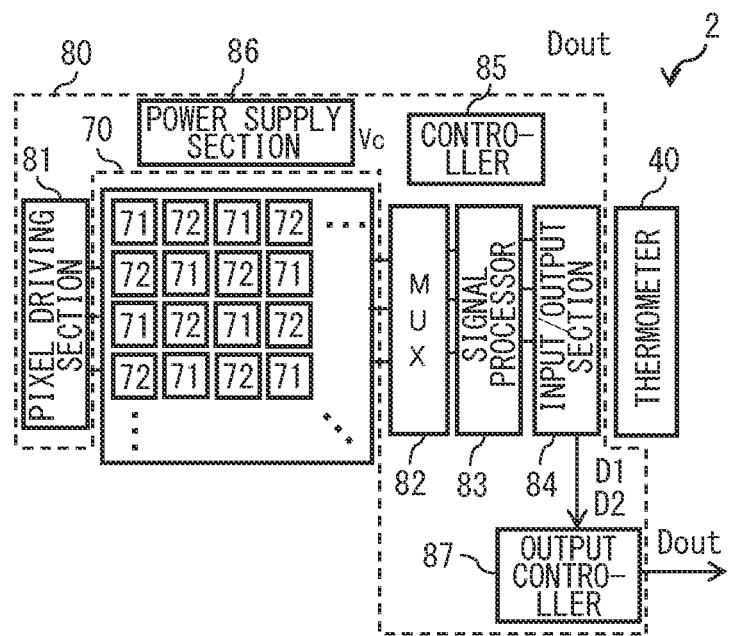
[FIG. 46]
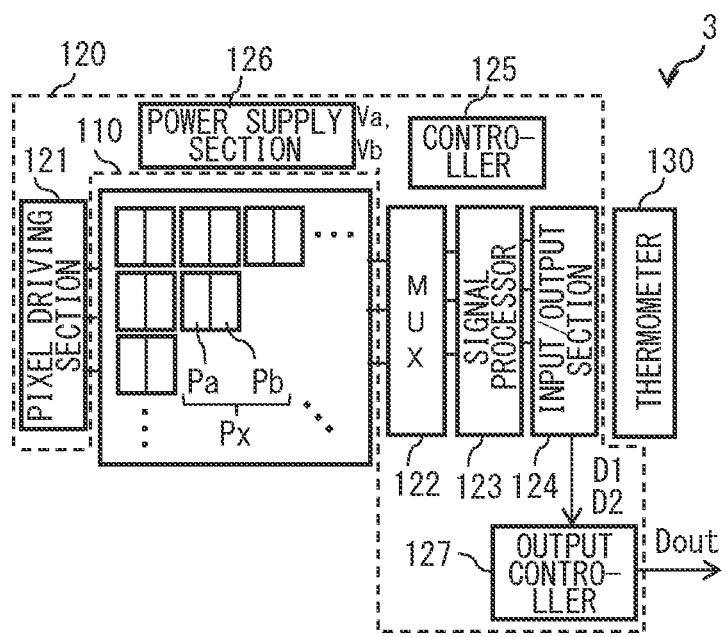

[FIG. 47]
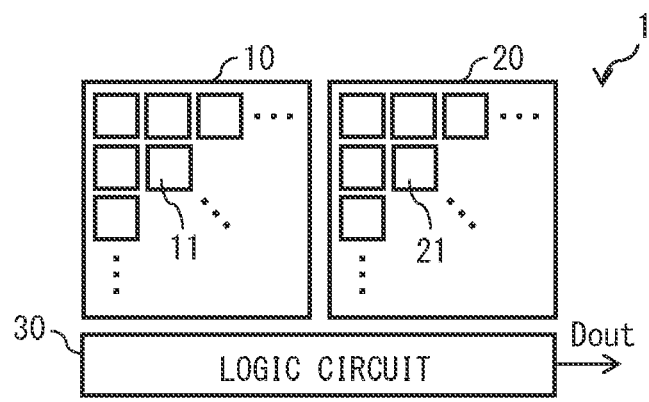
[FIG. 48]
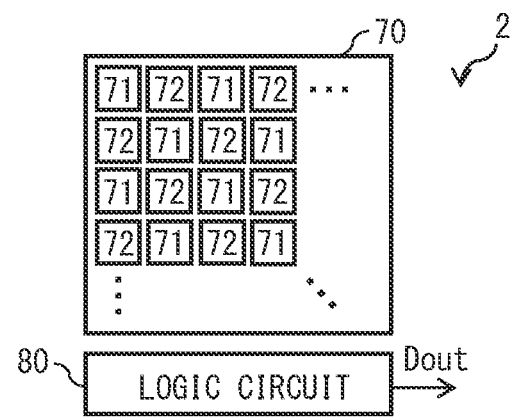

[FIG. 49]
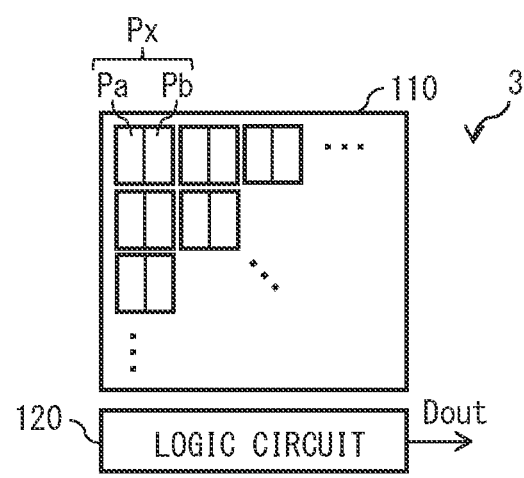
[FIG. 50]
| 1 | MAGNITUDE RELATIONSHIP BETWEEN SIGNAL LEVELS OF D1 AND D2 |
| 2 | MAGNITUDE RELATIONSHIP BETWEEN S/N RATIOS OF D1 AND D2 |

[FIG. 51]
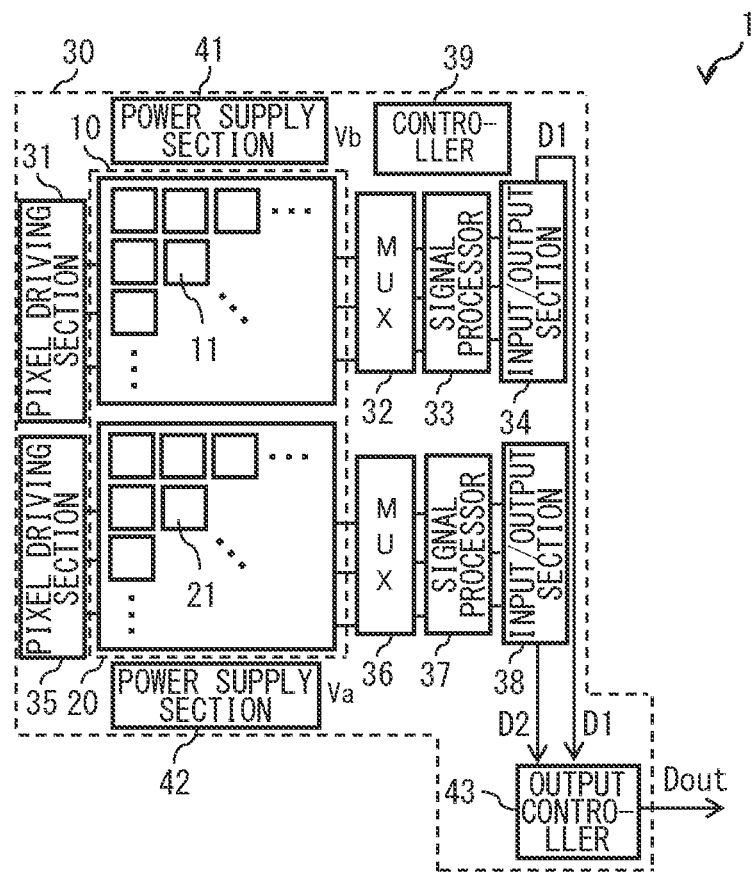

[FIG. 52]
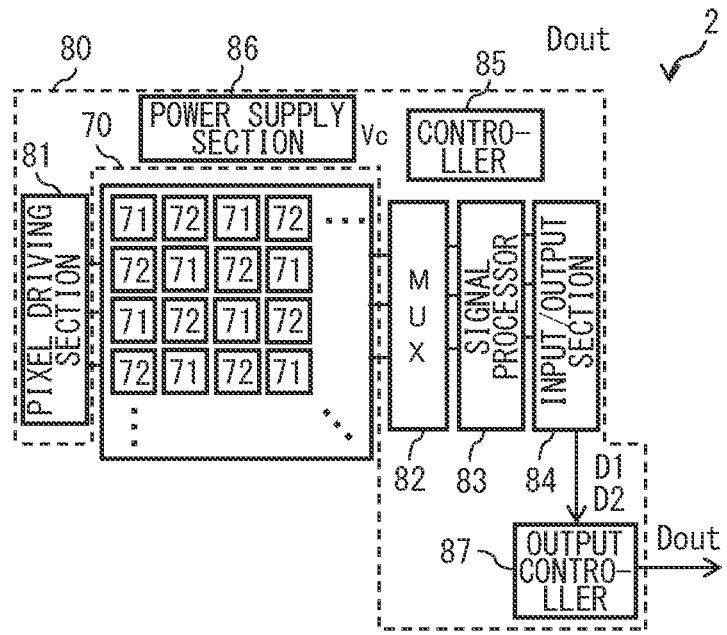
[FIG. 53]
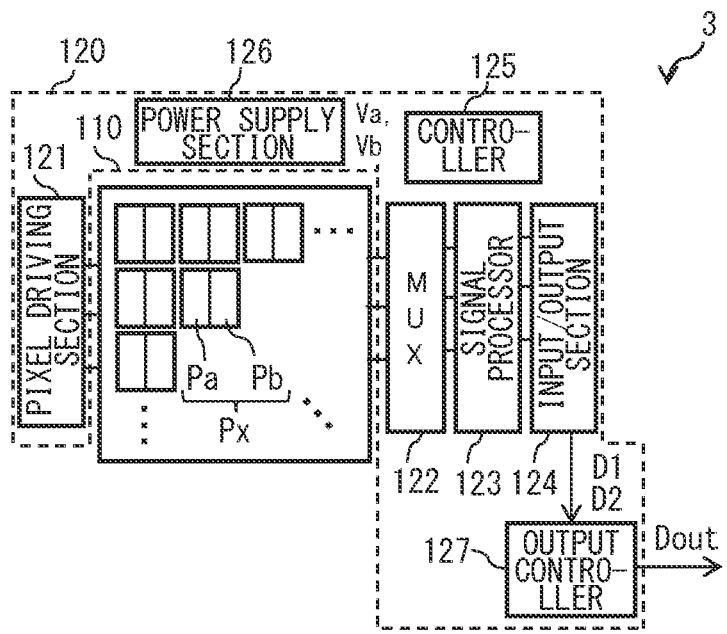

[FIG. 54]
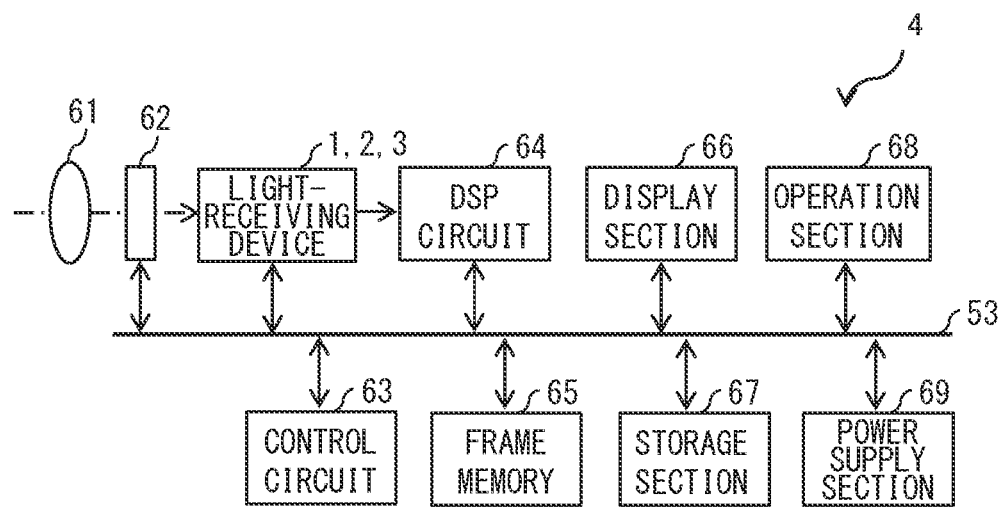
[FIG. 55]
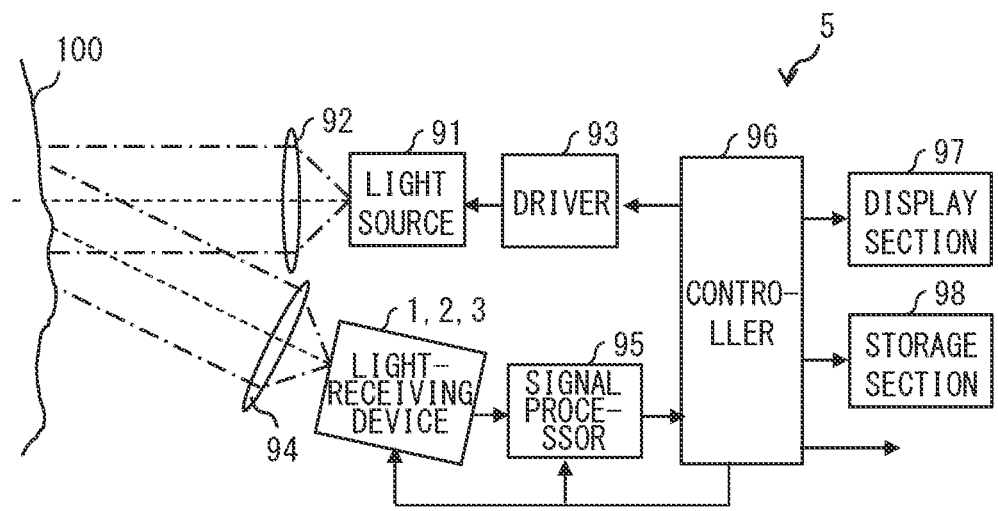

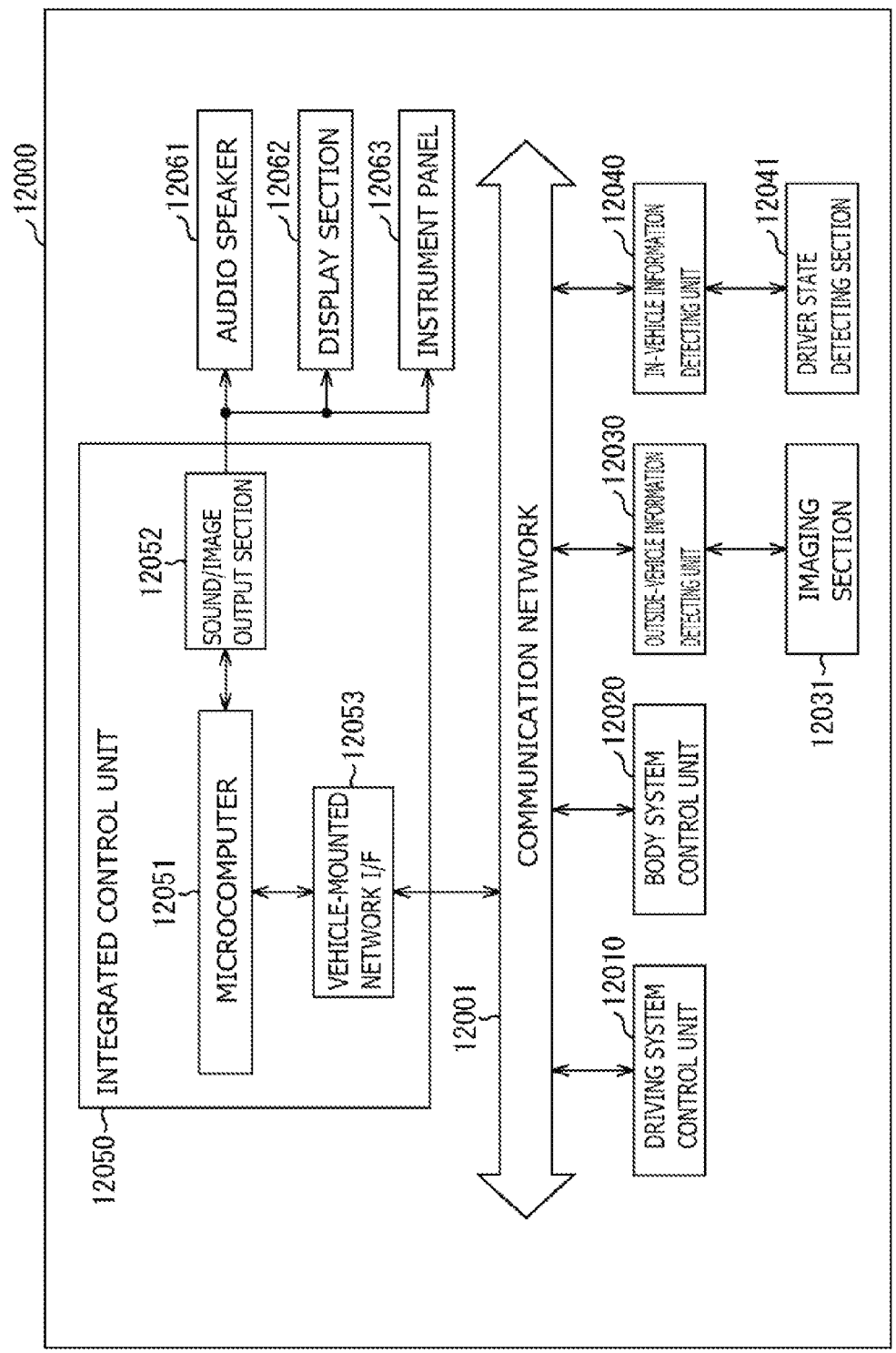
[FIG. 56]

[FIG. 57]
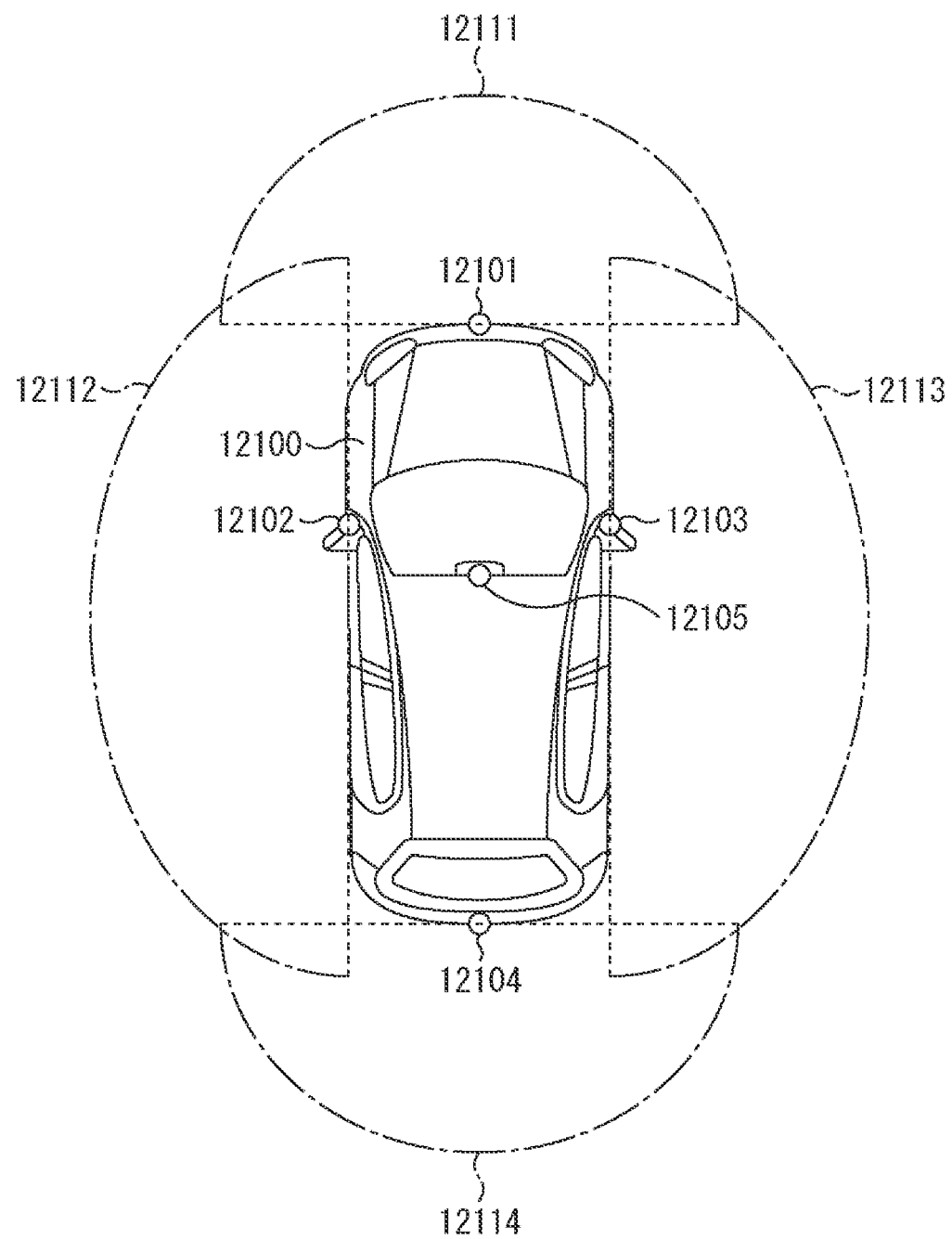

LIGHT-RECEIVING DEVICE, IMAGING DEVICE, AND DISTANCE MEASUREMENT DEVICE FOR EXPANDED RANGE OF PHOTON DETECTION EFFICIENCY

CROSS REFERENCE TO RELATED APPLICATIONS

This application is a U.S. National Phase of International Patent Application No. PCT/JP2020/012220 filed on Mar. 19, 2020, which claims priority benefit of Japanese Patent Application No. JP 2019-076106 filed in the Japan Patent Office on Apr. 12, 2019. Each of the above-referenced applications is hereby incorporated herein by reference in its entirety.

TECHNICAL FIELD

The present disclosure relates to a light-receiving device, and relates to, for example, a light-receiving device suitably applied to an avalanche photodiode. In addition, the present disclosure relates to an imaging device and a distance measurement device that each include a light-receiving device.

BACKGROUND ART

Avalanche photodiodes (avalanche photodiodes: APDs) include a Geiger mode APD that operates with a bias voltage higher than a breakdown voltage, and a linear mode APD that operates with a slightly high bias voltage near the breakdown voltage. The Geiger mode avalanche photodiode is also referred to as a single photon avalanche photodiode (SPAD).

The SPAD is a device that is able to detect one photon at each pixel by multiplying a carrier generated by photoelectric conversion in a high electric field PN-junction region provided in each pixel. The following PTL 1 discloses a SPAD that is able to reduce crosstalk to adjacent pixels by light emission in a high electric field region and suppress dark current rate degradation caused by generation of a dark current.

CITATION LIST

Patent Literature

PTL 1: International Publication No. WO2017/074530

SUMMARY OF THE INVENTION

Incidentally, in a SPAD, reading of electric charges at a low temperature is difficult due to temperature dependence of a breakdown voltage. In addition, at a high temperature, an avalanche probability associated with depletion of a multiplying region is decreased. That is, it is possible to ensure photon detection efficiency (Photon Detection. Efficiency: PDE) only in a specific temperature range. It is desirable to provide a light-receiving device that makes it possible to expand a range where PDE is ensured, and an imaging device and a distance measurement device that each include such a light-receiving device.

A light-receiving device according to an embodiment of the present disclosure includes a pixel array including light-receiving elements provided in respective pixels. The light-receiving elements each include a high electric field region and a photoelectric conversion region. A plurality of the light-receiving elements provided in the respective pixels includes a plurality of types of elements that have temperature regions having high photon detection efficiency (PDE). The temperature regions are different from each other and partially overlap each other.

An imaging device according to an embodiment of the present disclosure includes the pixel array described above, and a signal processor that generates a captured image on the basis of a signal outputted from the pixel array.

A distance measurement device according to an embodiment of the present disclosure includes the pixel array described above, and a signal processor that measures a distance to an object on the basis of a signal outputted from the pixel array.

In the light-receiving device, the imaging device, and the distance measurement device according to the embodiments of the present disclosure, the plurality of light-receiving elements provided for the respective pixels includes a plurality of types of elements having temperature regions having PDE that are different from each other and partially overlap each other. Accordingly, for example, of the plurality of types of light-receiving elements, a light-receiving element in which a temperature region having high photon detection efficiency is distributed relatively on low temperature side is used in reading of electric charges at a low temperature, and a light-receiving element in which a temperature region having high photon detection efficiency is distributed relatively on high temperature side is used in reading of electric charges at a high temperature, thereby suppressing degradation in PDE at both the low temperature and the high temperature.

BRIEF DESCRIPTION OF DRAWINGS

FIG. 1 is a diagram illustrating a schematic configuration example of a light-receiving device according to a first embodiment of the present disclosure.

FIG. 2 is a diagram illustrating an example in which the light-receiving device in FIG. 1 includes a plurality of chips.

FIG. 3 is a diagram illustrating an example in which the light-receiving device in FIG. 1 includes a plurality of chips.

FIG. 4 is a diagram illustrating an example in which the light-receiving device in FIG. 1 includes one chip.

FIG. 5 is a diagram illustrating a schematic configuration example of a logic circuit in FIG. 1.

FIG. 6A is a diagram illustrating a circuit configuration example of each pixel of a low-temperature light-receiving section in FIG. 1. FIG. 6B is a diagram illustrating a circuit configuration example of each pixel of a high-temperature light-receiving section in FIG. 1.

FIG. 7 is a diagram illustrating changes in a cathode voltage and a detection signal of an APD in accordance with entry of a photon.

FIG. 8 is a diagram illustrating a cross-sectional configuration example of each pixel of the low-temperature light-receiving section in FIG. 1.

FIG. 9 is a diagram illustrating a top surface configuration example of the low-temperature light-receiving section in FIG. 1.

FIG. 10 is a diagram illustrating a cross-sectional configuration example of each pixel of the high-temperature light-receiving section in FIG. 1.

FIG. 11 is a diagram illustrating a top surface configuration example of the high-temperature light-receiving section in FIG. 1.

FIG. 12 is a diagram illustrating an example of temperature dependence of PDE in APDs in FIGS. 6A and 6B.

FIG. 13 is a diagram illustrating an example of a procedure of switching respective light-receiving sections in the light-receiving device in FIG. 1.

FIG. 14 is a diagram illustrating an example of temperature dependence of PDE in the APDs in FIGS. 6A and 6B.

FIG. 15 is a diagram illustrating an example of a procedure of switching the respective light-receiving sections in the light-receiving device in FIG. 1.

FIG. 16 is a diagram illustrating a modification example of a schematic configuration of the light-receiving device in FIG. 1.

FIG. 17 is a diagram illustrating an example of temperature dependence of PDE in APDs of the light-receiving device in FIG. 16.

FIG. 18 is a diagram illustrating an example of a procedure of switching respective light-receiving sections in the light-receiving device in FIG. 16.

FIG. 19 is a diagram illustrating a schematic configuration example of a light-receiving device according to a second embodiment of the present disclosure.

FIG. 20 is a diagram illustrating an example in which the light-receiving device in FIG. 19 includes a plurality of chips.

FIG. 21 is a diagram illustrating an example in which the light-receiving device in FIG. 19 includes a plurality of chips.

FIG. 22 is a diagram illustrating an example in which the light-receiving device in FIG. 19 includes one chip.

FIG. 23 is a diagram illustrating a schematic configuration example of a logic circuit in FIG. 19.

FIG. 24A is a diagram illustrating a circuit configuration example of a pixel for low temperature in FIG. 19. FIG. 24B is a diagram illustrating a circuit configuration example of a pixel for high temperature in FIG. 19.

FIG. 25 is a diagram illustrating a cross-sectional configuration example of the pixel for low temperature in FIG. 19.

FIG. 26 is a diagram illustrating a cross-sectional configuration example of the pixel for high temperature in FIG. 19.

FIG. 27 is a diagram illustrating a top surface configuration example of a light-receiving section in FIG. 19.

FIG. 28 is a diagram illustrating an example of temperature dependence of PDE in APDs of the light-receiving device in FIG. 19.

FIG. 29 is a diagram illustrating an example of a procedure of switching output signals in the light-receiving device in FIG. 19.

FIG. 30 is a diagram illustrating an example of temperature dependence of PDE in the APDs of the light-receiving device in FIG. 19.

FIG. 31 is a diagram illustrating an example of a procedure of switching output signals in the light-receiving device in FIG. 19.

FIG. 32 is a diagram illustrating a schematic configuration example of a light-receiving device according to a third embodiment of the present disclosure.

FIG. 33 is a diagram illustrating an example in which the light-receiving device in FIG. 32 includes a plurality of chips.

FIG. 34 is a diagram illustrating an example in which the light-receiving device in FIG. 32 includes a plurality of chips.

FIG. 35 is a diagram illustrating an example in which the light-receiving device in FIG. 32 includes one chip.

FIG. 36 is a diagram illustrating a schematic configuration example of a logic circuit in FIG. 32.

FIG. 37A is a diagram illustrating a circuit configuration example of a sub-pixel for low temperature in FIG. 32. FIG. 37B is a diagram illustrating a circuit configuration example of a sub-pixel for high temperature in FIG. 32.

MODES FOR CARRYING OUT THE INVENTION

Hereinafter, some embodiments of the present disclosure are described in detail with reference to the drawings. It is to be noted that description is given in the following order.

1. First Embodiment (light-receiving device) ... FIGS. 1, 2, 3, 4, 5, 6A, 6B, 7, 8, 9, 10, 11, 12, 13, 14, and 15
2. Modification Example of First Embodiment (light-receiving device) ... FIGS. 16 to 18
3. Second Embodiment (light-receiving device) ... FIGS. 19, 20, 21, 22, 23, 24A, 24B, 25, 26, 27, 28, 29, 30, and 31
4. Third Embodiment (light-receiving device) ... FIGS. 32, 33, 34, 35, 36, 37A, 37B, 38, 39, 40, 41, 42 and 43
5. Common Modification Examples for Respective Embodiments (light-receiving device) ... FIGS. 44 to 53
6. Application Examples
   Application Example 1 (imaging device) ... FIG. 54
   Application Example 2 (distance measurement device) ... FIG. 55
7. Practical Application Example
   Practical Application Example (mobile body) ... FIGS. 56 and 57

The present technology described below is applicable to a light-receiving device. In addition, the present technology is applicable specifically to an avalanche photodiode (APD) as a light-receiving device; therefore, the present technology is described with use of the APD as an example. APDs include a Geiger mode APD that operates with a bias voltage higher than a breakdown voltage, and a linear mode APD that operates with a slightly high bias voltage near the breakdown voltage. The Geiger mode avalanche photodiode is also referred to as a single photon avalanche photodiode (SPAD).

The SPAD is a device that is able to detect one photon at each pixel by multiplying a carrier generated by photoelectric conversion in a high electric field PN-junction region provided in each pixel. The present technology is applied to the SPAD of APDs, thus making it possible to achieve a higher effect.

1. First Embodiment

[Configuration]

Description is given of a light-receiving device 1 according to a first embodiment of the present disclosure. FIG. 1 illustrates a schematic configuration example of the light-receiving device 1. The light-receiving device 1 includes, for example, two light-receiving sections (a low-temperature light-receiving section 10 and a high-temperature light-receiving section 20), a logic circuit 30, and a thermometer 40. The low-temperature light-receiving section 10 includes a pixel array 10A. The pixel array 10A includes a plurality of pixels 11. The high-temperature light-receiving section 20 includes a pixel array 20A. The pixel array 10A includes a plurality of pixels 21. The pixel arrays 10A and 20A correspond to specific examples of a "pixel array" of the present disclosure. The pixel array 10A and the pixel array 20A are disposed adjacent to each other. The logic circuit 30 outputs, to the outside, an output signal Dout obtained on the basis of output signals from the two light-receiving sections (the low-temperature light-receiving section 10 and the high-temperature light-receiving section 20). The pixels 11 and 21 are described in detail later.

In the light-receiving device 1, the two light-receiving sections (the low-temperature light-receiving section 10 and the high-temperature light-receiving section 20) are formed in different chips (a chip 1A and a chip 1B), for example, as illustrated in FIG. 2. The low-temperature light-receiving section 10 is formed in the chip 1A, and the high-temperature light-receiving section 20 is formed in the chip 1B. The chips 1A and 1B each include, for example, a silicon substrate. The low-temperature light-receiving section 10 is formed in the silicon substrate (a first semiconductor substrate) of the chip 1A, and the high-temperature light-receiving section 20 is formed in the silicon substrate of the chip 1B, that is, a silicon substrate (a second semiconductor substrate) different from the silicon substrate included in the low-temperature light-receiving section 10.

In addition, in the light-receiving device 1, the logic circuit 30 is formed in, for example, a chip 1C different from the chips 1A and 1B, and the thermometer 40 is formed in, for example, a chip 1D different from the chips 1A, 1B, and 1C. On this occasion, the chips 1A and 1B may be bonded onto the chip 1C, or the chips 1A, 1B, 1C, and 1D may be bonded onto a common support substrate. The chip 1D may be bonded to a back surface of the chip 1C.

It is to be noted that in the light-receiving device 1, the two light-receiving sections (the low-temperature light-receiving section 10 and the high-temperature light-receiving section 20) may be formed in a common chip 1E, for example, as illustrated in FIG. 3. On this occasion, the chip 1E includes, for example, a silicon substrate, and the two light-receiving sections (the low-temperature light-receiving section 10 and the high-temperature light-receiving section 20) are formed in the common silicon substrate. In addition, in the light-receiving device 1, the logic circuit 30 may be formed in the same chip 1E as the two light-receiving sections (the low-temperature light-receiving section 10 and the high-temperature light-receiving section 20), for example, as illustrated in FIG. 3. On this occasion, the two light-receiving sections (the low-temperature light-receiving section 10 and the high-temperature light-receiving section 20) and the logic circuit 30 are formed in the common silicon substrate.

In addition, in the light-receiving device 1, the two light-receiving sections (the low-temperature light-receiving section 10 and the high-temperature light-receiving section 20), the logic circuit 30, and the thermometer 40 may be formed in a common chip 1F, for example, as illustrated in FIG. 4. On this occasion, the chip 1F includes, for example, a silicon substrate, and the two light-receiving sections (the low-temperature light-receiving section 10 and the high-temperature light-receiving section 20), the logic circuit 30, and the thermometer 40 are formed in the common silicon substrate.

The thermometer 40 measures temperatures of the two light-receiving sections (the low-temperature light-receiving section 10 and the high-temperature light-receiving section 20), and outputs measurement results to the logic circuit 30. In a case where the chips 1D and 1F each include a silicon substrate, the thermometer 40 includes, for example, a silicon diode temperature sensor. In a case where the thermometer 40 is formed in the chip 1D, the thermometer 40 may include, for example, a silicon diode temperature sensor, or may include any other temperature sensor.

FIG. 5 illustrates a schematic configuration example of the logic circuit 30. FIG. 6A illustrates a circuit configuration example of each of the pixels 11. FIG. 6B illustrates a circuit configuration example of each of the pixels 21. The logic circuit 30 includes, for example, a pixel driving section 31, a MUX (multiplexer) 32, a signal processor 33, and an input/output section 34. The pixel driving section 31 drives each of the pixels 11 in the low-temperature light-receiving section 10. The MUX 32, the signal processor 33, and the input/output section 34 process an output from the low-temperature light-receiving section 10. Hereinafter, the output of the input/output section 34 is referred to as an output signal D1. The logic circuit 30 further includes, for example, a pixel driving section 35, a MUX (multiplexer) 36, a signal processor 37, an input/output section 38, a controller 39, and power supply sections 41 and 42. The pixel driving section 35 drives each of the pixels 21 in the high-temperature light-receiving section 20. The MUX 36, the signal processor 37, and the input/output section 38 process an output from the high-temperature light-receiving section 20. Hereinafter, the output of the input/output section 38 is referred to as an output signal D2. The power supply section 41 supplies a predetermined voltage (e.g., power supply voltages Va and Ve) to each of the pixels 11. The power supply section 42 supplies a predetermined voltage (e.g., power supply voltages Vb and Ve) to each of the pixels 21.

The low-temperature light-receiving section 10 includes the plurality of pixels 11 two-dimensionally arranged, as described above. Each of the pixels 11 includes, for example, an APD (avalanche photodiode) 12, and a transistor Tr1 that is electrically coupled to a node of the APD 12. The APD 12 corresponds to a specific example of a "first light-receiving element" of the present disclosure. The transistor Tr1 is turned on in accordance with a control signal inputted to a gate thereof to output a detection signal generated by the APD 12 to a signal line DTL (to be described later). The transistor Tr1 includes, for example, a field effect thin film transistor (TFT).

The high-temperature light-receiving section 20 includes, for example, the plurality of pixels 21 two-dimensionally arranged, as described above. Each of the pixels 21 includes, for example, an APD (avalanche photodiode) 22, and a transistor Tr2 that is electrically coupled to a node of the APD 22. The APD 22 corresponds to a specific example of a "second light-receiving element" of the present disclosure. The transistor Tr2 is turned on in accordance with a control signal inputted to a gate thereof to output a detection signal generated by the APD 22 to the signal line DTL. The transistor Tr2 includes, for example, a field effect thin film transistor (TFT).

Each of the APDs 12 and 22 is a photodiode (a single photon avalanche photodiode) that carries out avalanche amplification of electric charges generated when incident light is incident thereon and outputs a thus-obtained detection signal. The power supply voltage Va to be supplied to an anode of the APD 12 is, for example, a negative bias (a negative potential) of about −20 V. The power supply voltage Vb to be supplied to an anode of the APD 22 is, for example, a negative bias (a negative potential) of about −20 V. The power supply voltage Va and the power supply voltage Vb may be equal to or different from each other. A power supply voltage Ve is supplied to cathodes of the APDs 12 and 22 respectively through sources/drains of the transistors Tr1 and Tr2. The power supply voltage Ve is, for example, a positive potential of about 3 V. The transistors Tr1 and Tr2 are constant current sources that operate in a saturation region, and each work as a quenching resistor to thereby perform passive quenching.

Each of the low-temperature light-receiving section 10 and the high-temperature light-receiving section 20 further includes a plurality of signal lines DTL and a plurality of gate lines GTL. Each of the low-temperature light-receiving section 10 and the high-temperature light-receiving section 20 further includes a plurality of power supply lines PWL1 and PWL2 and a ground line GND. The low-temperature light-receiving section 10 further includes a switch element SW1, inverters INV1 and INV2, and a latch circuit 18. The high-temperature light-receiving section 20 further includes a switch element SW2, inverters INV3 and 4, and a latch circuit 28.

The signal lines DTL are wiring lines for reading out detection signals from the APDs 12 and 22. The gate lines GTL are wiring lines for inputting control signals that control ON/OFF of the transistors Tr1 and Tr2 to the gates of the transistors Tr1 and Tr2. The power supply lines PWL1 are wiring lines for determining anode potentials of the APDs 12 and 22. The power supply lines PWL2 are wiring lines for determining cathode potentials of the APDs 12 and 22. The gates of the transistors Tr1 and Tr2 are coupled to the gate lines GTL. The sources or the drains of the transistors Tr1 and Tr2 are respectively coupled to cathodes of the APDs 12 and 22 and input terminals of the inverters INV1 and INV3. Output terminals of the inverters INV1 and INV3 are coupled to the signal lines DTL. An electrode not coupled to the cathode out of the source and the drain of each of the transistors Tr1 and Tr2 is coupled to the power supply lines PWL2. The cathodes of the APDs 12 and 22 are respectively coupled to the sources or the drains of the transistors Tr1 and Tr2, and the anodes of the APDs 12 and 22 are coupled to the power supply lines PWL1. Input terminals of the inverters INV2 and INV4 are respectively coupled to the latch circuits 18 and 28, and output terminals of the inverters INV2 and INV4 are respectively coupled to ON/OFF control terminals of the switch elements SW1 and SW2. The switch element SW1 is coupled in parallel to the APD 12. The switch element SW2 is coupled in parallel to the APD 22.

The switch elements SW1 and SW2 are respectively turned on or off in accordance with, for example, gating inversion signals obtained by inverting gating control signals, which are outputs of the latch circuits 18 and 28, by the inverters INV2 and INV4. The latch circuits 18 and 28 respectively supply, to the inverters INV2 and INV4, the gating control signals that perform control to set the pixels 11 and 21 to active pixels or inactive pixels, on the basis of trigger signals SET supplied from the pixel driving sections 31 and 35 and address data DEC. The inverters INV2 and INV4 generate the gating inversion signals obtained by inverting the gating control signals, and respectively supply the gating inversion signals to the switch elements SW1 and SW2.

The trigger signal SET is a timing signal indicating a timing of switching the gating control signal, and the address data DEC is data indicating the address of a pixel that is to be set to an active pixel among the plurality of pixels 11 arranged in a matrix in the pixel array 10A and the plurality of pixels 21 arranged in a matrix in the pixel array 20A. The trigger signal SET and the address data DEC are supplied from each of the pixel driving sections 31 and 35.

The latch circuits 18 and 28 each read out the address data DEC at a predetermined timing indicated by the trigger signal SET. Then, in a case where pixel addresses indicated by the address data DEC include own pixel addresses (the pixels 11 and 21), the latch circuits 18 and 28 respectively output gating control signals of Hi(1) for setting own pixels 11 and 21 to active pixels. In contrast, in a case where the pixel addresses indicated by the address data DEC do not include own pixel addresses (the pixels 11 and 21), the latch circuits 18 and 28 respectively output gating control signals of Lo(0) for setting own pixels 11 and 21 to inactive pixels. In a case where the pixels 11 and 21 are thereby set to active pixels, gating inversion signals of Lo(0) obtained by inversion by the inverters INV2 and INV4 are respectively supplied to the switch elements SW1 and SW2. In contrast, in a case where the pixels 11 and 21 are set to inactive pixels, gating inversion signals of Hi(1) are supplied to the switch elements SW1 and SW2. Accordingly, the switch elements SW1 and SW2 are turned off (disconnected) respectively in a case where the pixels 11 and 21 are set to active pixels, and are turned on (coupled) respectively in a case where the pixels 11 and 21 are set to inactive pixels. The inverters INV2 and INV4 each output a detection signal of Hi when a cathode voltage as an input signal is Lo, and output a detection signal of Lo when the cathode voltage is Hi. The inverters INV2 and INV4 are output sections that respectively output entry of photons into the APDs 12 and 22 as detection signals.

Next, an operation of each of the pixels 11 and 21 is described. FIG. 7 illustrates a graph illustrating changes in a cathode voltage VS and a detection signal PFout of each of the APDs 12 and 22 in accordance with entry of a photon. First, in a case where the pixels 11 and 21 are active pixels, the switch elements SW1 and SW2 are respectively set to be turned off, as described above.

The power supply voltage Ve is supplied to the cathodes of the APDs 12 and 22, and the power supply voltages Va and Vb are respectively supplied to anodes of the APDs 12 and 22, which causes a reverse voltage larger than a breakdown voltage VBD to be applied to the APDs 12 and 22, thereby setting the APDs 12 and 22 to a Geiger mode. In this state, the cathode voltages VS of the APDs 12 and 22 are, for example, the same as the power supply voltage Ve, as illustrated at a time t0 in FIG. 7.

In a case where photons enter the APDs 12 and 22 that are set to the Geiger mode, avalanche multiplication occurs, and currents pass through the APDs 12 and 22.

In a case where avalanche multiplication occurs and the currents pass through the APDs 12 and 22 at a time t1 in FIG. 7, from the time t1 onward, the currents also pass through the transistors Tr1 and Tr2 respectively by passage of the currents through the APDs 12 and 22, and a voltage drop occurs by resistor components of the transistors Tr1 and Tr2.

At a time t2, in a case where the cathode voltage VS of each of the APDs 12 and 22 becomes lower than 0 V, an anode-cathode voltage of each of the APDs 12 and 22 becomes lower than the breakdown voltage VBD, which stops avalanche amplification. Here, a quenching operation is an operation in which a voltage drop occurs by passage of a current generated by avalanche amplification through each of the transistors Tr1 and Tr2, and the cathode voltage VS becomes lower than the breakdown voltage VBD in association with the occurrence of the voltage drop, thereby stopping avalanche amplification.

When avalanche amplification is stopped, the current passing through a resistor of each of the transistors Tr1 and Tr2 is gradually decreased, and at a time t4, the cathode voltage VS returns to the original power supply voltage Ve again, and a next new photon becomes detectable (a recharge operation).

The inverters INV2 and INV4 each output the detection signal PFout of Lo when the cathode voltage VS that is an input voltage is equal to or higher than a predetermined threshold voltage Vth, and each output the detection signal PFout of Hi when the cathode voltage VS is lower than the predetermined threshold voltage Vth. Accordingly, in a case where a photon enter each of the APDs 12 and 22 to cause occurrence of avalanche multiplication, thereby decreasing the cathode voltage VS to lower than the threshold voltage Vth, the detection signal PFout is inverted from a low level to a high level. In contrast, in a case where avalanche multiplication of each of the APDs 12 and 22 converges, thereby increasing the cathode voltage VS to the threshold voltage Vth or higher, the detection signal PFout is inverted from the high level to the low level.

It is to be noted that in a case where the pixels 11 and 21 are inactive pixels, the gating inversion signals of Hi(1) are supplied to the switch elements SW1 and SW2 to turn on the switch elements SW1 and SW2. In a case where the switch elements SW1 and SW2 are turned on, the cathode voltages VS of the APDs 12 and 22 become 0 V. As a result, the anode-cathode voltages of the APDs 12 and 22 become equal to or lower than the breakdown voltage VBD; therefore, even if photons enter the APDs 12 and 22, the pixels 11 and 21 do not react.

The pixel driving section 31 includes, for example, a shift register, an address decoder, and the like, and drives the pixels 11 row by row, for example. A detection signal outputted from each of the pixels 11 in a pixel row selected and scanned by the pixel driving section 31 is supplied to the MUX 32 through each signal line DTL. The pixel driving section 35 includes, for example, a shift register, an address decoder, and the like, and drives the respective pixels 21 row by row, for example. A detection signal outputted from each of the pixels 21 in a pixel row selected and scanned by the pixel driving section 35 is supplied to the MUX 36 through each signal line DTL.

The MUXs 32 and 36 select outputs from active pixels in accordance with switching between active pixels and inactive pixels in the pixel arrays 10A and 20A. Then, the MUXs 32 and 36 respectively output pixel signals inputted from selected active pixels to the signal processors 33 and 37.

The signal processors 33 and 37 are each, for example, a time measurement section. The time measurement section generates a count value corresponding to a time from emission of light by a light source (to be described later) to reception of the light by the active pixel, on the basis of a pixel signal of the active pixel supplied from the MUX 32 or 36 and a light-emitting timing signal indicating a light-emitting timing of the light source. The time measurement section is also referred to as a TDC (Time to Digital Converter). The light-emitting timing signal is supplied from the outside through the input/output section 34 or 38.

It is to be noted that the signal processors 33 and 37 may each be a counter section. The counter section counts the number of detection signals inputted from the MUX 32 or 36 in a predetermined period, for example, and outputs a thus-obtained count value for each pixel.

The power supply section 41 is coupled to the power supply lines PWL1 coupled to the pixels 11, and applies a negative bias voltage (the power supply voltage Va) to each of the power supply lines PWL1 coupled to the pixels 11. The power supply section 41 is further coupled to the power supply lines PWL2 coupled to the pixels 11, and applies a predetermined voltage (the power supply voltage Ve) to each of the power supply lines PWL2 coupled to the pixels 11. The power supply section 42 is coupled to the power supply lines PWL1 coupled to the pixels 21, and applies a negative bias voltage (the power supply voltage Vb) to each of the power supply lines PWL1 coupled to the pixels 21. The power supply section 42 is further coupled to the power supply lines PWL2 coupled to the pixels 21, and applies a predetermined voltage (the power supply voltage Ve) to each of the power supply lines PWL2 coupled to the pixels 21. The power supply voltage Va preferably has a value that maximizes PDE of the APD 12. The power supply voltage Vb preferably has a value that maximizes PDE of the APD 22.

The input/output section 34 selects, in accordance with control by the controller 39, whether or not to output the output signal D1 outputted from the signal processor 33 as the output signal Dout. The input/output section 38 selects, in accordance with control by the controller 39, whether or not to output the output signal D2 outputted from the signal processor 37 as the output signal Dout. The input/output section 34 selects, in accordance with a temperature of the thermometer 40, whether or not to output the output signal D1 outputted from the signal processor 33 as the output signal Dout. The input/output section 38 selects, in accordance with the temperature of the thermometer 40, whether or not to output the output signal D2 outputted from the signal processor 37 as the output signal Dout. In a case where the signal processors 33 and 37 are time measurement sections, the input/output sections 34 and 38 respectively supply the light-emitting timing signals supplied from the controller 39 to the pixel driving sections 31 and 35 and the signal processors 33 and 37.

The controller 39 receives a clock and the like supplied from the outside, and outputs data such as inside information of the light-receiving device 1. The controller 39 further includes a timing generator that generates various types of timing signals, and controls driving of the pixel driving sections 31 and 35, the MUXs 32 and 36, the signal processors 33 and 37, the input/output sections 34 and 38, the power supply sections 41 and 42, and the like on the basis of the various types of timing signals generated by the timing generator. The controller 39 controls an output from the logic circuit 30. In the present embodiment, the controller 39 causes the logic circuit 30 to output one of the output signal D1 and the output signal D2 as the output signal Dout. The controller 39 may control the logic circuit 30 in accordance with the temperature of the thermometer 40 to drive only the pixel driving section 31, the MUX 32, the signal processor 33, and the input/output section 34, or the pixel driving section 35, the MUX 36, the signal processor 37, and the input/output section 38. The controller 39 may control the power supply sections 41 and 42 in accordance with the temperature of the thermometer 40 to apply a negative bias voltage to one of each APD 12 and each APD 22.

FIG. 8 illustrates a cross-sectional configuration example of each of the pixels 11 of the low-temperature light-receiving section 10. The low-temperature light-receiving section 10 includes, for example, an n-type semiconductor region 12a and a p-type semiconductor region 12b. The p-type semiconductor region 12b is formed in contact with a bottom of the n-type semiconductor region 12a. The n-type semiconductor region 12a and the p-type semiconductor region 12b are formed in a well layer 12c. The well layer 12c may be an n-type semiconductor layer or a p-type semiconductor layer. The well layer 12c is preferably an n-type semiconductor layer or a p-type semiconductor layer having a low impurity concentration of $1 \times 10^{14}$ cm$^{-3}$ or less, for example. In this case, the well layer 12c is easily depleted, which makes it possible to achieve an improvement in PDE of the APD 12.

The n-type semiconductor region 12a includes, for example, Si (silicon), and is an n-type semiconductor region having a high impurity concentration. The p-type semiconductor region 12b includes, for example, Si (silicon), and is a p-type semiconductor region having a high impurity concentration. The p-type semiconductor region 12b forms a pn junction at an interface with the n-type semiconductor region 12a. A region including the pn junction is a high electric field region, and the n-type semiconductor region 12a is a photoelectric conversion region. The p-type semiconductor region 12b includes a multiplying region in which a carrier generated by entry of detected light is subjected to avalanche amplification. The p-type semiconductor region 12b is preferably depleted. In this case, it is possible to achieve an improvement in PDE of the APD 12. The n-type semiconductor region 12a functions as a cathode, and is coupled to a circuit through a contact 16. An anode 12d with respect to the cathode is provided in the same layer as the n-type semiconductor region 12a, and is formed between the n-type semiconductor region 12a and a separation region 13. The anode 12d is coupled to a circuit through a contact 17.

The separation region 13 for separating the APDs 12 is formed, and a hole (hole) accumulation region 12e is formed between the separation region 13 and the well layer 12c. The hole accumulation region 12e is formed below the anode 12d, and is formed in a state being electrically coupled to the anode 12d. In addition, the hole accumulation region 12e is formed between the well layer 12c and the separation region 13. Further, the hole accumulation region 12e is formed also in contact with a bottom of the well layer 12c. The hole accumulation region 12e is formed in a portion in contact with a different material. In an example illustrated in FIG. 8, the separation region 13 includes, for example, a silicon oxide film, and includes a material different from that of the well layer 12c. In this case, the hole accumulation region 12e is formed to suppress a dark current generated at an interface. It is possible to form the hole accumulation region 12e as a p-type semiconductor region, for example.

The separation region 13 is formed between two APDs 12 adjacent to each other to separate the APDs 12. That is, the separation region 13 is formed to form a multiplying region corresponding to each APD 12 on a one-on-one basis. The separation region 13 is formed in a two-dimensional grid pattern to completely surround the periphery of each APD 12. The separation region 13 is formed to penetrate from top surface side to bottom surface side of the well layer 12c in a stacking direction. It is to be noted that, for example, the separation region 13 may have a configuration penetrating only a portion and being inserted to some midpoint of a substrate, in addition to a configuration entirely penetrating the substrate from top surface side to bottom surface side.

FIG. 9 illustrates a planar configuration example of the low-temperature light-receiving section 10. FIG. 9 illustrates an example in which four APDs 12 are disposed in a 2×2 arrangement. As described above, the APDs 12 are separated from each other by the separation region 13 formed in a grid pattern. The anode 12d is formed inside the separation region 13. The n-type semiconductor region 12a is formed in a middle portion of the APD 12, and the well layer 12c is formed between the anode 12d and the n-type semiconductor region 12a. The n-type semiconductor region 12a has, for example, a square shape. The planar shape of the n-type semiconductor region 12a is not limited to a square shape, and may be a circular shape, for example. In a case where the n-type semiconductor region 12a has a square shape, it is possible to secure a wide area of the multiplying region, which makes it possible to improve PDE. In a case where the n-type semiconductor region 12a has a circular shape, it is possible to suppress concentration of an electric field in the APD 12 and to reduce unintended breakdown.

FIG. 10 illustrates a cross-sectional configuration example of each of the pixels 21 of the high-temperature light-receiving section 20. The high-temperature light-receiving section 20 includes, for example, an n-type semiconductor region 22a and a p-type semiconductor region 22b. The p-type semiconductor region 22b is formed in contact with a bottom of the n-type semiconductor region 22a. The n-type semiconductor region 22a and the p-type semiconductor region 22b are formed in a well layer 22c. The well layer 22c may be an n-type semiconductor layer or may be a p-type semiconductor layer. The well layer 22c is preferably an n-type semiconductor layer or a p-type semiconductor layer having a low impurity concentration of $1 \times 10^{14}$ cm$^{-3}$ or less, for example. In this case, the well layer 22c is easily depleted, and it is possible to achieve an improvement in PDE of the APD 22.

The n-type semiconductor region 22a includes, for example, Si (silicon), and is an n-type semiconductor region having a high impurity concentration. The p-type semiconductor region 22b includes, for example, Si (silicon), and is a p-type semiconductor region having a high impurity concentration. The p-type semiconductor region 22b forms a pn junction at an interface with the n-type semiconductor region 22a. A region including the pn junction is a high electric field region, and the n-type semiconductor region 22a is a photoelectric conversion region. The p-type semiconductor region 22b includes a multiplying region in which a carrier generated by entry of detected light is subjected to avalanche amplification. The p-type semiconductor region 22b is preferably depleted. In this case, it is possible to achieve an improvement in PDE of the APD 22. The n-type semiconductor region 22a functions as a cathode, and is coupled to a circuit through a contact 26. An anode 22d with respect to the cathode is provided in the same layer as the n-type semiconductor region 22a, and is formed between the n-type semiconductor region 22a and a separation region 23. The anode 22d is coupled to a circuit through a contact 27.

The separation region 23 for separating the APDs 22 is formed, and a hole (hole) accumulation region 22e is formed between the separation region 23 and the well layer 22c. The hole accumulation region 22e is formed below the anode 22d, and is formed in a state being electrically coupled to the anode 22d. In addition, the hole accumulation region 22e is formed between the well layer 22c and the separation region 23. Further, the hole accumulation region 22e is formed also in contact with a bottom of the well layer 22c. The hole accumulation region 22e is formed in a portion in contact with a different material. In an example illustrated in FIG. 10, the separation region 23 includes, for example, a silicon oxide film, and includes a material different from that of the well layer 22c. In this case, the hole accumulation region 12e is formed to suppress a dark current generated at an interface. It is possible to form the hole accumulation region 22e as a p-type semiconductor region, for example.

The separation region 23 is formed between two APDs 22 adjacent to each other to separate the APDs 22. That is, the separation region 23 is formed to from a multiplying region corresponding to each APD 22 on a one-on-one basis. The separation region 23 is formed in a two-dimensional grid pattern to completely surround the periphery of each APD 22. The separation region 23 is formed to penetrate from top surface side to bottom surface side of the well layer 22c in a stacking direction. It is to be noted that, for example, the separation region 23 may have a configuration penetrating only a portion and being inserted to some midpoint of a substrate, in addition to a configuration entirely penetrating the substrate from top surface side to bottom surface side.

FIG. 11 illustrates a planar configuration example of the low-temperature light-receiving section 20. FIG. 11 illustrates an example in which four APDs 22 are disposed in a 2×2 arrangement. As described above, the APDs 22 are separated from each other by the separation region 23 formed in a grid pattern. The anode 22d is formed inside the separation region 23. The n-type semiconductor region 22a is formed in a middle portion of the APD 22, and the well layer 22c is formed between the anode 22d and the n-type semiconductor region 22a. The n-type semiconductor region 22a has a square shape. The planar shape of the n-type semiconductor region 22a is not limited to a square shape, and may be a circular shape, for example. In a case where the n-type semiconductor region 22a has a square shape, it is possible to secure a wide area of the multiplying region, which makes it possible to improve PDE. In a case where the n-type semiconductor region 22a has a circular shape, it is possible to suppress concentration of an electric field in the APD 22 and to reduce unintended breakdown.

FIG. 12 illustrates an example of temperature dependence of PDE in the APDs 12 and 22. The APD 12 has high PDE in a low-temperature range. Meanwhile, the APD 22 has high PDE in a high-temperature range. In the APD 12, a temperature region having high PDE is distributed relatively on low temperature side. In the APD 22, a temperature region having high PDE is distributed relatively on high temperature side.

The temperature region having high PDE of the APD 12 and the temperature region having high PDE of the APD 22 are different from each other. Further, a portion of the temperature region having high PDE of the APD 12 and a portion of the temperature region having high PDE of the APD 22 overlap each other. The "temperature region having high PDE" indicates a temperature region having a value higher than a half of a peak value in a temperature distribution of PDE. As illustrated in FIG. 12, in an overlap region OL having high PDE in the APDs 12 and 22, a region on high temperature side of the temperature region having high PDE of the APD 12 and a region on low temperature side of the temperature region having high PDE of the APD 22 overlap each other.

The APD 12 and the APD 22 are different from each other, for example, in at least one of impurity concentrations included in the multiplying regions (the p-type semiconductor regions 12d and 22d), types of impurities included in the multiplying regions (the p-type semiconductor regions 12d and 22d), thicknesses of the multiplying regions (the p-type semiconductor regions 12d and 22d), and areas of the multiplying region (the p-type semiconductor regions 12d and 22d). Accordingly, the temperature region having high PDE of the APD 12 and the temperature region having high PDE of the APD 22 are different from each other.

[Operation]

Next, description is given of a procedure of switching the low-temperature light-receiving section 10 and the high-temperature light-receiving section 20 (the output signals D1 and D2).

FIG. 13 illustrates an example of the procedure of switching the low-temperature light-receiving section 10 and the high-temperature light-receiving section 20 (the output signals D1 and D2). The controller 39 determines whether or not the temperature of the thermometer 40 is equal to or higher than a predetermined temperature (a threshold value Tth) in the overlap region OL (step S101). In a case where the temperature of the thermometer 40 is equal to or higher than the threshold value Tth, the controller 39 stops the operation of the low-temperature light-receiving section 10, for example, by stopping operations of the pixel driving section 31, the MUX 32, the signal processor 33, and the input/output section 34, and drives the high-temperature light-receiving section 20, for example, by operating the pixel driving section 35, the MUX 36, the signal processor 37, and the input/output section 38 (step S102). On this occasion, the controller 39 may control the power supply sections 41 and 42 to apply a negative bias voltage to only each of the APDs 22. As a result, the output signal D1 is not outputted from the low-temperature light-receiving section 10, and the output signal D2 is outputted from the high-temperature light-receiving section 20. On this occasion, the controller 39 causes the logic circuit 30 to output the output signal D2 as the output signal Dout (step S103).

In the step S101, in a case where the temperature of the thermometer 40 is lower than the threshold value Tth, the controller 39 drives the low-temperature light-receiving section 10, for example, by operating the pixel driving section 31, the MUX 32, the signal processor 33, and the input/output section 34, and stops the operation of the high-temperature light-receiving section 20, for example, by stopping operations of the pixel driving section 35, the MUX 36, the signal processor 37, and the input/output section 38 (step S104). On this occasion, the controller 39 may control the power supply sections 41 and 42 to apply a negative bias voltage to only each of the APDs 12. As a result, the output signal D1 is outputted from the low-temperature light-receiving section 10, and the output signal D2 is not outputted from the high-temperature light-receiving section 20. On this occasion, the controller 39 causes the logic circuit 30 to output the output signal D1 as the output signal Dout (step S105).

The controller 39 executes the steps S101 to S105 described above unless an instruction is given to end measurement by the light-receiving device 1 (step S106). In a case where the instruction is given to end measurement by the light-receiving device 1, the controller 39 stops the operations of the low-temperature light-receiving section 10 and the high-temperature light-receiving section 20, for example, by stopping the operation of the logic circuit 30 (step S107).

It is to be noted that, for example, as illustrated in FIG. 14, in a case where threshold values Tth1 and Tth2 are respectively set as a lower limit and an upper limit of the overlap region OL, the controller 39 may execute the following switching procedure.

FIG. 15 illustrates an example of a procedure of switching the low-temperature light-receiving section 10 and the high-temperature light-receiving section 20 (the output signal D1 and the output signal D2). The controller 39 determines whether or not the temperature of the thermometer 40 is equal to or higher than an upper limit temperature (the threshold value Tth2) of the overlap region OL (step S201). In a case where the temperature of the thermometer 40 is equal to or higher than the threshold value Tth2, the controller 39 stops the operation of the low-temperature light-receiving section 10, for example, by stopping the operations of the pixel driving section 31, the MUX 32, the signal processor 33, and the input/output section 34, and drives the high-temperature light-receiving section 20, for example, by operating the pixel driving section 35, the MUX 36, the signal processor 37, and the input/output section 38 (step S202). On this occasion, the controller 39 may control the power supply sections 41 and 42 to apply a negative bias voltage to only each of the APDs 22. As a result, the output signal D1 is not outputted from the low-temperature light-receiving section 10, and the output signal D2 is outputted from the high-temperature light-receiving section 20. On this occasion, the controller 39 causes the logic circuit 30 to output the output signal D2 as the output signal Dout (step S203).

In the step S201, in a case where the temperature of the thermometer 40 is lower than the threshold value Tth2, the controller 39 determines whether or not the temperature of the thermometer 40 is equal to or lower than a lower limit temperature (the threshold value Tth1) of the overlap region OL (step S204). In a case where the temperature of the thermometer 40 is equal to or lower than the threshold value Tth1, the controller 39 drives the low-temperature light-receiving section 10, for example, by operating the pixel driving section 31, the MUX 32, the signal processor 33, and the input/output section 34, and stops the operation of the high-temperature light-receiving section 20, for example, by stopping the operations of the pixel driving section 35, the MUX 36, the signal processor 37, and the input/output section 38 (step S205). On this occasion, the controller 39 may control the power supply sections 41 and 42 to apply a negative bias voltage to only each of the APDs 12. As a result, the output signal D1 is outputted from the low-temperature light-receiving section 10, and the output signal D2 is not outputted from the high-temperature light-receiving section 20. On this occasion, the controller 39 causes the logic circuit 30 to output the output signal D1 as the output signal Dout (step S206).

In the step S204, in a case where the temperature of the thermometer 40 is higher than the threshold value Tth1, the controller 39 drives the low-temperature light-receiving section 10, for example, by operating the pixel driving section 31, the MUX 32, the signal processor 33, and the input/output section 34, and drives the high-temperature light-receiving section 20, for example, by operating the pixel driving section 35, the MUX 36, the signal processor 37, and the input/output section 38 (step S207). On this occasion, the controller 39 controls the power supply sections 41 and 42 to apply negative bias voltages to each of the APDs 12 and each of the APDs 22. As a result, the output signal D1 is outputted from the low-temperature light-receiving section 10, and the output signal D2 is outputted from the high-temperature light-receiving section 20. On this occasion, the controller 39 causes the logic circuit 30 to output, as the output signal Dout, a signal obtained by adding the output signal D1 and the output signal D2 together (step S208).

The controller 39 executes the steps S201 to S208 described above unless an instruction is given to end measurement by the light-receiving device 1 (step S209). In a case where the instruction is given to end measurement by the light-receiving device 1, the controller 39 stops the operations of the low-temperature light-receiving section 10 and the high-temperature light-receiving section 20, for example, by stopping the operation of the logic circuit 30 (step S210). On this occasion, the controller 39 controls the power supply sections 41 and 42 not to apply negative bias voltages to each of the APDs 12 and each of the APDs 22, for example.

It is to be noted that the controller 39 may constantly drive the low-temperature light-receiving section 10 and the high-temperature light-receiving section 20 regardless of the temperature of the thermometer 40, and cause the logic circuit 30 to output, as the output signal Dout, a signal obtained by adding the output signal D1 and the output signal D2 together.

[Effects]

Next, description is given of effects of the light-receiving device 1 according to the present embodiment.

Avalanche photodiodes (APD) include a Geiger mode APD that operates with a bias voltage higher than a breakdown voltage, and a linear mode APD that operates with a slightly high bias voltage near the breakdown voltage. The Geiger mode avalanche photodiode is also referred to as a single photon avalanche photodiode (SPAD). The SPAD is a device that is able to detect one photon at each pixel by multiplying a carrier generated by photoelectric conversion in a high electric field PN-junction region provided in each pixel.

Incidentally, in the SPAD, reading of electric charges at a low temperature is difficult due to temperature dependence of a breakdown voltage. In addition, at a high temperature, an avalanche probability associated with depletion of a multiplying region is decreased. That is, it is possible to ensure PDE only in a specific temperature range.

In contrast, in the present embodiment, a plurality of light-receiving elements provided in the respective pixels 11 and 21 include two types of light-receiving elements (the APDs 12 and 22) having temperature regions of PDE that are different from each other and partially overlap each other. Accordingly, for example, in reading of electric charges at a low temperature, of the two types of light-receiving elements, the APD 12 in which a temperature region having high photon detection efficiency is distributed relatively on low temperature side is used, and in reading of electric charges at a high temperature, of the two types of light-receiving elements, the APD 22 in which a temperature region having high photon detection efficiency is distributed relatively on high temperature side is used, thereby suppressing degradation in PDE at both the low temperature and the high temperature. As a result, it is possible to expand a range where PDE is ensured, as compared with a case where only one of the APD 12 and APD 22 is used.

In addition, in the present embodiment, in a case where the plurality of APDs 12 is formed in the semiconductor substrate of the chip 1A, and the plurality of APDs 22 is formed in the semiconductor substrate of the chip 1B, it is possible to manufacture the chip 1A and the chip 1B by different processes. This makes it possible to simplify manufacturing processes and improve yields, as compared with a case where the plurality of APDs 12 and the plurality of APDs 22 are formed in a common chip.

In addition, in the present embodiment, in a case where the plurality of APDs 12 and the plurality of APDs 22 are formed in a common semiconductor substrate, it is possible to form a narrow gap between the pixel array 10A in which the plurality of APDs 12 is formed and the pixel array 20A in which the plurality of APDs 22 is formed, as compared with a case where the plurality of APDs 12 and the plurality of APDs 22 are formed in different semiconductor substrates. This makes it possible to bring an optical axis of the pixel array 10A and an optical axis of the pixel array 20A close to each other, which facilitates design of an optical system that guides incident light to the pixel array 10A and the pixel array 20A.

In addition, in the present embodiment, the power supply sections 41 and 42 are provided that respectively apply negative bias voltages to the APDs 12 and 22. This makes it possible to improve PDE of each of the APDs 12 and 22.

In addition, in the present embodiment, in a case where the power supply sections 41 and 42 are controlled in accordance with the temperature of the thermometer 40 to apply a negative bias voltage to only one of each APD 12 and each APD 22, it is possible to reduce power consumption, as compared with a case where negative bias voltages are applied to each APD 12 and each APD 22.

In addition, in the present embodiment, in a case where the power supply sections 41 and 42 are controlled in accordance with the temperature of the thermometer 40 to apply negative bias voltages to each APD 12 and each APD 22, it is possible to output, as the output signal Dout, a signal obtained by adding the output signal D1 and the output signal D2 together. As a result, it is possible to output a signal having a high signal level and a low S/N ratio, as compared with a case where only one of the output signal D1 and the output signal D2 is outputted as the output signal Dout.

In addition, in the present embodiment, in a case where the power supply sections 41 and 42 apply a common negative bias voltage to each APD 12 and each APD 22, the power supply sections 41 and 42 may be configured by one power supply section. In this case, it is possible to downsize the light-receiving device 1.

In addition, in the present embodiment, in a case where the power supply sections 41 and 42 respectively apply, to each APD 12 and each APD 22, negative bias voltages having values corresponding to each APD 12 and each APD 22, it is possible for the power supply sections 41 and 42 to respectively set the negative bias voltages at values that maximize PDE of each APD 12 and each APD 22. Accordingly, setting the negative bias voltages at the values that maximize PDE of each APD 12 and each APD 22 makes it possible to expand a range where PDE is ensured, as compared with a case where a negative bias voltage is common to each APD 12 and each APD 22.

2. Modification Examples of First Embodiment

Modification Example A

[Configuration]

In the embodiment described above, the light-receiving device 1 may further include, for example, a medium-temperature light-receiving section 50 as illustrated in FIG. 16. The medium-temperature light-receiving section 50 includes a pixel array 50A. The pixel array 50A includes a plurality of pixels 51. In the present modification example, the pixel arrays 10A, 20A, and 50A correspond to specific examples of a "pixel array" of the present disclosure. At least one of the pixel array 10A and the pixel array 20A, and the pixel array 50A are disposed adjacent to each other.

In the light-receiving device 1 according to the present modification example, three light-receiving sections (the low-temperature light-receiving section 10, the high-temperature light-receiving section 20, and a medium-temperature light-receiving section 50) may be formed in different chips (semiconductor substrates (e.g., silicon substrates)). In the light-receiving device 1 according to the present modification example, the three light-receiving sections (the low-temperature light-receiving section 10, the high-temperature light-receiving section 20, and the medium-temperature light-receiving section 50) may be formed in a common chip (a semiconductor substrate (e.g., a silicon substrate)), for example.

In the light-receiving device 1 according to the present modification example, the thermometer 40 measures temperatures of the three light-receiving sections (the low-temperature light-receiving section 10, the high-temperature light-receiving section 20, and the medium-temperature light-receiving section 50), and outputs measurement results to a logic circuit 60. In the present modification example, the logic circuit 60 is provided in place of the logic circuit 30. The logic circuit 60 further includes circuits for driving the plurality of pixels 51 in addition to components included in the logic circuit 30. The circuits for driving the plurality of pixels 51 include, for example, circuits common to the pixel driving section 31, the MUX 32, the signal processor 33, the input/output section 34, and the power supply section 41.

The medium-temperature light-receiving section 50 includes the plurality of pixels 51 two-dimensionally arranged, as described above. Each of the pixels 51 includes, for example, an APD (avalanche photodiode) 52, and a transistor that is electrically coupled to a node of the APD 52. The transistor is turned on in accordance with a control signal inputted to a gate thereof to output a detection signal generated by the APD 52 to the signal line DTL. The transistor includes, for example, a field effect thin film transistor (TFT).

In the light-receiving device 1 according to the present modification example, the controller 39 controls an output from the logic circuit 30. In the present modification example, the controller 39 causes the logic circuit 30 to output, as the output signal Dout, one of the output signal D1, the output signal D2, and an output signal D3. The output signal D3 is data corresponding to a detection signal outputted from each of the pixels 51 in a pixel row selected by a pixel driving section in the medium-temperature light-receiving section 50. The controller 39 may control the logic circuit 60 in accordance with the temperature of the thermometer 40 to drive only various types of circuits for driving one of the three light-receiving sections (the low-temperature light-receiving section 10, the high-temperature light-receiving section 20, and the medium-temperature light-receiving section 50). The controller 39 may control a power supply section in accordance with the temperature of the thermometer 40 to apply a negative bias voltage to only each APD included in one of the three light-receiving sections (the low-temperature light-receiving section 10, the high-temperature light-receiving section 20, and the medium-temperature light-receiving section 50).

FIG. 17 illustrates an example of temperature dependence of PDE in the APDs 12, 22, and 52. The APD 12 has high PDE in a low-temperature range. The APD 22 has high PDE in a high-temperature range. The APD 52 has high PDE in a medium temperature range. In the APD 12, a temperature region having high PDE is distributed relatively on low temperature side. In the APD 22, a temperature region having high PDE is distributed relatively on high temperature side. In the APD 52, a temperature region having high PDE is distributed relatively on medium temperature side.

The temperature region having high PDE of the APD 12, the temperature region having high PDE of the APD 22, and the temperature region having high PDE of the APD 52 are different from each other. Further, a portion of the temperature region having high PDE of the APD 12 and a portion of the temperature region having high PDE of the APD 52 overlap each other, and a portion of the temperature region having high PDE of the APD 52 and a portion of the temperature region having high PDE of the APD 22 overlap each other. As illustrated in FIG. 17, in an overlap region OL having high PDE in the APDs 12 and 52, a region on high temperature side of the temperature region having high PDE of the APD 12 and a region on low temperature side of the temperature region having high PDE of the APD 52 overlap each other. In addition, as illustrated in FIG. 17, in an overlap region OL having high PDE in the APDs 52 and 22, a region on high temperature side of the temperature region having high PDE of the APD 52 and a region on low temperature side of the temperature region having high PDE of the APD 22 overlap each other.

The APD 12, the APD 22, and the APD 52 are different from each other, for example, in at least one of impurity concentrations included in the multiplying regions, types of impurities included in the multiplying regions, thicknesses of the multiplying regions, and areas of the multiplying regions. Accordingly, the temperature region having high PDE of the APD 12, the temperature region having high PDE of the APD 22, and the temperature region having high PDE of the APD 52 are different from each other.

[Operation]

Next, description is given of a procedure of switching the low-temperature light-receiving section 10, the high-temperature light-receiving section 20, and the medium-temperature light-receiving section 50 (output signals D1, D2, and D3).

FIG. 18 illustrates an example of the procedure of switching the low-temperature light-receiving section 10, the high-temperature light-receiving section 20, and the medium-temperature light-receiving section 50 (the output signals D1, D2, and D3). The controller 39 determines whether or not the temperature of the thermometer 40 is equal to or higher than a predetermined temperature (a threshold value Tth4) in an overlap region OL2 (step S301). In a case where the temperature of the thermometer 40 is equal to or higher than the threshold value Tth4, the controller 39 stops the operations of the low-temperature light-receiving section 10 and the medium-temperature light-receiving section 50, for example, by stopping operations of various types of circuits that drive the low-temperature light-receiving section 10 and the medium-temperature light-receiving section 50. Further, the controller 39 drives the high-temperature light-receiving section 20, for example, by operating various types of circuits that drive the high-temperature light-receiving section 20 (step S302). On this occasion, the controller 39 may control the power supply section to apply a negative bias voltage to only each of the APDs 22. As a result, the output signals D1 and D3 are not outputted from the low-temperature light-receiving section 10 and the medium-temperature light-receiving section 50, and the output signal D2 is outputted from the high-temperature light-receiving section 20. On this occasion, the controller 39 causes the logic circuit 30 to output the output signal D3 as the output signal Dout (step S303).

In the step S301, in a case where the temperature of the thermometer 40 is lower than the threshold value Tth4, the controller 39 determines whether or not the temperature of the thermometer 40 is equal to or lower than a predetermined temperature (a threshold value Tth3) in an overlap region OL1 (step S304). In a case where the temperature of the thermometer 40 is equal to or lower than the threshold value Tth3, the controller 39 stops the operations of the medium-temperature light-receiving section 50 and the high-temperature light-receiving section 20, for example, by stopping operations of the various types of circuits that drive the medium-temperature light-receiving section 50 and the high-temperature light-receiving section 20. Further, the controller 39 drives the low-temperature light-receiving section 10, for example, by operating the various types of circuits that drive the low-temperature light-receiving section 10 (step S305). On this occasion, the controller 39 may control the power supply section to apply a negative bias voltage to only each of the APDs 12. As a result, the output signals D2 and D3 are not outputted from the medium-temperature light-receiving section 50 and the high-temperature light-receiving section 20, and the output signal D1 is outputted from the low-temperature light-receiving section 10. On this occasion, the controller 39 causes the logic circuit 30 to output the output signal D1 as the output signal Dout (step S306).

In the step S304, in a case where the temperature of the thermometer 40 is higher than the threshold value Tth3, the controller 39 stops the operations of the low-temperature light-receiving section 10 and the high-temperature light-receiving section 20, for example, by stopping the operations of the various types of circuits that drive the low-temperature light-receiving section 10 and the high-temperature light-receiving section 20. Further, the controller 39 drives the medium-temperature light-receiving section 50, for example, by operating the various types of circuits that drive the medium-temperature light-receiving section 50 (step S307). On this occasion, the controller 39 may control the power supply section to apply a negative bias voltage to only each of the APDs 52. As a result, the output signals D1 and D2 are not outputted from the low-temperature light-receiving section 10 and the high-temperature light-receiving section 20, and the output signal D3 is outputted from the medium-temperature light-receiving section 50. On this occasion, the controller 39 causes the logic circuit 30 to output the output signal D3 as the output signal Dout (step S308).

The controller 39 executes the steps S301 to S308 described above unless an instruction is given to end measurement by the light-receiving device 1 (step S309). In a case where the instruction is given to end measurement by the light-receiving device 1, the controller 39 stops the operations of the low-temperature light-receiving section 10, the medium-temperature light-receiving section 50, and the high-temperature light-receiving section 20, for example, by stopping the operation of the logic circuit 30 (step S310).

[Effects]

Next, description is given of effects of the light-receiving device 1 according to the present modification example. In the present modification example, a plurality of light-receiving elements provided in the respective pixels 11, 21, and 51 include three types of light-receiving elements (the APDs 12, 22, and 52) having temperature regions of PDE that are different from each other and partially overlap each other. Accordingly, for example, in reading of electric charges at a low temperature, of the three types of light-receiving elements, the APD 12 in which a temperature region having high photon detection efficiency is distributed relatively on low temperature side is used. In addition, in reading of electric charges at a medium temperature, of the three types of light-receiving elements, the APD 52 in which a temperature region having high photon detection efficiency is distributed relatively on medium temperature side is used. In addition, in reading of electric charges at a high temperature, of the three types of light-receiving elements, the APD 22 in which a temperature region having high photon detection efficiency is distributed relatively on high temperature side is used. This suppresses degradation in PDE at any of the low temperature, the medium temperature, and the high temperature. As a result, it is possible to expand a range where PDE is ensured, as compared with a case where only one of the APD 12, the APD 22, and the APD 52 is used.

3. Second Embodiment

[Configuration]

Next, description is given of a light-receiving device 2 according to a second embodiment of the present disclosure. FIG. 19 illustrates a schematic configuration example of the light-receiving device 2. The light-receiving device 2 includes, for example, one light-receiving section 70, a logic circuit 80, and the thermometer 40. The light-receiving section 70 includes a pixel array 70A. The pixel array 70A includes a plurality of pixels 71 and a plurality of pixels 72. The pixel array 70A corresponds to a specific example of a "pixel array" of the present disclosure. The logic circuit 80 outputs, to the outside, the output signal Dout generated on the basis of an output signal Dout' from the light-receiving section 70. The pixels 71 and 72 are described in detail later.

In the light-receiving device 2, the light-receiving section 70 is formed in, for example, a chip 2A different from a chip in which the logic circuit 80 and the thermometer 40 are provided, as illustrated in FIG. 20. The chip 2A includes, for example, a silicon substrate. The light-receiving section 70 is formed in the silicon substrate (a first semiconductor substrate) of the chip 2A.

In addition, in the light-receiving device 2, the logic circuit 80 is formed in, for example, a chip 2B different from the chip 2A, and the thermometer 40 is formed in, for example, a chip 2C different from the chips 2A and 2B. On this occasion, the chip 2A may be bonded onto the chip 2B, or the chips 2A, 2B, and 2C may be bonded onto a common support substrate. The chip 2C may be bonded to a back surface of the chip 2B.

It is to be noted that in the light-receiving device 2, the light-receiving section 70 and the logic circuit 80 may be formed in, for example, a common chip 2D, as illustrated in FIG. 21. On this occasion, the chip 2D includes, for example, a silicon substrate, and the light-receiving section 70 and the logic circuit 80 are formed in a common silicon substrate. In addition, in the light-receiving device 2, the light-receiving section 70, the logic circuit 80, and the thermometer 40 may be formed in, for example, a common chip 2E, as illustrated in FIG. 22. On this occasion, the chip 2E includes, for example, a silicon substrate, and the light-receiving section 70, the logic circuit 80, and the thermometer 40 are formed in a common silicon substrate.

The thermometer 40 measures a temperature of the light-receiving section 70, and outputs a measurement result to the logic circuit 80. In a case where the chip 2E includes a silicon substrate, the thermometer 40 includes, for example, a silicon diode temperature sensor. In a case where the thermometer 40 is formed in the chip 2C, the thermometer 40 may include a silicon diode temperature sensor, or may include any other temperature sensor.

FIG. 23 illustrates a schematic configuration example of the logic circuit 80. FIG. 24A illustrates a circuit configuration example of each of the pixels 71. FIG. 24B illustrates a circuit configuration example of each of the pixels 72. The logic circuit 80 includes, for example, a pixel driving section 81, a MUX 82, a signal processor 83, an input/output section 84, a controller 85, and a power supply section 86. The pixel driving section 81 drives each of the pixels 71 and 72 in the light-receiving section 70. The MUX 82, the signal processor 83, and the input/output section 84 process an output from the light-receiving section 70. Hereinafter, the output of the input/output section 84 is referred to as the output signal Dout. The power supply section 86 supplies a predetermined voltage (power supply voltages Vc and Ve) to each of the pixels 71 and 72.

The light-receiving section 70 includes the plurality of pixels 71 and the plurality of pixels 72 that are two-dimensionally arranged, as described above. The plurality of pixels 71 and the plurality of pixels 72 are alternately arranged in a row direction and a column direction in the pixel array 70A, for example.

Each of the pixels 71 includes, for example, an APD (avalanche photodiode) 73, and the transistor Tr1 that is electrically coupled to a node of the APD 73. The APD 73 corresponds to a specific example of a "first light-receiving element" of the present disclosure. The transistor Tr1 is turned on in accordance with a control signal inputted to the gate thereof to output a detection signal generated by the APD 73 to the signal line DTL. The transistor Tr1 includes, for example, a field effect thin film transistor (TFT).

Each of the pixels 72 includes, for example, an APD (avalanche photodiode) 74 and the transistor Tr2 that is electrically coupled to a node of the APD 74. The APD 74 corresponds to a specific example of a "second light-receiving element" of the present disclosure. The transistor Tr2 is turned on in accordance with a control signal inputted to the gate thereof to output a detection signal generated by the APD 74 to the signal line DTL. The transistor Tr2 includes, for example, a field effect thin film transistor (TFT).

Each of the APDs 73 and 74 is a photodiode (a single photon avalanche photodiode) that carries out avalanche amplification of electric charges generated when incident light is incident thereon and outputs a thus-obtained detection signal. The power supply voltage Vc to be supplied to an anode of each of the APDs 73 and 74 is, for example, a negative bias (a negative potential) of about −20 V. The power supply voltage Ve is supplied to cathodes of the APDs 73 and 74 respectively through sources/drains of the transistors Tr1 and Tr2. The power supply voltage Ve is, for example, a positive potential of about 3 V. The transistors Tr1 and Tr2 are constant current sources that operate in a saturation region, and each work as a quenching resistor to thereby perform passive quenching.

The light-receiving section 70 further includes the plurality of signal lines DTL and the plurality of gate lines GTL. The light-receiving section 70 further includes the plurality of power supply lines PWL1 and PWL2, and the ground line GND. The light-receiving section 70 further includes the switch element SW1, the inverters INV1 and INV2, and the latch circuit 18 in each of the pixels 71, and includes the switch element SW2, the inverters INV3 and INV4, and the latch circuit 28 in each of the pixels 72.

The signal lines DTL are wiring lines for reading out detection signals from the APDs 73 and 74. The gate lines GTL are wiring lines for inputting control signals that control ON/OFF of the transistors Tr1 and Tr2 to the gates of the transistors Tr1 and Tr2. The power supply lines PWL1 are wiring lines for determining anode potentials of the APDs 73 and 74. The power supply lines PWL2 are wiring lines for determining cathode potentials of the APDs 73 and 74. The gates of the transistors Tr1 and Tr2 are coupled to the gate lines GTL. The sources or the drains of the transistors Tr1 and Tr2 are respectively coupled to cathodes of the APDs 73 and 74 and the input terminals of the inverters INV1 and INV3. The output terminal of each of the inverters INV1 and INV3 is coupled to the signal lines DTL. An electrode not coupled to the cathode out of the source and the drain of each of the transistors Tr1 and Tr2 is coupled to the power supply lines PWL2. The cathodes of the APDs 73 and 74 are respectively coupled to the sources or the drains of the transistors Tr1 and Tr2, and the anodes of the APDs 73 and 74 are coupled to the power supply lines PWL1. The input terminals of the inverters INV2 and INV4 are respectively coupled to the latch circuits 18 and 28, and the output terminals of the inverters INV2 and INV4 are coupled to the ON/OFF control terminal of the switch element SW1. The switch element SW1 is coupled in parallel to the APD 73. The switch element SW2 is coupled in parallel to the APD 74.

The switch elements SW1 and SW2 are respectively turned on or off in accordance with, for example, gating inversion signals obtained by inverting gating control signals, which are outputs of the latch circuits 18 and 28, by the inverters INV2 and INV4. The latch circuits 18 and 28 respectively supply, to the inverters INV2 and INV4, the gating control signals that perform control to set the pixels 71 and 71 to active pixels or inactive pixels, on the basis of the trigger signal SET supplied from the pixel driving section 81 and the address data DEC. The inverters INV2 and INV4 generate the gating inversion signals obtained by inverting the gating control signals, and respectively supply the gating inversion signals to the switch elements SW1 and SW2.

The trigger signal SET is a timing signal indicating a timing of switching the gating control signal, and the address data DEC is data indicating the address of a pixel that is to be set to an active pixel among the plurality of pixels 71 and the plurality of pixels 72 arranged in a matrix in the pixel array 70A. The trigger signal SET and the address data DEC are supplied from the pixel driving section 81.

The latch circuits 18 and 28 each read out the address data DEC at a predetermined timing indicated by the trigger signal SET. Then, in a case where pixel addresses indicated by the address data DEC include own pixel addresses (the pixels 71 and 72), the latch circuits 18 and 28 respectively output gating control signals of Hi(1) for setting own pixels 71 and 72 to active pixels. In contrast, in a case where the pixel addresses indicated by the address data DEC do not include own pixel addresses (the pixels 71 and 72), the latch circuits 18 and 28 respectively output gating control signals of Lo(0) for setting own pixels 71 and 72 to inactive pixels. In a case where the pixels 71 and 72 are thereby set to active pixels, the gating inversion signals of Lo(0) obtained by inversion by the inverters INV2 and INV4 are respectively supplied to the switch elements SW1 and SW2. In contrast, in a case where the pixels 71 and 72 are set to inactive pixels, gating inversion signals of Hi(1) are supplied to the switch elements SW1 and SW2. Accordingly, the switch elements SW1 and SW2 are turned off (disconnected) respectively in a case where the pixels 71 and 72 are set to active pixels, and are turned on (coupled) respectively in a case where the pixels 71 and 72 are set to inactive pixels. The inverters INV2 and INV4 each output a detection signal of Hi when a cathode voltage as an input signal is Lo, and output a detection signal of Lo when the cathode voltage is Hi. The inverters INV2 and INV4 are output sections that respectively output entry of photons into the APDs 73 and 74 as detection signals.

Next, an operation of each of the pixels 71 and 72 is described. First, in a case where the pixels 71 and 72 are active pixels, the switch elements SW1 and SW2 are respectively set to be turned off, as described above.

The power supply voltage Ve is supplied to the cathodes of the APDs 73 and 74, and the power supply voltages Va and Vb are supplied to anodes of the APDs 73 and 74, which causes a reverse voltage larger than the breakdown voltage VBD to be applied to the APDs 73 and 74, thereby setting the APDs 73 and 74 to the Geiger mode. In this state, the cathode voltages VS of the APDs 73 and 74 are, for example, the same as the power supply voltage Ve as illustrated at the time t0 in FIG. 7.

In a case where photons enter the APDs 73 and 74 that are set to the Geiger mode, avalanche multiplication occurs, and currents pass through the APDs 73 and 74.

In a case where avalanche multiplication occurs and the currents pass through the APDs 73 and 74 at the time t1 in FIG. 7, from the time t1 onward, the currents also pass through the transistors Tr1 and Tr2 by passage of the currents through the APDs 73 and 74, and a voltage drop occurs by resistor components of the transistors Tr1 and Tr2.

At the time t2, in a case where the cathode voltage VS each of the APDs 73 and 74 becomes lower than 0 V, an anode-cathode voltage of each of the APDs 73 and 74 becomes lower than the breakdown voltage VBD, which stops avalanche amplification. Here, a quenching operation is an operation in which a voltage drop occurs by passage of a current generated by avalanche amplification through each of the transistors Tr1 and Tr2, and the cathode voltage VS becomes lower than the breakdown voltage VBD in association with the occurrence of the voltage drop, thereby stopping avalanche amplification.

When avalanche amplification is stopped, the current passing through a resistor of each of the transistors Tr1 and Tr2 is gradually decreased, and at the time t4, the cathode voltage VS returns to the original power supply voltage Ve again, and a next new photon becomes detectable (a recharge operation).

The inverters INV2 and INV4 each output the detection signal PFout of Lo when the cathode voltage VS that is an input voltage is equal to or higher than the predetermined threshold voltage Vth, and each output the detection signal PFout of Hi when the cathode voltage VS is lower than the predetermined threshold voltage Vth. Accordingly, in a case where a photon enters each of the APDs 73 and 74 to cause occurrence of avalanche multiplication, thereby decreasing the cathode voltage VS to lower than the threshold voltage Vth, the detection signal PFout is inverted from the low level to the high level. In contrast, in a case where avalanche multiplication of each of the APDs 73 and 74 converges, thereby increasing the cathode voltage VS to the threshold voltage Vth or higher, the detection signal PFout is inverted from the high level to the low level.

It is to be noted that in a case where the pixels 71 and 72 are inactive pixels, the gating inversion signals of Hi(1) are supplied to the switch elements SW1 and SW2 to turn on the switch elements SW1 and SW2. In a case where the switch elements SW1 and SW2 are turned on, the cathode voltages VS of the APDs 73 and 74 become 0 V. As a result, the anode-cathode voltages of the APDs 73 and 74 become equal to or lower than the breakdown voltage VBD; therefore, even if photons enter the APDs 73 and 74, the pixels 71 and 72 do not react.

The pixel driving section 81 includes, for example, a shift register, an address decoder, and the like, and drives the pixels 71 and 72 row by row, for example. A detection signal outputted from each of the pixels 71 and 72 in a pixel row selected and scanned by the pixel driving section 81 is supplied to the MUX 82 through each signal line DTL.

The MUX 82 selects an output from an active pixel in accordance with switching between an active pixel and an inactive pixel in the pixel array 70A. Then, the MUX 82 outputs a pixel signal inputted from the selected active pixel to the signal processor 83.

The signal processor 83 is, for example, a time measurement section. The time measurement section generates a count value corresponding to a time from emission of light by a light source (to be described later) to reception of the light by the active pixel, on the basis of a pixel signal of the active pixel supplied from the MUX 82 and a light-emitting timing signal indicating a light-emitting timing of the light source. The time measurement section is also referred to as a TDC (Time to Digital Converter). The light-emitting timing signal is supplied from the outside through the input/output section 84.

It is to be noted that the signal processor 83 may be a counter section. The counter section counts the number of detection signals inputted from the MUX 82 in a predetermined period, for example, and outputs a thus-obtained count value for each pixel.

The power supply section 86 is coupled to the power supply lines PWL1 coupled to the pixels 71 and 72, and applies a negative bias voltage (the power supply voltage Vc) to each of the power supply lines PWL1 coupled to the pixels 71 and 72. The power supply section 86 is further coupled to the power supply lines PWL2 coupled to the pixels 71 and 72, and applies a predetermined voltage (the power supply voltage Ve) to each of the power supply lines PWL2 coupled to the respective pixels 71 and 72. The power supply voltage Vc preferably has a value that maximizes PDE of both the APDs 73 and 74.

The input/output section 84 extracts, from the output signal Dout' outputted from the signal processor 83, one of the output signal D1 obtained from each of the pixels 71 and the output signal D2 obtained from each of the pixels 72 in accordance with control by the controller 85. The input/output section 84 outputs the signal obtained by extraction as the output signal Dout. The input/output section 84 selects one of the output signal D1 and the output signal D2 in accordance with the temperature of the thermometer 40. In a case where the signal processor 83 is a time measurement section, the input/output section 84 supplies the light-emitting timing signal supplied from the controller 85 to the pixel driving section 81 and the signal processor 83.

The controller 85 receives a clock and the like supplied from the outside, and outputs data such as inside information of the light-receiving device 2. The controller 85 further includes a timing generator that generates various types of timing signals, and controls driving of the pixel driving section 81, the MUX 82, the signal processor 83, the input/output section 84, the power supply section 86, and the like on the basis of the various types of timing signals generated by the timing generator. The controller 85 controls an output from the logic circuit 80. In the present embodiment, the controller 85 causes the input/output section 84 to output the output signal Dout including one of the output signal D1 and the output signal D2. The controller 85 instructs the input/output section 84 which one of the output signal D1 and the output signal D2 is to be selected, in accordance with the temperature of the thermometer 40.

FIG. 25 illustrates a cross-sectional configuration example of each of the pixels 71 for low temperature. Each of the pixels 71 includes, for example, an n-type semiconductor region 73a and a p-type semiconductor region 73b. The p-type semiconductor region 73b is formed in contact with a bottom of the n-type semiconductor region 73a. The n-type semiconductor region 73a and the p-type semiconductor region 73b are formed in a well layer 73c. The well layer 73c may be an n-type semiconductor layer or a p-type semiconductor layer. The well layer 73c is preferably an n-type semiconductor layer or a p-type semiconductor layer having a low impurity concentration of $1\times10^{14}$ cm$^{-3}$ or less, for example. In this case, the well layer 73c is easily depleted, which makes it possible to achieve an improvement in PDE of the APD 73.

The n-type semiconductor region 73a includes, for example, Si (silicon), and is an n-type semiconductor region having a high impurity concentration. The p-type semiconductor region 73b includes, for example, Si (silicon), and is a p-type semiconductor region having a high impurity concentration. The p-type semiconductor region 73b forms a pn junction at an interface with the n-type semiconductor region 73a. A region including the pn junction is a high electric field region, and the n-type semiconductor region 73a is a photoelectric conversion region. The p-type semiconductor region 73b includes a multiplying region in which a carrier generated by entry of detected light is subjected to avalanche amplification. The p-type semiconductor region 73b is preferably depleted. In this case, it is possible to achieve an improvement in PDE of the APD 73. The n-type semiconductor region 73a functions as a cathode, and is coupled to a circuit through a contact 78. An anode 73d with respect to the cathode is provided in the same layer as the n-type semiconductor region 73a, and is formed between the n-type semiconductor region 73a and a separation region 75. The anode 73d is coupled to a circuit through a contact 79.

The separation region 75 for separating two APDs 73 and 74 adjacent to each other is formed, and a hole (hole) accumulation region 73e is formed between the separation region 75 and the well layer 73c. The hole accumulation region 73e is formed below the anode 73d, and is formed in a state being electrically coupled to the anode 73d. In addition, the hole accumulation region 73e is formed between the well layer 73c and the separation region 75. Further, the hole accumulation region 73e is formed also in contact with a bottom of the well layer 73c. The hole accumulation region 73e is formed in a portion in contact with a different material. In an example illustrated in FIG. 25, the separation region 75 includes, for example, a silicon oxide film, and includes a material different from that of the well layer 73c. In this case, the hole accumulation region 73e is formed to suppress a dark current generated at an interface. It is possible to form the hole accumulation region 73e as a p-type semiconductor region, for example.

The separation region 75 is formed between two APDs 73 and 74 adjacent to each other to separate the APDs 73 and 74. That is, the separation region 75 is formed to form a multiplying region corresponding to each of the APDs 73 and 74 on a one-on-one basis. The separation region 75 is formed in a two-dimensional grid pattern to completely surround the periphery of each of the APDs 73 and 74. The separation region 75 is formed to penetrate from top surface side to bottom surface side of the well layer 73c in a stacking direction. It is to be noted that, for example, the separation region 75 may have a configuration penetrating only a portion and being inserted to some midpoint of a substrate, in addition to a configuration entirely penetrating the substrate from top surface side to bottom surface side.

FIG. 26 illustrates a cross-sectional configuration example of each of the pixels 72 for high temperature. Each of the pixels 72 includes, for example, an n-type semiconductor region 74a and a p-type semiconductor region 74b. The p-type semiconductor region 74b is formed in contact with a bottom of the n-type semiconductor region 74a. The n-type semiconductor region 74a and the p-type semiconductor region 74b are formed in a well layer 74c. The well layer 74c may be an n-type semiconductor layer or a p-type semiconductor layer. The well layer 74c is preferably an n-type semiconductor layer or a p-type semiconductor layer having a low impurity concentration of $1 \times 10^{14}$ cm$^{-3}$ or less, for example. In this case, the well layer 74c is easily depleted, which makes it possible to achieve an improvement in PDE of the APD 74.

The n-type semiconductor region 74a includes, for example, Si (silicon), and is an n-type semiconductor region having a high impurity concentration. The p-type semiconductor region 74b includes, for example, Si (silicon), and is a p-type semiconductor region having a high impurity concentration. The p-type semiconductor region 74b forms a pn junction at an interface with the n-type semiconductor region 74a. A region including the pn junction is a high electric field region, and the n-type semiconductor region 74a is a photoelectric conversion region. The p-type semiconductor region 74b includes a multiplying region in which a carrier generated by entry of detected light is subjected to avalanche amplification. The p-type semiconductor region 74b is preferably depleted. In this case, it is possible to achieve an improvement in PDE of the APD 74. The n-type semiconductor region 74a functions as a cathode, and is coupled to a circuit through a contact 78. An anode 74d with respect to the cathode is provided in the same layer as the n-type semiconductor region 74a, and is formed between the n-type semiconductor region 74a and a separation region 75. The anode 73d is coupled to a circuit through a contact 79.

The separation region 75 for separating two APDs 73 and 74 adjacent to each other is formed, and a hole (hole) accumulation region 74e is formed between the separation region 75 and the well layer 74c. The hole accumulation region 74e is formed below the anode 74d, and is formed in a state being electrically coupled to the anode 74d. In addition, the hole accumulation region 74e is formed between the well layer 74c and the separation region 75. Further, the hole accumulation region 74e is formed also in contact with a bottom of the well layer 74c. The hole accumulation region 74e is formed in a portion in contact with a different material. In an example illustrated in FIG. 26, the separation region 75 includes, for example, a silicon oxide film, and includes a material different from that of the well layer 74c. In this case, the hole accumulation region 74e is formed to suppress a dark current generated at an interface. It is possible to form the hole accumulation region 74e as a p-type semiconductor region, for example.

FIG. 27 illustrates a planar configuration example of the light-receiving section 70. FIG. 27 illustrates an example in which four APDs (two APDs 73 and two APDs 74) are disposed in a 2×2 arrangement. As described above, the APDs 73 and 74 are separated from each other by the separation region 75 formed in a grid pattern. The anodes 73d and 74d are formed inside the separation region 75. The n-type semiconductor regions 73a and 74a are respectively formed in middle portions of the APDs 73 and 74, and the well layers 73c and 74c are formed respectively between the anode 73d and the n-type semiconductor region 73a and between the anode 74d and the n-type semiconductor region 74a. The n-type semiconductor regions 73a and 74a have, for example, a square shape. The planar shape of each of the n-type semiconductor regions 73a and 74a is not limited to a square shape, and may be a circular shape, for example. In a case where the n-type semiconductor regions 73a and 74a have a square shape, it is possible to secure a wide area of the multiplying region, which makes it possible to improve PDE. In a case where the n-type semiconductor regions 73a and 74a have a circular shape, it is possible to suppress concentration of an electric field in the APDs 73 and 74 and to reduce unintended breakdown.

FIG. 28 illustrates an example of temperature dependence of PDE in the APDs 73 and 74. The APD 73 has high PDE in a low-temperature range. Meanwhile, the APD 74 has high PDE in a high-temperature range. In the APD 73, a temperature region having high PDE is distributed relatively on low temperature side. In the APD 74, a temperature region having high PDE is distributed relatively on high temperature side.

The temperature region having high PDE of the APD 73 and the temperature region having high PDE of the APD 74 are different from each other. Further, a portion of the temperature region having high PDE of the APD 73 and a portion of the temperature region having high PDE of the APD 74 overlap each other. The "temperature region having high PDE" indicates a temperature region having a value higher than a half of a peak value in a temperature distribution of PDE. As illustrated in FIG. 28, in an overlap region OL having high PDE in the APDs 73 and 74, a region on high temperature side of the temperature region having high PDE of the APD 73 and a region on low temperature side of the temperature region having high PDE of the APD 74 overlap each other.

The APD 73 and the APD 74 are different from each other, for example, in at least one of impurity concentrations included in the multiplying regions (the p-type semiconductor regions 73b and 74b), types of impurities included in the multiplying regions (the p-type semiconductor regions 73b and 74b), thicknesses of the multiplying regions (the p-type semiconductor regions 73b and 74b), and areas of the multiplying regions (the p-type semiconductor regions 73b and 74b). Accordingly, the temperature region having high PDE of the APD 73 and the temperature region having high PDE of the APD 74 are different from each other.

[Operation]

Next, description is given of a procedure of switching the output signals D1 and D2.

FIG. 29 illustrates an example of the procedure of switching the output signals D1 and D2. The controller 85 determines whether or not the temperature of the thermometer 40 is equal to or higher than a predetermined temperature (the threshold value Tth) in the overlap region OL (step S401). In a case where the temperature of the thermometer 40 is equal to or higher than the threshold value Tth, the controller 85 outputs, to the input/output section 84, a control signal that gives an instruction to select the output signal D2. The input/output section 84 extracts the output signal D2 from the output signal Dout' outputted from the signal processor 83 on the basis of the control signal from the controller 85 (step S402). The input/output section 84 outputs the output signal D2 obtained by extraction as the output signal Dout (step S403).

In the step S401, in a case where the temperature of the thermometer 40 is lower than the threshold value Tth, the controller 85 outputs, to the input/output section 84, a control signal that gives an instruction to select the output signal D1. The input/output section 84 extracts the output signal D1 from the output signal Dout' outputted from the signal processor 83 on the basis of the control signal from the controller 85 (step S404). The input/output section 84 outputs the output signal D2 obtained by extraction as the output signal Dout (step S405).

The controller 85 executes the steps S401 to S405 described above unless an instruction is given to end measurement by the light-receiving device 2 (step S406). In a case where the instruction is given to end measurement by the light-receiving device 2, the controller 85 stops the operation of the light-receiving section 70, for example, by stopping the operation of the logic circuit 80 (step S407).

It is to be noted that, for example, as illustrated in FIG. 30, in a case where threshold values Tth1 and Tth2 are respectively set as a lower limit and an upper limit of the overlap region OL, the controller 85 may execute the following switching procedure.

FIG. 31 illustrates an example of a procedure of switching the output signal D1 and the output signal D2. The controller 85 determines whether or not the temperature of the thermometer 40 is equal to or higher than an upper limit temperature (the threshold value Tth2) of the overlap region OL (step S501). In a case where the temperature of the thermometer 40 is equal to or higher than the threshold value Tth2, the controller 85 outputs, to the input/output section 84, a control signal that gives an instruction to select the output signal D2. The input/output section 84 extracts the output signal D2 from the output signal Dout' outputted from the signal processor 83, on the basis of the control signal from the controller 85 (step S502). The input/output section 84 outputs the output signal D2 obtained by extraction as the output signal Dout (step S503).

In the step S501, in a case where the temperature of the thermometer 40 is lower than the threshold value Tth2, the controller 85 determines whether or not the temperature of the thermometer 40 is equal to or lower than the threshold value Tth1 (step S504). In a case where the temperature of the thermometer 40 is equal to or lower than the threshold value Tth1, the controller 85 outputs, to the input/output section 84, a control signal that gives an instruction to select the output signal D1. The input/output section 84 extracts the output signal D1 from the output signal Dout' outputted from the signal processor 83, on the basis of the control signal from the controller 85 (step S505). The input/output section 84 outputs the output signal D1 obtained by extraction as the output signal Dout (step S506).

In the step S504, in a case where the temperature of the thermometer 40 is higher than the threshold value Tth1, the controller 85 outputs, to the input/output section 84, a control signal that gives an instruction to select the output signals D1 and D2. The input/output section 84 extracts the output signals D1 and D2 from the output signal Dout' outputted from the signal processor 83, on the basis of the control signal from the controller 85 (step S507). The input/output section 84 outputs the output signals D1 and D2 obtained by extraction as the output signal Dout (step S508).

The controller 85 executes the steps S501 to S508 described above unless an instruction is given to end measurement by the light-receiving device 2 (step S509). In a case where the instruction is given to end measurement by the light-receiving device 2, the controller 85 stops the operation of the light-receiving section 70, for example, by stopping the operation of the logic circuit 80 (step S510). On this occasion, the controller 85 controls the power supply section 86 not to apply a negative bias voltage to each of the APDs 73 and 74, for example.

It is to be noted that the controller 85 may constantly drive the light-receiving section 70 regardless of the temperature of the thermometer 40, and cause the logic circuit 80 to output, as the output signal Dout, a signal including the output signals D1 and D2.

[Effects]

Next, description is given of effects of the light-receiving device 2 according to the present embodiment.

In the present embodiment, a plurality of light-receiving elements provided in the respective pixels 71 and 72 includes two types of light-receiving elements (APDs 73 and 73) having temperature regions of PDE that are different from each other and partially overlap each other. Accordingly, for example, in reading of electric charges at a low temperature, of the two types of light-receiving elements, the APD 73 in which a temperature region having high photon detection efficiency is distributed relatively on low temperature side is used, and in reading of electric charges at a high temperature, of the two types of light-receiving elements, the APD 74 in which a temperature region having high photon detection efficiency is distributed relatively on high temperature side is used, thereby suppressing degradation in PDE at both the low temperature and the high temperature. As a result, it is possible to expand a range where PDE is ensured, as compared with a case where only one of the APD 73 and APD 74 is used.

In addition, in the present embodiment, the plurality of APDs 73 and the plurality of APDs 74 are alternately arranged in the pixel array 70A. This makes it possible to reduce a distance between the APD 73 and the APD 74 located at common coordinates, as compared with the plurality of APDs 73 and the plurality of APD 74 are formed in different regions. As a result, it is possible to bring optical axes of the plurality of APDs 73 and optical axes of the plurality of APDs 74 close to each other, which facilitates design of an optical system that guides incident light to the pixel array 70A.

In addition, in the present embodiment, the power supply section 86 is provided that applies the negative bias voltage Vc to each of the APDs 73 and 74. This makes it possible to improve PDE of each of the APDs 73 and 74.

In addition, in the present embodiment, the power supply section 86 applies the common bias voltage Vc to the APDs 73 and 74. This makes it possible to downsize the light-receiving device 2, as compared with a case where negative bias voltages different from each other are applied to the APDs 73 and 74.

4. Third Embodiment

[Configuration]

Next, description is given of a light-receiving device 3 according to a third embodiment of the present disclosure. FIG. 32 illustrates a schematic configuration example of the light-receiving device 3. The light-receiving device 3 includes, for example, one light-receiving section 110, a logic circuit 120, and a thermometer 130. The light-receiving section 110 includes a pixel array 110A. The pixel array 110A includes a plurality of pixels Px. The pixel array 110A corresponds to a specific example of a "pixel array" of the present disclosure. The logic circuit 120 outputs, to the outside, the output signal Dout generated on the basis of an output from the light-receiving section 110. Each of the pixels Px includes a sub-pixel Pa for low temperature and a sub-pixel Pb for high temperature. The sub-pixels Pa and Pb are described in detail later.

In the light-receiving device 3, the light-receiving section 110 is formed in, for example, a chip 3A different from a chip in which the logic circuit 120 and the thermometer 130 are provided, as illustrated in FIG. 33. The chip 3A includes, for example, a silicon substrate. The light-receiving section 110 is formed in the silicon substrate (a semiconductor substrate) of the chip 3A.

In addition, in the light-receiving device 3, the logic circuit 120 is formed in, for example, a chip 3B different from the chip 3A, and the thermometer 130 is formed in, for example, a chip 3C different from the chips 3A and 3B. On this occasion, the chip 3A may be bonded onto the chip 3B, or the chips 3A, 3B, and 3C may be bonded onto a common support substrate. The chip 3C may be bonded to a back surface of the chip 3B.

It is to be noted that in the light-receiving device 3, the light-receiving section 110 and the logic circuit 120 may be formed in, for example, a common chip 3D, as illustrated in FIG. 34. On this occasion, the chip 32D includes, for example, a silicon substrate, and the light-receiving section 110 and the logic circuit 120 are formed in a common silicon substrate. In addition, in the light-receiving device 3, the light-receiving section 110, the logic circuit 120, and the thermometer 130 may be formed in, for example, a common chip 3E, as illustrated in FIG. 35. On this occasion, the chip 3E includes, for example, a silicon substrate, and the light-receiving section 110, the logic circuit 120, and the thermometer 130 are formed in a common silicon substrate.

The thermometer 130 measures a temperature of the light-receiving section 110, and outputs a measurement result to the logic circuit 120. In a case where the chip 3E includes a silicon substrate, the thermometer 130 includes, for example, a silicon diode temperature sensor. In a case where the thermometer 130 is formed in the chip 3C, the thermometer 130 may include a silicon diode temperature sensor, or may include any other temperature sensor.

FIG. 36 illustrates a schematic configuration example of the logic circuit 120. FIG. 37A illustrates a circuit configuration example of each of the pixels Pa. FIG. 37B illustrates a circuit configuration example of each of the pixels Pb. The logic circuit 120 includes, for example, a pixel driving section 121, a MUX 122, a signal processor 123, an input/output section 124, a controller 125, and a power supply section 126. The pixel driving section 121 drives each of the pixels Px in the light-receiving section 110. The MUX 122, the signal processor 123, and the input/output section 124 process an output from the light-receiving section 110. Hereinafter, the output of the input/output section 124 is referred to as the output signal Dout. The power supply section 126 supplies a predetermined voltage (power supply voltages Va, Vb, and Ve) to each of the pixels Px.

The light-receiving section 110 includes the sub-pixels Pa and Pb in each of the pixels Px, as described above.

The sub-pixel Pa includes, for example, an APD (avalanche photodiode) 111, and the transistor Tr1 that is electrically coupled to a node of the APD 111. The APD 111 corresponds to a specific example of a "first light-receiving element" of the present disclosure. The transistor Tr1 is turned on in accordance with a control signal inputted to the gate thereof to output a detection signal generated by the APD 111 to the signal line DTL. The transistor Tr1 includes, for example, a field effect thin film transistor (TFT).

The sub-pixel Pb includes, for example, an APD (avalanche photodiode) 112, and the transistor Tr2 that is electrically coupled to a node of the APD 112. The APD 112 corresponds to a specific example of a "second light-receiving element" of the present disclosure. The transistor Tr2 is turned on in accordance with a control signal inputted to the gate thereof to output a detection signal generated by the APD 112 to the signal line DTL. The transistor Tr2 includes, for example, a field effect thin film transistor (TFT).

Each of the APDs 111 and 112 is a photodiode (a single photon avalanche photodiode) that carries out avalanche amplification of electric charges generated when incident light is incident thereon and outputs a thus-obtained detection signal. The power supply voltage Va to be supplied to an anode of the APD 111 is, for example, a negative bias (a negative potential) of about −20 V. The power supply voltage Vb to be supplied to an anode of the APD 112 is, for example, a negative bias (a negative potential) of about −20 V. The power supply voltage Va and the power supply voltage Vb may be equal or different from each other. The power supply voltage Ve is supplied to cathodes of the APDs 111 and 112 respectively through sources/drains of the transistors Tr1 and Tr2. The power supply voltage Ve is, for example, a positive potential of about 3 V. The transistors Tr1 and Tr2 are constant current sources that operate in a saturation region, and each work as a quenching resistor to thereby perform passive quenching.

The light-receiving section 110 further includes the plurality of signal lines DTL and the plurality of gate lines GTL. The light-receiving section 110 further includes the plurality of power supply lines PWL1 and PWL2, and the ground line GND. The light-receiving section 110 further includes the switch element SW1, the inverters INV1 and INV2, and the latch circuit 18 in the sub-pixel Pa, and includes the switch element SW2, the inverters INV3 and INV4, and the latch circuit 28 in the sub-pixel Pb.

The signal lines DTL are wiring lines for reading out detection signals from the APDs 111 and 112. The gate lines GTL are wiring lines for inputting control signals that control ON/OFF of the transistors Tr1 and Tr2 to the gates of the transistors Tr1 and Tr2. The power supply lines PWL1 are wiring lines for determining anode potentials of the APDs 111 and 112. The power supply lines PWL2 are wiring lines for determining cathode potentials of the APDs 111 and 112. The gates of the transistors Tr1 and Tr2 are coupled to the gate lines GTL. The sources or the drains of the transistors Tr1 and Tr2 are respectively coupled to nodes of the APDs 111 and 112, and an electrode not coupled to the node out of the source and the drain of each of the transistors Tr1 and Tr2 is coupled to the signal line DTL. The nodes of the APDs 111 and 112 are respectively coupled to the sources or the drain of the transistors Tr1 and Tr2, and anodes of the APDs 111 and 112 are coupled to the power supply lines PWL1. The input terminals of the inverters INV2 and INV4 are respectively coupled to the latch circuits 18 and 28, and the output terminals of the inverters INV2 and INV4 are coupled to the ON/OFF control terminal of the switch element SW1. The switch element SW1 is coupled in parallel to the APDs 111 and 112.

The switch elements SW1 and SW2 are respectively turned on or off in accordance with, for example, gating inversion signals obtained by inverting gating control signals, which are outputs of the latch circuits 18 and 28, by the inverters INV2 and INV4. The latch circuits 18 and 28 respectively supply, to the inverters INV2 and INV4, the gating control signals that perform control to set the sub-pixels Pa and Pb to active pixels or inactive pixels, on the basis of the trigger signal SET supplied from the pixel driving section 121 and address data DEC. The inverters INV2 and INV4 generate gating inversion signals obtained by inverting the gating control signals, and respectively supply the gating inversion signals to the switch elements SW1 and SW2.

The trigger signal SET is a timing signal indicating a timing of switching the gating control signal, and the address data DEC is data indicating the address of a pixel that is to be set to an active pixel among the plurality of sub-pixels Pa and the plurality of sub-pixels Pb arranged in a matrix in the pixel array 110A. The trigger signal SET and the address data DEC are supplied from the pixel driving section 121.

The latch circuits 18 and 28 each read out the address data DEC at a predetermined timing indicated by the trigger signal SET. Then, in a case where pixel addresses indicated by the address data DEC include own pixel addresses (the sub-pixels Pa and Pb), the latch circuits 18 and 28 respectively output gating control signals of Hi(1) for setting own sub-pixels Pa and Pb to active pixels. In contrast, in a case where the pixel addresses indicated by the address data DEC do not include own pixel addresses (the sub-pixels Pa and Pb), the latch circuits 18 and 28 respectively output gating control signals of Lo(0) for setting own sub-pixels Pa and Pb to inactive pixels. In a case where the sub-pixels Pa and Pb are thereby set to active pixels, gating inversion signals of Lo(0) obtained by inversion by the inverters INV2 and INV4 are respectively supplied to the switch elements SW1 and SW2. In contrast, in a case where the sub-pixels Pa and Pb are set to inactive pixels, gating inversion signals of Hi(1) are supplied to the switch elements SW1 and SW2. Accordingly, the switch elements SW1 and SW2 are turned off (disconnected) in a case where the sub-pixels Pa and Pb are set to active pixels, and are turned on (coupled) in a case where the sub-pixels Pa and Pb are set to inactive pixels. The inverters INV2 and INV4 each output a detection signal of Hi when a cathode voltage as an input signal is Lo, and outputs a detection signal of Lo when the cathode voltage is Hi. The inverters INV2 and INV4 are output sections that respectively output entry of photons into the APDs 73 and 74 as detection signals.

Next, an operation of each of the sub-pixels Pa and Pb is described. First, in a case where the sub-pixels Pa and Pb are active pixels, the switch elements SW1 and SW2 are set to be turned off, as described above.

The power supply voltage Ve is supplied to the cathodes of the APDs 111 and 112, and the power supply voltages Va and Vb are respectively supplied to anodes of the APDs 111 and 112, which causes a reverse voltage larger than the breakdown voltage VBD to be applied to the APDs 111 and 112, thereby setting the APDs 111 and 112 to the Geiger mode. In this state, the cathode voltages VS of the APDs 111 and 112 are, for example, the same as the power supply voltage Ve, as illustrated at the time t0 in FIG. 7.

In a case where photons enter the APDs 111 and 112 that are set to the Geiger mode, avalanche multiplication occurs, and currents pass through the APDs 111 and 112.

In a case where avalanche multiplication occurs and the currents pass through the APDs 111 and 112 at the time t1 in FIG. 7, from the time t1 onward, the currents also pass through the transistors Tr1 and Tr2 by passage of currents through the APDs 111 and 112, and a voltage drop occurs by resistor components of the transistors Tr1 and Tr2.

At the time t2, in a case where the cathode voltage VS of each of the APDs 111 and 112 becomes lower than 0 V, an anode-cathode voltage of each of the APDs 111 and 112 becomes lower than the breakdown voltage VBD, which stops avalanche amplification. Here, a quenching operation is an operation in which a voltage drop occurs by passage of a current generated by avalanche amplification through each of the transistors Tr1 and Tr2, and the cathode voltage VS becomes lower than the breakdown voltage VBD in association with the occurrence of the voltage drop, thereby stopping avalanche amplification.

When avalanche amplification is stopped, the current passing through a resistor of each of the transistors Tr1 and Tr2 is gradually decreased, and at the time t4, the cathode voltage VS returns to the original power supply voltage Ve again, and a next new photon becomes detectable (a recharge operation).

The inverters INV2 and INV4 each output the detection signal PFout of Lo when the cathode voltage VS that is an input voltage is equal to or higher than the predetermined threshold voltage Vth, and each output the detection signal PFout of Hi when the cathode voltage VS is lower than the predetermined threshold voltage Vth. Accordingly, in a case where a photon enters each of the APDs 111 and 112 to cause occurrence of avalanche multiplication, thereby decreasing the cathode voltage VS to lower than the threshold voltage Vth, the detection signal PFout is inverted from the low level to the high level. In contrast, in a case where avalanche multiplication of each of the APDs 111 and 112 converges, thereby increasing the cathode voltage VS to the threshold voltage Vth or higher, the detection signal PFout is inverted from the high level to the low level.

It is to be noted that in a case where the sub-pixels Pa and Pb are inactive pixels, the gating inversion signals of Hi(1) are supplied to the switch elements SW1 and SW2 to turn on the switch elements SW1 and SW2. In a case where the switch elements SW1 and SW2 are turned on, the cathode voltages VS of the APDs 111 and 112 become 0 V. As a result, the anode-cathode voltages of the APDs 111 and 112 become equal to or lower than the breakdown voltage VBD; therefore, even if photons enter the APDs 111 and 112, the sub-pixels Pa and Pb do not react.

The pixel driving section 121 includes, for example, a shift register, an address decoder, and the like, and drives the sub-pixels Pa and Pb row by row, for example. A detection signal outputted from each of the sub-pixels Pa and Pb in a pixel row selected and scanned by the pixel driving section 121 is supplied to the MUX 122 through each signal line DTL.

The MUX 122 selects an output from an active pixel in accordance with switching between an active pixel and an inactive pixel in the pixel array 110A. Then, the MUX 122 outputs a pixel signal inputted from the selected active pixel to the signal processor 123.

The signal processor 123 is, for example, a time measurement section. The time measurement section generates a count value corresponding to a time from emission of light by a light source (to be described later) to reception of the light by the active pixel, on the basis of a pixel signal of the active pixel supplied from the MUX 122 and a light-emitting timing signal indicating a light-emitting timing of the light source. The time measurement section is also referred to as a TDC (Time to Digital Converter). The light-emitting timing signal is supplied from the outside through the input/output section 124.

It is to be noted that the signal processor 123 may be a counter section. The counter section counts the number of detection signals inputted from the MUX 122 in a predetermined period, for example, and outputs a thus-obtained count value for each pixel.

The power supply section 126 is coupled to the power supply lines PWL1 coupled to the sub-pixels Pa, and applies a negative bias voltage (the power supply voltage Va) to each of the power supply lines PWL1 coupled to the sub-pixels Pa. The power supply section 126 is further coupled to the power supply lines PWL2 coupled to the sub-pixels Pa, and applies a predetermined voltage (the power supply voltage Ve) to each of the power supply lines PWL2 coupled to the sub-pixels Pa. The power supply section 126 is coupled to the power supply lines PWL1 coupled to the sub-pixels Pb, and applies a negative bias voltage (the power supply voltage Vb) to each of the power supply lines PWL1 coupled to the sub-pixels Pb. The power supply section 126 is further coupled to the power supply lines PWL2 coupled to the sub-pixels Pb, and applies a predetermined voltage (the power supply voltage Ve) to each of the power supply lines PWL2 coupled to the sub-pixels Pb. The power supply voltage Va preferably has a value that maximizes PDE of the APD 111. The power supply voltage Vb preferably has a value that maximizes PDE of the APD 112.

The input/output section 124 extracts, from the output signal Dout' outputted from the signal processor 123, one of the output signal D1 obtained from each of the sub-pixels Pa and the output signal D2 obtained from each of the sub-pixels Pb in accordance with control by the controller 125. The input/output section 124 outputs the signal obtained by extraction as the output signal Dout. The input/output section 124 selects one of the output signal D1 and the output signal D2 in accordance with the temperature of the thermometer 130. In a case where the signal processor 123 is a time measurement section, the input/output section 124 supplies the light-emitting timing signal supplied from the controller 125 to the pixel driving section 121 and the signal processor 123.

The controller 125 receives a clock and the like supplied from the outside, and outputs data such as inside information of the light-receiving device 3. The controller 125 further includes a timing generator that generates various types of timing signals, and controls driving of the pixel driving section 121, the MUX 122, the signal processor 123, the input/output section 124, the power supply section 126, and the like on the basis of the various types of timing signals generated by the timing generator. The controller 125 controls the input/output section 124 to output the output signal Dout including one of the output signal D1 and the output signal D2 from the input/output section 124. The controller 125 instructs the input/output section 124 which one of the output signal D1 and the output signal D2 is to be selected, in accordance with the temperature of the thermometer 130.

FIG. 38 illustrates a cross-sectional configuration example of each of the pixels Px. Each of the pixels Px includes, for example, an n-type semiconductor region 113a and p-type semiconductor regions 113b and 113f. The p-type semiconductor regions 113b and 113f are formed in contact with a bottom of the n-type semiconductor region 113a. The p-type semiconductor region 113b belongs to the APD 111 of the sub-pixel Pa, and the p-type semiconductor region 113f belongs to the APD 112 of the sub-pixel Pb. The n-type semiconductor region 113a and the p-type semiconductor region 113b are formed in a well layer 113c belonging to the APD 111 of the sub-pixel Pa. The n-type semiconductor region 113a and the p-type semiconductor region 113f are formed in a well layer 113g belonging to the APD 112 of the sub-pixel Pb. The well layers 113c and 113g may be n-type semiconductor layers or p-type semiconductor layers. The well layers 113c and 113g are preferably n-type semiconductor layers or p-type semiconductor layers having a low impurity concentration of $1\times10^{14}$ cm$^{-3}$ or less, for example. In this case, the well layers 113c and 113g are easily depleted, which makes it possible to achieve an improvement in PDE of the APDs 111 and 112.

The n-type semiconductor region 113a includes, for example, Si (silicon), and is an n-type semiconductor region having a high impurity concentration. The p-type semiconductor regions 113b and 113f include, for example, Si (silicon), and are p-type semiconductor regions having a high impurity concentration. The p-type semiconductor regions 113b and 113f each form a pn junction at an interface with the n-type semiconductor region 113a. A region including the pn junction is a high electric field region, and the n-type semiconductor region 113a is a photoelectric conversion region. The p-type semiconductor regions 113b and 113f each include a multiplying region in which a carrier generated by entry of detected light is subjected to avalanche amplification. The p-type semiconductor regions 113b and 113f are preferably depleted. In this case, it is possible to achieve an improvement in PDE of the APDs 111 and 112. The n-type semiconductor region 113a functions as a cathode, and is coupled to a circuit through a contact 116a. An anode 113d belonging to the APD 111 of the sub-pixel Pa with respect to the cathode is provided in the same layer as the n-type semiconductor region 113a, and is formed between the n-type semiconductor region 113a and a separation region 114. The anode 113d is coupled to a circuit through a contact 116b. An anode 113h belonging to the APD 112 of the sub-pixel Pb with respect to the cathode is provided in the same layer as the n-type semiconductor region 113a, and is formed between the n-type semiconductor region 113a and the separation region 114. The anode 113h is coupled to a circuit through a contact 116c.

The separation region 114 for separating the pixels Px is formed. A hole (hole) accumulation region 113e is formed between the separation region 114 and the well layer 113c. A hole (hole) accumulation region 113i is formed between the separation region 114 and the well layer 113g. The hole accumulation region 113e is formed below the anode 113d, and is formed in a state of being electrically coupled to the anode 113d. The hole accumulation region 113i is formed below the anode 113h, and is formed in a state of being electrically coupled to the anode 113h. In addition, the hole accumulation region 113e is formed between the well layer 113c and the separation region 114. Further, the hole accumulation region 113e is formed also in contact with a bottom of the well layer 113c. In addition, the hole accumulation region 113i is formed between the well layer 113g and the separation region 114. Further, the hole accumulation region 113i is formed also in contact with a bottom of the well layer 113g. The hole accumulation regions 113e and 113i are formed in portions in contact with a different material. In an example illustrated in FIG. 38, the separation region 114 includes, for example, a silicon oxide film, and includes a material different from those of the well layers 113c and 113g. In this case, the hole accumulation regions 113e and 113i are formed to suppress a dark current generated at an interface. It is possible to form the hole accumulation regions 113e and 113i as p-type semiconductor regions, for example.

A separation region 115 for separating the sub-pixels Pa and Pb is further formed in each of the pixels Px. The separation region 115 is formed in contact with the bottom of the n-type semiconductor region 113a. The separation region 115 is formed between the p-type semiconductor region 113b, the well layer 113c, and the hole accumulation region 113e that belong to the APD 111 of the sub-pixel Pa, and the p-type semiconductor region 113f, the well layer 113g, and the hole accumulation region 113i that belong the APD 112 of the sub-pixel Pb. The separation region 115 separates the p-type semiconductor region 113b, the well layer 113c, and the hole accumulation region 113e that belong to the APD 111 of the sub-pixel Pa from the p-type semiconductor region 113f, the well layer 113g, and the hole accumulation region 113i that belong the APD 112 of the sub-pixel Pb.

The separation regions 114 and 115 are formed between the pixels Px, and separates the APDs 111 and 112. That is, the separation regions 114 and 115 are formed to form a multiplying region corresponding to each of the APDs 111 and 112 on a one-on-one basis. The separation regions 114 and 115 are formed in a two-dimensional grid pattern to surround the periphery of each of the APDs 111 and 112. The separation region 114 is formed to penetrate from top surface side to bottom surface side of the well layers 113c and 113g in a stacking direction. It is to be noted that, for example, the separation region 114 may have a configuration penetrating only a portion and being inserted to some midpoint of a substrate, in addition to a configuration entirely penetrating the substrate from top surface side to bottom surface side.

FIG. 39 illustrates a planar configuration example of the light-receiving section 110. FIG. 39 illustrates an example in which four pixels Px are disposed in a 2×2 arrangement. As described above, the APDs 111 and 112 are separated from each other by the separation regions 114 and 115 formed in a grid pattern. The anodes 113d and 113h are formed inside the separation regions 114 and 115. The n-type semiconductor region 113a is formed in a middle portion of each of the pixels Px, and the well layers 113c and 113g are formed respectively between the anode 113d and the n-type semiconductor region 113a and between the anode 113h and the n-type semiconductor region 113a. The n-type semiconductor region 113a has, for example, a square shape. The planar shape of the n-type semiconductor region 113a is not limited to a square shape, and may be a circular shape, for example. In a case where the n-type semiconductor region 113a has a square shape, it is possible to secure a wide area of the multiplying region, which makes it possible to improve PDE. In a case where the n-type semiconductor region 113a has a circular shape, it is possible to suppress concentration of an electric field in each of the APDs 111 and 112 and to reduce unintended breakdown.

FIG. 40 illustrates an example of temperature dependence of PDE in the APDs 111 and 112. The APD 111 has high PDE in a low-temperature range. Meanwhile, the APD 112 has high PDE in a high-temperature range. In the APD 111, a temperature region having high PDE is distributed relatively on low temperature side. In the APD 112, a temperature region having high PDE is distributed relatively on high temperature side.

The temperature region having high PDE of the APD 111 and the temperature region having high PDE of the APD 112 are different from each other. Further, a portion of the temperature region having high PDE of the APD 111 and a portion of the temperature region having high PDE of the APD 112 overlap each other. The "temperature region having high PDE" indicates a temperature region having a value higher than a half of a peak value in a temperature distribution of PDE. As illustrated in FIG. 40, in an overlap region OL having high PDE in the APDs 111 and 112, a region on high temperature side of the temperature region having high PDE and a region on low temperature side of the temperature region having high PDE of the APD 112 overlap each other.

The APD 111 and the APD 112 are different from each other, for example, in at least one of impurity concentrations included in the multiplying regions (the p-type semiconductor regions 113b and 113O, types of impurities included in the multiplying regions (the p-type semiconductor regions 113b and 113f), thicknesses of the multiplying regions (the p-type semiconductor regions 113b and 113O, and areas of the multiplying regions (the p-type semiconductor regions 113b and 113f). Accordingly, the temperature region having high PDE of the APD 111 and the temperature region having high PDE of the APD 112 are different from each other.

[Operation]

Next, description is given of a procedure of switching the output signals D1 and D2.

FIG. 41 illustrates an example of the procedure of switching the output signals D1 and D2. The controller 125 determines whether or not the temperature of the thermometer 130 is equal to or higher than a predetermined temperature (the threshold value Tth) in the overlap region OL (step S601). In a case where the temperature of the thermometer 130 is equal to or higher than the threshold value Tth, the controller 125 outputs, to the input/output section 124, a control signal that gives an instruction to select the output signal D2. The input/output section 124 extracts the output signal D2 from the output signal Dout' outputted from the signal processor 123 on the basis of the control signal from the controller 125 (step S602). The input/output section 124 outputs the output signal D2 obtained by extraction as the output signal Dout (step S603).

In the step S601, in a case where the temperature of the thermometer 130 is lower than the threshold value Tth, the controller 125 outputs, to the input/output section 124, a control signal that gives an instruction to select the output signal D1. The input/output section 124 extracts the output signal D1 from the output signal Dout' outputted from the signal processor 123 on the basis of the control signal from the controller 125 (step S604). The input/output section 124 outputs the output signal D2 obtained by extraction as the output signal Dout (step S605).

The controller 125 executes the steps S601 to S605 described above unless an instruction is given to end measurement by the light-receiving device 3 (step S606). In a case where the instruction is given to end measurement by the light-receiving device 3, the controller 125 stops the operation of the light-receiving section 110, for example, by stopping the operation of the logic circuit 120 (step S607).

It is to be noted that, for example, as illustrated in FIG. 42, in a case where threshold values Tth1 and Tth2 are set as a lower limit and an upper limit of the overlap region OL, the controller 125 may execute the following switching procedure.

FIG. 43 illustrates an example of a procedure of switching the output signal D1 and the output signal D2. The controller 125 determines whether or not the temperature of the thermometer 130 is equal to or higher than an upper limit temperature (the threshold value Tth2) of the overlap region OL (step S701). In a case where the temperature of the thermometer 130 is equal to or higher than the threshold value Tth2, the controller 125 outputs, to the input/output section 124, a control signal that gives an instruction to select the output signal D2. The input/output section 124 extracts the output signal D2 from the output signal Dout' outputted from the signal processor 123, on the basis of the control signal from the controller 125 (step S702). The input/output section 124 outputs the output signal D2 obtained by extraction as the output signal Dout (step S703).

In the step S701, in a case where the temperature of the thermometer 130 is lower than the threshold value Tth2, the controller 125 determines whether or not the temperature of the thermometer 130 is equal to or lower than the threshold value Tth1 (step S704). In a case where the temperature of the thermometer 130 is equal to or lower than the threshold value Tth1, the controller 125 outputs, to the input/output section 124, a control signal that gives an instruction to select the output signal D1. The input/output section 124 extracts the output signal D1 from the output signal Dout' outputted from the signal processor 123, on the basis of the control signal from the controller 125 (step S705). The input/output section 124 outputs the output signal D1 obtained by extraction as the output signal Dout (step S706).

In the step S704, in a case where the temperature of the thermometer 130 is higher than the threshold value Tth1, the controller 125 outputs, to the input/output section 124, a control signal that gives an instruction to select the output signals D1 and D2. The input/output section 124 extracts the output signals D1 and D2 from the output signal Dout' outputted from the signal processor 123, on the basis of the control signal from the controller 125 (step S707). The input/output section 124 outputs the output signals D1 and D2 obtained by extraction as the output signal Dout (step S708).

The controller 125 executes the steps S701 to S708 described above unless an instruction is given to end measurement by the light-receiving device 3 (step S709). In a case where the instruction is given to end measurement by the light-receiving device 3, the controller 125 stops the operation of the light-receiving section 110, for example, by stopping the operation of the logic circuit 120 (step S710). On this occasion, the controller 125 controls the power supply section 126 not to apply a negative bias voltage to each of the APDs 111 and 112, for example.

It is to be noted that the controller 125 may constantly drive the light-receiving section 110 regardless of the temperature of the thermometer 130, and cause the logic circuit 120 to output, as the output signal Dout, a signal including the output signals D1 and D2.

[Effects]

Next, description is given of effects of the light-receiving device 3 according to the present embodiment.

In the present embodiment, a plurality of light-receiving elements provided in the respective sub-pixels Pa and Pb includes two types of light-receiving elements (APDs 111 and 112) having temperature regions of PDE that are different from each other and partially overlap each other. Accordingly, for example, in reading of electric charges at a low temperature, of the two types of light-receiving elements, the APD 111 in which a temperature region having high photon detection efficiency is distributed relatively on low temperature side is used, and in reading of electric charges at a high temperature, of the two types of light-receiving elements, the APD 112 in which a temperature region having high photon detection efficiency is distributed relatively on high temperature side is used, thereby suppressing degradation in PDE at both the low temperature and the high temperature. As a result, it is possible to expand a range where PDE is ensured, as compared with a case where only one of the APD 111 and APD 112 is used.

In addition, in the present embodiment, each of the pixels Px includes the sub-pixels Pa and Pb. The sub-pixel Pa includes the APD 111, and the sub-pixel Pb includes the APD 112. This makes it possible to reduce a distance between the APD 11 and the APD 112 located at common coordinates, as compared with the plurality of APDs 111 and the plurality of APDs 112 are formed in different regions. As a result, it is possible to bring optical axes of the plurality of APDs 111 and optical axes of the plurality of APDs 112 close to each other, which facilitates design of an optical system that guides incident light to the pixel array 110A.

In addition, in the present embodiment, the power supply section 126 is provided that applies a negative bias voltage to each of the APDs 111 and 112. This makes it possible to improve PDE of each of the APDs 111 and 112.

In addition, in the present embodiment, in a case where the power supply section 126 applies a common negative bias voltage to each APD 111 and each APD 112, it is possible to downsize the light-receiving device 3, as compared with a case where negative bias voltages different from each other are applied to each APD 111 and each 112.

5. Common Modification Examples for Respective Embodiments

Next, description is given of common modification examples for the respective embodiments.

Modification Example B

In the embodiments described above and the modification examples thereof, there is a case where the logic circuits 30, 80, and 120 each output the output signal Dout including the output signal D1 and the output signal D2. In this case, the logic circuits 30, 80, and 120 may each output a signal in which the output signal D1 and the output signal D2 are blended at a predetermined blend ratio.

For example, in the first embodiment, the logic circuit 30 may include, for example, a output controller 43 that generates a signal in which the output signal D1 and the output signal D2 are blended at a predetermined blend ratio and outputs the thus-generated signal as the output signal Dout, as illustrated in FIG. 44. In this case, when a negative bias is applied to both the APDs 12 and 22, the controller 39 outputs, to the output controller 43, a control signal (hereinafter referred to as a "control signal ctl") that gives an instruction to blend the output signal D1 and the output signal D2 at the predetermined blend ratio. For example, when the temperature of the thermometer 40 is higher than the threshold value Tth1 and lower than the threshold value Tth2, the controller 39 outputs the control signal ctl to the output controller 43.

In addition, for example, in the second embodiment, the logic circuit 80 may include, for example, an output controller 87 that generates a signal in which the output signal D1 and the output signal D2 are blended at a predetermined blend ratio and outputs the thus-generated signal as the output signal Dout, as illustrated in FIG. 45. In this case, when a negative bias is applied to both the APDs 73 and 73, the controller 85 outputs the control signal ctl to the output controller 87. For example, when the temperature of the thermometer 40 is higher than the threshold value Tth1 and lower than the threshold value Tth2, the controller 85 outputs the control signal ctl to the output controller 87.

In addition, for example, in the third embodiment, the logic circuit 120 may include, for example, an output controller 127 that generates a signal in which the output signal D1 and the output signal D2 are blended at a predetermined blend ratio and outputs the thus-generated signal as the output signal Dout, as illustrated in FIG. 46. In this case, for example, when the temperature of the thermometer 130 is higher than the threshold value Tth1 and lower than the threshold value Tth2, the controller 125 outputs the control signal ctl to the output controller 127.

As described above, in the present modification example, the signal in which the output signal D1 and the output signal D2 are blended at the predetermined blend ratio is outputted as the output signal Dout. This makes it possible to output a signal having a high signal level and a low S/N ratio as the output signal Dout, as compared with a case where only one of the output signal D1 and the output signal D2 is outputted as the output signal Dout.

Modification Example C

In the embodiments described above and the modification examples thereof, for example, as illustrated in FIGS. 47, 48, and 49, the thermometers 40 and 130 may be omitted. It is to be noted that FIG. 47 illustrates a modification example of the light-receiving device 1 in FIG. 1. FIG. 48 illustrates a modification example of the light-receiving device 2 in FIG. 19. FIG. 49 illustrates a modification example of the light-receiving device 3 in FIG. 32.

In this case, the logic circuit 30 controls the power supply sections 41 and 42 on the basis of output signals D1 and D2 to apply a negative bias to only one of the APD 12 and the APD 22. For example, as illustrated in FIG. 50, the logic circuit 30 controls the power supply sections 41 and 42 on the basis of a magnitude relationship between the signal levels of the output signals D1 and D2 or a magnitude relationship between the S/N ratios of the output signals D1 and D2 to apply a negative bias to only one of the APD 12 and the APD 22.

For example, in the step S101 in FIG. 13, in a case where the signal level of the output signal D2 is equal to or higher than the signal level of the output signal D1, or in a case where the S/N ratio of the output signal D2 is equal to or higher than the S/N ratio of the output signal D1, the logic circuit 30 executes the step S102. In contrast, for example, in the step S101 in FIG. 13, in a case where the signal level of the output signal D2 is lower than the signal level of the output signal D1, or in a case where the S/N ratio of the output signal D2 is lower than the S/N ratio of the output signal D1, the logic circuit 30 executes the step S104.

As described above, in the logic circuit 30, the power supply sections 41 and 42 are controlled on the basis of the output signals D1 and D2 to apply a negative bias to only one of the APD 12 and APD 22. This makes it possible to expand a range where PDE is ensured without the thermometer 40.

In addition, the logic circuit 80 controls the input/output section 84 on the basis of the output signals D1 and D2 to output one of the output signals D1 and D2 as the output signal Dout. For example, as illustrated in FIG. 50, the logic circuit 80 controls the input/output section 84 on the basis of the magnitude relationship between the signal levels of the output signals D1 and D2 or the magnitude relationship between the S/N ratios of the output signals D1 and D2 to output one of the output signals D1 and D2 as the output signal Dout.

In the step S401 in FIG. 29, in a case where the signal level of the output signal D2 is equal to or higher than the signal level of the output signal D1, or in a case where the S/N ratio of the output signal D2 is equal to or higher than the S/N ratio of the output signal D1, the logic circuit 80 executes the step S402. In contrast, for example, in the step S401 in FIG. 29, in a case where the signal level of the output signal D2 is lower than the signal level of the output signal D1, or in a case where the S/N ratio of the output signal D2 is lower than the S/N ratio of the output signal D1, the logic circuit 80 executes the step S404.

As described above, in the present modification example, the input/output section 84 is controlled on the basis of the output signals D1 and D2 to output one of the output signals D1 and D2 as the output signal Dout. This makes it possible to expand a range where PDE is ensured without the thermometer 40.

In addition, the logic circuit 120 controls the input/output section 124 on the basis of the output signals D1 and D2 to output one of the output signals D1 and D2 as the output signal Dout. For example, as illustrated in FIG. 50, the logic circuit 120 controls the input/output section 124 on the basis of the magnitude relationship between the signal levels of the output signals D1 and D2 or the magnitude relationship between the S/N ratios of the output signals D1 and D2 to output one of the output signals D1 and D2 as the output signal Dout.

For example, in the step S601 in FIG. 41, in a case where the signal level of the output signal D2 is equal to or higher than the signal level of the output signal D1, or in a case where the S/N ratio of the output signal D2 is equal to or higher than the S/N ratio of the output signal D1, the logic circuit 120 executes the step S602. In contrast, in a case where the signal level of the output signal D2 is lower than the signal level of the output signal D1, or in a case where the S/N ratio of the output signal D2 is lower than the S/N ratio of the output signal D1, the logic circuit 120 executes the step S604.

As described above, in the present modification example, the input/output section 124 is controlled on the basis of the output signals D1 and D2 to output one of the output signals D1 and D2 as the output signal Dout. This makes it possible to expand a range where PDE is ensured without the thermometer 130.

Modification Example D

In the modification example B described above, for example, the thermometers 40 and 130 may be omitted as illustrated in FIGS. 51, FIG. 52, and FIG. 53. It is to be noted that FIG. 51 illustrates a modification example of the light-receiving device 1 in FIG. 44. FIG. 52 illustrates a modification example of the light-receiving device 2 in FIG. 45. FIG. 53 illustrates a modification example of the light-receiving device 3 in FIG. 46.

For example, it is assumed that the logic circuit 30 includes the output controller 43 that generates a signal in which the output signal D1 and the output signal D2 are blended at the predetermined blend ratio and outputs the thus-generated signal as the output signal Dout, as illustrated in FIG. 51. In this case, the controller 39 outputs the control signal ctl to the output controller 43 on the basis of the output signals D1 and D2. For example, the controller 39 outputs the control signal ctl to the output controller 43 on the basis of the magnitude relationship between the signal levels of the output signals D1 and D2 or the magnitude relationship between the S/N ratios of the output signals D1 and D2, for example, as illustrated in FIG. 50.

The logic circuit 80 may include, for example, the output controller 87 that generates a signal in which the output signal D1 and the output signal D2 are blended at the predetermined blend ratio and outputs the thus-generated signal as the output signal Dout, as illustrated in FIG. 52. In this case, the controller 85 outputs the control signal ctl to the output controller 87 on the basis of the output signals D1 and D2. The controller 85 outputs the control signal ctl to the output controller 87 on the basis of the magnitude relationship between the signal levels of the output signals D1 and D2 or the magnitude relationship between the S/N ratios of the output signals D1 and D2, as illustrated in FIG. 50.

The logic circuit 120 may include, for example, the output controller 127 that generates a signal in which the output signal D1 and the output signal D2 are blended at the predetermined blend ratio and outputs the thus-generated signal as the output signal Dout, as illustrated in FIG. 53. In this case, the controller 125 outputs the control signal ctl to the output controller 127 on the basis of the output signals D1 and D2. The controller 125 outputs the control signal ctl to the output controller 127 on the basis of the magnitude relationship between the signal levels of the output signals D1 and D2 or the magnitude relationship between the S/N ratios of the output signals D1 and D2, as illustrated in FIG. 50.

As described above, in the present modification example, the signal in which the output signal D1 and the output signal D2 are blended at the predetermined blend ratio is outputted as the output signal Dout on the basis of the output signals D1 and D2. This makes it possible to output a signal having a high signal level and a low S/N ratio as the output signal Dout, as compared with one of the output signal D1 and the output signal D2 is outputted.

6. Application Examples

The following description is given of application examples of the light-receiving devices 1, 2, and 3 according to the respective embodiments described above and the modification examples thereof (hereinafter simply referred to as "light-receiving device 1, 2, or 3").

Application Example 1

FIG. 54 illustrates an example of a schematic configuration of an imaging device 4 including the light-receiving device 1, 2, or 3. The imaging device 4 is, for example, an electronic apparatus. Examples of the electronic apparatus include an imaging device such as a digital still camera and a video camera and a mobile terminal apparatus such as a smartphone and a tablet terminal. The imaging device 4 includes, for example, the light-receiving device 1, 2, or 3, an optical system 61, a shutter device 62, a control circuit 63, a DSP circuit 64, a frame memory 65, a display section 66, a storage section 67, an operation section 68, and a power supply section 69. In the imaging device 4, the light-receiving device 1, 2, or 3, the DSP circuit 64, the frame memory 65, the display section 66, the storage section 67, the operation section 68, and the power supply section 69 are coupled to one another through a bus line 53. In the imaging device 4, the signal processors 33, 37, 83, and 123 provided in the light-receiving devices 1, 2, and 3 are the counter sections described above.

The optical system 61 includes one or a plurality of lenses, and guides light (incident light) from a subject to the light-receiving device 1, 2, or 3 to form an image on a light-receiving surface of the light-receiving device 1, 2, or 3. The shutter device 62 is disposed between the optical system 61 and the light-receiving device 1, 2, or 3, and controls a period in which the light-receiving device 1, 2, or 3 is irradiated with the light and a period in which the light is blocked in accordance with control by the control circuit 63. The light-receiving device 1, 2, or 3 accumulates a detection signal in a predetermined period in accordance with the light of which the image is formed on the light-receiving surface through the optical system 61 and the shutter device 62. The detection signal (a counter value for each pixel) accumulated in the light-receiving devices 1, 2, or 3 is transferred as a pixel signal to the DSP circuit 64 in accordance with a drive signal (a timing signal) supplied from the control circuit 63. That is, the light-receiving device 1, 2, or 3 receives image light (incident light) incident through the optical system 61 and the shutter device 62, and outputs the pixel signal corresponding to the received image light (incident light) to the DSP circuit 64. The control circuit 63 outputs a drive signal that controls a transfer operation of the light-receiving device 1, 2, or 3 and a shutter operation of the shutter device 62 to drive the light-receiving device 1, 2, or 3 and the shutter device 62.

The DSP circuit 64 is a signal processing circuit that generates a captured image on the basis of the pixel signal outputted from the light-receiving device 1, 2, or 3. The frame memory 144 temporarily holds the captured image generated by the DSP circuit 64 in a frame unit. The display section 66 includes, for example, a panel-type display device such as a liquid crystal panel or an organic EL (Electro Luminescence) panel, and displays a moving image or a still image captured by the light-receiving device 1, 2, or 3. The storage section 67 records image data of the moving image or the still image captured by the light-receiving device 1, 2, or 3 in a recording medium such as a semiconductor memory or a hard disk. The operation section 68 issues an operation command for various functions of the imaging device 4 in accordance with an operation by a user. The power supply section 69 appropriately supplies various types of power for operation to the light-receiving device 1, 2, or 3, the DSP circuit 64, the frame memory 65, the display section 66, the storage section 67, and the operation section 68 which are supply targets.

In the present application example, the light-receiving device 1, 2, or 3 is applied to the imaging device 4. This makes it possible to ensure the imaging device 4 in a wide temperature range.

Application Example 2

FIG. 55 illustrates an example of a schematic configuration of a distance measurement device 5 including the light-receiving device 1, 2, or 3. The distance measurement device 5 measures a distance to an object 100 by a TOF (Time Of Flight) method. The distance measurement device 5 includes a light source 91 as a light source, and includes the light-receiving device 1, 2, or 3 as a light-receiving section. The distance measurement device 5 includes, for example, the light source 91, the light-receiving device 1, 2, or 3, lenses 92 and 94, a driver 93, a signal processor 95, a controller 96, a display section 97, and a storage section 98. In the distance measurement device 5, the signal processors 33, 37, 83, and 123 provided in the light-receiving devices 1, 2, and 3 are the time measurement sections described above.

The light-receiving device 1, 2, or 3 detects light reflected by the object 100. The lens 92 is lens for converting light emitted from the light source 91 into parallel light, and is a collimated lens. The lens 94 is a lens for condensing the light reflected by the object 100 and guiding the light to the light-receiving device 1, 2, or 3, and is a condenser lens.

The driver 93 is a driver circuit for driving the light source 91. The signal processor 95 is a circuit for generating a signal corresponding to a difference between a signal inputted from the light-receiving device 1, 2, or 3 and a reference signal from the controller 96. The controller 96 includes, for example, a Time to Digital Converter (TDC). The reference signal may be a signal inputted from the controller 96, or an output signal of a detection section that directly detects an output of the light source 91. The controller 96 is, for example, a processor that controls the light-receiving device 1, 2, or 3, the driver 93, the signal processor 95, the display section 97, and the storage section 98. The controller 96 is a circuit that measures a distance to the object 100 on the basis of a signal generated by the signal processor 95. The controller 96 generates an image signal for displaying information about the distance to the object 100, and outputs the image signal to the display section 97. The display section 97 displays the information about the distance to the object 100 on the basis of the image signal inputted from the controller 96. The controller 96 stores the information about the distance to the object 100 in the storage section 98.

In the present application example, the light-receiving device 1, 2, or 3 is applied to the distance measurement device 5. This makes it possible to ensure the distance measurement device 5 in a wide temperature range.

7. Practical Application Example

The technology (the present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

FIG. 56 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 56, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 56, an audio speaker 12061, a display section 12062, and an instrument panel 12063 are illustrated as the output device. The display section 12062 may, for example, include at least one of an on-board display and a head-up display.

FIG. 57 is a diagram depicting an example of the installation position of the imaging section 12031.

In FIG. 57, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 57 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the mobile body control system to which the technology according to the present disclosure may be applied has been described above. The technology according to the present disclosure may be applied to the imaging section 12031 among the components described above. Specifically, the light-receiving devices 1, 2, or 3 is applicable to the imaging section 12031. Applying the technology according to the present disclosure to the imaging section 12031 makes it possible to ensure the imaging section 12031 in a wide temperature range.

The description has been given above with reference to a plurality of embodiments and the modification examples thereof, the application examples, and the practical application examples; however, the present disclosure are not limited to the embodiments and the like, and may be modified in a variety of ways. It is to be noted that the effects in the present specification are merely exemplary. The effects of the present disclosure are not limited to the effects in the present specification. The present disclosure may have effects other than the effects in the present specification.

In addition, the present disclosure may have the following configurations, for example.

(1)

A light-receiving device including:

a pixel array including light-receiving elements provided in respective pixels, the light-receiving elements each including a high electric field region and a photoelectric conversion region, a plurality of the light-receiving elements provided in the respective pixels including a plurality of types of elements that have temperature regions having high photon detection efficiency (PDE), the temperature regions being different from each other and partially overlapping each other.

(2)

The light-receiving device according to (1), in which
the plurality of the light-receiving elements includes a plurality of first light-receiving elements in which a temperature region having high photon detection efficiency is distributed relatively on low temperature side and a plurality of second light-receiving elements in which a temperature region having high photon detection efficiency is distributed relatively on high temperature side,
the plurality of first light-receiving elements is formed in a first semiconductor substrate, and
the plurality of second light-receiving elements is formed in a second semiconductor substrate different from the first semiconductor substrate.

(3)

The light-receiving device according to (1), in which
the plurality of the light-receiving elements includes a plurality of first light-receiving elements in which a temperature region having high photon detection efficiency is distributed relatively on low temperature side and a plurality of second light-receiving elements in which a temperature region having high photon detection efficiency is distributed relatively on high temperature side, and
the plurality of first light-receiving elements and the plurality of second light-receiving elements are formed in a common semiconductor substrate.

(4)

The light-receiving device according to (1), in which
the plurality of the light-receiving elements includes a plurality of first light-receiving elements in which a temperature region having high photon detection efficiency is distributed relatively on low temperature side and a plurality of second light-receiving elements in which a temperature region having high photon detection efficiency is distributed relatively on high temperature side, and
the plurality of first light-receiving elements and the plurality of second light-receiving elements are alternately arranged in the pixel array.

(5)

The light-receiving device according to (1), in which
the plurality of the light-receiving elements includes a plurality of first light-receiving elements in which a temperature region having high photon detection efficiency is distributed relatively on low temperature side and a plurality of second light-receiving elements in which a temperature region having high photon detection efficiency is distributed relatively on high temperature side, and
each of the pixels includes one of the first light-receiving elements and one of the second light-receiving elements as sub-pixels.

(6)

The light-receiving device according to any one of (1) to (5), further including a power supply section that applies a negative bias voltage to each of the light-receiving elements.

(7)

The light-receiving device according to (6), further including:
a thermometer that measures a temperature of the pixel array; and
a controller that controls the power supply section in accordance with a temperature of the thermometer to apply the negative bias to only one of the first light-receiving element and the second light-receiving element.

(8)

The light-receiving device according to (6), further including a controller that controls the power supply section on the basis of signals outputted from the first light-receiving element and the second light-receiving element to apply the negative bias to only one of the first light-receiving element and the second light-receiving element.

(9)

The light-receiving device according to (6), further including:
a thermometer that measures a temperature of the pixel array; and
a controller that controls the power supply section in accordance with a temperature of the thermometer to apply the negative bias to both the first light-receiving element and the second light-receiving element.

(10)

The light-receiving device according to (6), further including a controller that controls the power supply section on the basis of signals outputted from the first light-receiving element and the second light-receiving element to apply the negative bias to both the first light-receiving element and the second light-receiving element.

(11)

The light-receiving device according to (9), further including an output controller that controls a blend ratio of a signal outputted from the first light-receiving element and a signal outputted from the second light-receiving element when the negative bias is applied to both the first light-receiving element and the second light-receiving element.

(12)

The light-receiving device according to (10), further including an output controller that controls a blend ratio of a signal outputted from the first light-receiving element and a signal outputted from the second light-receiving element on the basis of the signals outputted from the first light-receiving element and the second light-receiving element.

(13)

The light-receiving device according to (6), in which the power supply section applies a common negative bias voltage to each of the light-receiving elements.

(14)

The light-receiving device according to (6), in which the power supply section applies a negative bias voltage having a value corresponding to the light-receiving pixel to each of the light-receiving elements.

(15)

An imaging device including:
a pixel array including light-receiving elements provided in respective pixels, the light-receiving elements each including a high electric field region and a photoelectric conversion region, a plurality of the light-receiving elements provided in the respective pixels including a plurality of types of elements that have temperature regions having high photon detection efficiency (PDE), the temperature regions being different from each other and partially overlapping each other; and
a signal processor that generates a captured image on the basis of a signal outputted from the pixel array.

(16)

A distance measurement device including:
a pixel array including light-receiving elements provided in respective pixels, the light-receiving elements each including a high electric field region and a photoelectric conversion region, a plurality of the light-receiving elements provided in the respective pixels including a plurality of types of elements that have temperature regions having high photon detection efficiency (PDE), the temperature regions being different from each other and partially overlapping each other; and a signal processor that measures a distance to an object on the basis of a signal outputted from the pixel array.

According to an light-receiving device, an imaging device, and a distance measurement device according to embodiments of the present disclosure, a plurality of light-receiving elements provided in respective pixels includes two types of light-receiving elements having temperature regions of PDE that are different from each other and partially overlap each other, which makes it possible to suppress degradation in PDE at both a low temperature and a high temperature. As a result, it is possible to expand a range where PDE is ensured. It is to be noted that the effects of the present disclosure are not limited to the effects described herein, and may be any of effects described in the present specification.

This application claims the benefit of Japanese Priority Patent Application JP2019-076106 filed with Japan Patent Office on Apr. 12, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-receiving device, comprising:
a pixel array including a plurality of light-receiving elements, wherein
the plurality of light-receiving elements is in respective pixels,
each of the plurality of light-receiving elements includes a high electric field region and a photoelectric conversion region,
the plurality of the light-receiving elements in the respective pixels includes a plurality of types of light-receiving elements that have a plurality of temperature regions with high photon detection efficiency (PDE),
an impurity concentration of the high electric field region of each of the plurality of light-receiving elements is different, and
the plurality of temperature regions is different from each other and partially overlaps with each other.

2. The light-receiving device according to claim 1, wherein
the plurality of the light-receiving elements includes:
a plurality of first light-receiving elements in which a temperature region having high photon detection efficiency is relatively on low temperature side; and
a plurality of second light-receiving elements in which a temperature region having high photon detection efficiency is relatively on high temperature side, wherein
the plurality of first light-receiving elements is in a first semiconductor substrate, and
the plurality of second light-receiving elements is in a second semiconductor substrate different from the first semiconductor substrate.

3. The light-receiving device according to claim 1, wherein
the plurality of the light-receiving elements includes:
a plurality of first light-receiving elements in which a temperature region having high photon detection efficiency is relatively on low temperature side, and
a plurality of second light-receiving elements in which a temperature region having high photon detection efficiency is relatively on high temperature side, wherein
the plurality of first light-receiving elements and the plurality of second light-receiving elements are in a common semiconductor substrate.

4. The light-receiving device according to claim 1, wherein
the plurality of the light-receiving elements includes:
a plurality of first light-receiving elements in which a temperature region having high photon detection efficiency is relatively on low temperature side, and
a plurality of second light-receiving elements in which a temperature region having high photon detection efficiency is relatively on high temperature side, wherein
the plurality of first light-receiving elements and the plurality of second light-receiving elements are alternately arranged in the pixel array.

5. The light-receiving device according to claim 1, wherein
the plurality of the light-receiving elements includes:
a plurality of first light-receiving elements in which a temperature region having high photon detection efficiency is relatively on low temperature side, and
a plurality of second light-receiving elements in which a temperature region having high photon detection efficiency is relatively on high temperature side, wherein
each pixel of the pixel array includes one of the plurality of first light-receiving elements or one of the plurality of second light-receiving elements as a sub-pixel.

6. The light-receiving device according to claim 1, further comprising a power supply section configured to apply a negative bias voltage to each of the plurality of light-receiving elements.

7. The light-receiving device according to claim 6, further comprising:
a thermometer configured to measure a temperature of the pixel array; and
a controller configured to control the power supply section, based on the temperature of the thermometer, to apply the negative bias voltage to one of a first light-receiving element of the plurality of light-receiving elements or a second light-receiving element of the plurality of light-receiving elements.

8. The light-receiving device according to claim 6, further comprising: a controller configured to control the power supply section, based on signals outputted from a first light-receiving element of the plurality of light-receiving elements and a second light-receiving element of the plurality of light-receiving elements, to apply the negative bias voltage to one of the first light-receiving element or the second light-receiving element.

9. The light-receiving device according to claim 6, further comprising:
a thermometer configured to measure a temperature of the pixel array; and
a controller configured to control the power supply section, based on the temperature of the thermometer, to apply the negative bias voltage to both a first light-receiving element of the plurality of light-receiving elements and a second light-receiving element of the plurality of light-receiving elements.

10. The light-receiving device according to claim 6, further comprising a controller configured to control the power supply section, based on signals outputted from a first light-receiving element of the plurality of light-receiving elements and a second light-receiving element of the plurality of light-receiving elements, to apply the negative bias voltage to both the first light-receiving element and the second light-receiving element.

11. The light-receiving device according to claim 9, further comprising an output controller configured to control a blend ratio of a signal outputted from the first light-receiving element and a signal outputted from the second light-receiving element when the negative bias voltage is applied to both the first light-receiving element and the second light-receiving element.

12. The light-receiving device according to claim 10, further comprising an output controller configure to control a blend ratio of a signal outputted from the first light-receiving element and a signal outputted from the second light-receiving element based on the signals outputted from the first light-receiving element and the second light-receiving element.

13. The light-receiving device according to claim 6, wherein the power supply section is configured to apply a common negative bias voltage to each of the plurality of light-receiving elements.

14. The light-receiving device according to claim 6, wherein the power supply section is configured to apply, to each of the plurality of light-receiving elements, the negative bias voltage having a value corresponding to a light-receiving pixel.

15. An imaging device, comprising:
a pixel array including a plurality of light-receiving elements, wherein
the plurality of light-receiving elements is in respective pixels,
each of the plurality of light-receiving elements includes a high electric field region and a photoelectric conversion region,
the plurality of the light-receiving elements in the respective pixels includes a plurality of types of light-receiving elements that have a plurality of temperature regions with high photon detection efficiency (PDE),
an impurity concentration of the high electric field region of each of the plurality of light-receiving elements is different, and
the plurality of temperature regions is different from each other and partially overlaps each other; and
a signal processor configured to generate a captured image based on a signal outputted from the pixel array.

16. A distance measurement device, comprising:
a pixel array including a plurality of light-receiving elements, wherein
the plurality of light-receiving elements is in respective pixels,
each of the plurality of light-receiving elements includes a high electric field region and a photoelectric conversion region,
the plurality of the light-receiving elements in the respective pixels includes a plurality of types of light-receiving elements that have a plurality of temperature regions with high photon detection efficiency (PDE),
an impurity concentration of the high electric field region of each of the plurality of light-receiving elements is different, and
the plurality of temperature regions is different from each other and partially overlap; and
a signal processor configured to measure a distance to an object based on a signal outputted from the pixel array.

* * * * *